(12) United States Patent
Inoue et al.

(10) Patent No.: US 7,126,170 B2
(45) Date of Patent: Oct. 24, 2006

(54) MISFET FOR REDUCING LEAKAGE CURRENT

(75) Inventors: Akira Inoue, Kadoma (JP); Takeshi Takagi, Kyoto (JP); Akira Asai, Osaka (JP); Haruyuki Sorada, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 10/978,513

(22) Filed: Nov. 2, 2004

(65) Prior Publication Data

US 2005/0087764 A1    Apr. 28, 2005

Related U.S. Application Data

(63) Continuation of application No. PCT/JP2004/000123, filed on Jan. 9, 2004.

(30) Foreign Application Priority Data

Jan. 9, 2003    (JP)    ............................. 2003-003391

(51) Int. Cl.
*H01L 31/0336* (2006.01)
(52) U.S. Cl. ................ 257/194; 257/347; 257/E21.564
(58) Field of Classification Search ................ 257/194, 257/E21.564, E29.135, E29.248, E29.297, 257/347

See application file for complete search history.

(56) References Cited

U.S. PATENT DOCUMENTS 6,313,508 B1 * 11/2001 Kobayashi .................. 257/351

(Continued)

FOREIGN PATENT DOCUMENTS

EP    1 102 327 A2    5/2001

(Continued)

OTHER PUBLICATIONS

English Language Translation of Form 409 Patentability report in PCT/JP2004/000123 (indicating all claims unpatentable).*

(Continued)

*Primary Examiner*—Thomas L. Dickey
(74) *Attorney, Agent, or Firm*—McDermott Will & Emery LLP

(57) ABSTRACT

A MISFET according to this invention includes: a substrate having a semiconductor layer; an active region formed in the semiconductor layer; a gate insulator formed on the active region; a gate formed on the gate insulator; and a source region and a drain region, wherein: the active region is formed, in plan view, to have a body portion and a projecting portion projecting from a periphery of the body portion; the gate is formed, in plan view, to intersect the body portion of the active region, cover a pair of connecting portions connecting a periphery of the projecting portion to the periphery of the body portion and allow a part of the projecting portion to project from a periphery of the gate; and the source region and the drain region are formed in regions of the body portion of the active region which are situated on opposite sides of the gate in plan view, respectively.

9 Claims, 77 Drawing Sheets

U.S. PATENT DOCUMENTS

| | | | |
|---|---|---|---|
| 2001/0015461 A1* | 8/2001 | Ebina | 257/347 |
| 2001/0028089 A1 | 10/2001 | Adan | |
| 2002/0109187 A1 | 8/2002 | Matsumoto et al. | |

FOREIGN PATENT DOCUMENTS

| | | |
|---|---|---|
| JP | 62-60049 | 4/1987 |
| JP | 2001-168340 A | 6/2001 |
| JP | 2001-210831 A | 8/2001 |
| JP | 2001-284591 A | 10/2001 |
| JP | 2002-246600 | 8/2002 |
| JP | 2002-299633 | 10/2002 |

OTHER PUBLICATIONS

Iwamatsu, Toshiaki., et al. CAD-Compatible High Speed CMOS/SIMOX Gate Array Using Field-Shield Isolation, IEEE Transactions on Electron Devices, vol. 42, No. 11, Nov. 1995, pp. 1934-1939.

Yeo, Yee-Chia., et al. "Enhanced Performance in Sub-100 nm CMOSFETs using Strained Epitaxial Silicon-Germanium." 0-7803-6441-4/00/$10.00 © 2000 IEEE, pp. 1-4.

Iwamatsu, Toshiaki., et al. Investigation of Anomalous Leakage Current in Mesa-Isolated SOI MOSFET's, IEEE Electron Device Letters, vol. 18, No. 10, Oct. 1997, pp. 499-502.

* cited by examiner

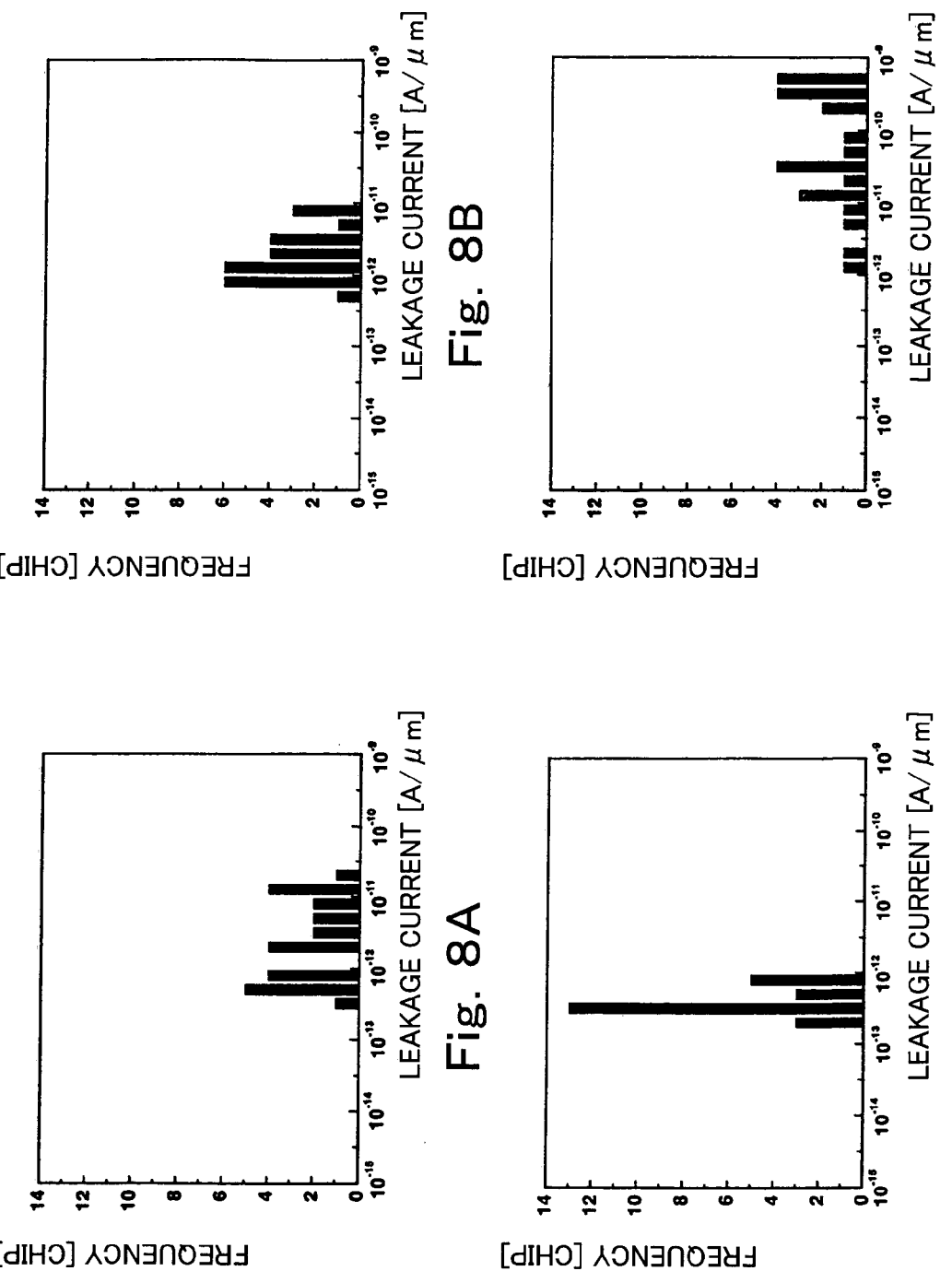

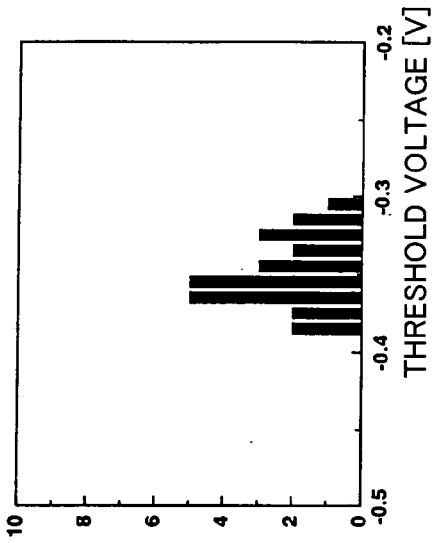
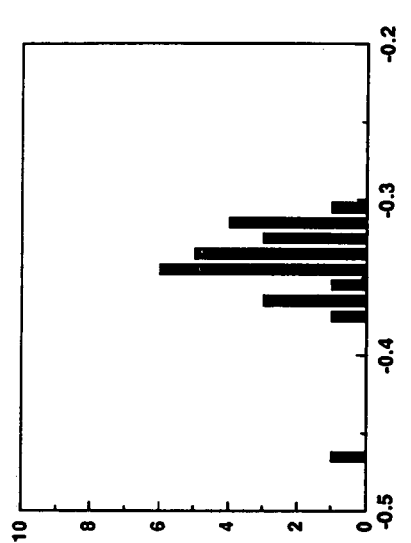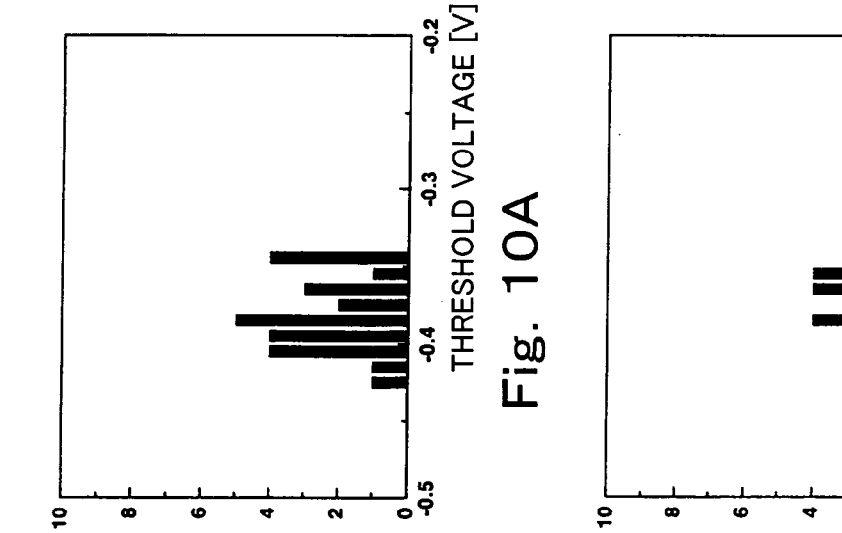

MISFET FOR REDUCING LEAKAGE CURRENT

This is a continuation application under 35 U.S.C 111(a) of pending prior International application No. PCT/JP2004/000123, filed on Jan. 9, 2004.

BACKGROUND OF THE INVENTION

1. Field of the Invention

The present invention relates to MISFETs and, more particularly, to MISFETs capable of reducing leakage current.

2. Description of the Related Art

Since the SiGe heterojunction can be formed on a Si substrate and, in addition, has high carrier mobility, the SiGe heterojunction is expected to find applications in semiconductor devices of high-speed operation. A SiGe heteroMISFET (hereinafter will be referred to as "SiGe-HMISFET") has been proposed as one such semiconductor device.

FIG. 19 illustrates the construction of this conventional SiGe-HMISFET; specifically, FIG. 19A is a plan view of a selectively-grown mesa structure and FIG. 19B is a sectional view taken on line XIXB—XIXB of FIG. 19A.

As shown in FIGS. 19A and 19B, the SiGe-HMISFET has n-well 10 and LOCOS (field oxide: device isolation region) 2 at surface portions of Si substrate 1. The n-well 10 is formed in active region 3, while the LOCOS 2 formed to surround the active region 3.

On the n-well 10 are formed Si buffer layer 4, SiGe channel layer 5 and Si cap layer 6 in this sequence by selective growth. The Si buffer layer 4, SiGe channel layer 5 and Si cap layer 6 form a mesa configuration as shown in FIG. 19B. Hereinafter, these layers will be generally referred to as selectively-grown mesa 21. Gate insulator 7 comprising $SiO_2$ is formed on the selectively-grown mesa 21, specifically, on the Si cap layer 6. On the gate insulator 7 is formed gate 8 comprising polysilicon. The gate 8 is formed to extend linearly in a central portion of the selectively-grown mesa 21 in plan view, as shown in FIG. 19A. Hereinafter, this gate structure will be referred to as "I-shaped structure". Source region 22 and drain region 23, which are doped with a p-type impurity, are formed in regions which extend over the selectively-grown mesa 21 and the surface portion of n-well 10 of the Si substrate 1 and which are situated on opposite sides of the gate 8 in plan view. A region which is situated below the gate 8 and between the source region 22 and the drain region 23 forms a channel region 24. Thus, this SiGe-HMISFET is a p-MISFET.

When the gate 8 of the SiGe-HMISFET thus constructed is applied with a voltage equal to or higher than the threshold voltage, p-channel is formed in SiGe channel layer 5c situated in the channel region 24, so that the SiGe-HMISFET functions as a transistor. Since the SiGe channel layer 5 of this transistor has high carrier mobility, the transistor operates at high speed.

There is a report that the incorporation of a SiGe channel layer into a MISFET leads to improved driving current (see Yee-chia Yeo and seven others, 0-7803-6441-4/00/$10.00C 2000IEEE for example.)

FIG. 20 is a frequency graph comparing the SiGe-HMISFET to an ordinary Si-MISFET as to frequency distribution of leakage currents.

As apparent from FIG. 20, the SiGe-HMISFET (which is of the p-channel type in FIG. 20 but may be of the n-channel type) is higher in leakage current (at a gate voltage of 0.25V) than the Si-MISFET (which is of the p-channel type in FIG. 20 but may be of the n-channel type.) Stated otherwise, the SiGe-HMISFET has a problem that leakage current occurs at low gate voltage. Though not shown, another problem with the SiGe-HMISFET is that its Ion-Ioff characteristics (subthreshold slope and threshold voltage) vary.

The ordinary Si-MISFET also involves such a leakage current problem though the leakage current value of the ordinary Si-MISFET is lower than that of the SiGe-HMISFET. It is therefore desirable to reduce the leakage current. There is a report about elucidation of the cause of occurrence of leakage current in a SOI (Silicon on Insulator)-MISFET, which is one of common MISFETs (see Toshiaki Iwamatsu and five others, IEEE ELECTRON DEVICE LETTERS, VOL. 18, NO. 10, OCTOBER 1997 for example.)

SUMMARY OF THE INVENTION

The present invention has been made to solve the foregoing problems. Accordingly, it is an object of the present invention to provide a MISFET which is reduced in leakage current. To attain this object, the present invention provides a MISFET comprising: a substrate having a semiconductor layer; an active region formed in the semiconductor layer; a gate insulator formed on the active region; a gate formed on the gate insulator; and a source region and a drain region, wherein: the active region is formed, in plan view, to have a body portion and a projecting portion projecting from a periphery of the body portion; the gate is formed, in plan view, to intersect the body portion of the active region, cover a pair of connecting portions connecting a periphery of the projecting portion to the periphery of the body portion and allow a part of the projecting portion to project from a periphery of the gate; and the source region and the drain region are formed in regions of the body portion of the active region which are situated on opposite sides of the gate in plan view, respectively.

The projecting portion of the active region may have one projecting portion.

It is possible that: the projecting portion of the active region comprises two projecting portions, one being a first projecting portion, the other being a second projecting portion; and the gate is formed, in plan view, to have a pair of end portions situated in a direction interconnecting a pair of intersections of the gate and the body portion of the active region, one of the end portions covering a pair of connecting portions connecting a periphery of the first projecting portion to the periphery of the body portion while allowing a part of the first projecting portion to project from an periphery of said one end portion, the other end portion covering a pair of connecting portions connecting a periphery of the second projecting portion to the periphery of the body portion while allowing a part of the second projecting portion to project from a periphery of said other end portion.

The first projecting portion and the second projecting portion may be formed to project from opposite portions of the periphery of the body portion of the active region, respectively.

It is possible that a gate contact is formed to be connected to at least one of the end portions of the gate while a well contact formed to be connected to at least one of said part of the first projecting portion of the active region and said part of the second projecting portion of the active region.

It is possible that the gate contact is formed to be connected to said one end portion of the gate while the well contact formed to be connected to said part of the first projecting portion of the active region.

It is possible that the gate contact is formed to be connected to said one end portion of the gate while the well contact formed to be connected to said part of the second projecting portion of the active region.

It is possible that a pair of gate contacts formed to be connected to the end portions of the gate, respectively; and a pair of well contacts formed to be connected to said part of the first projecting portion of the active region and said part of the second projecting portion of the active region, respectively.

It is possible that a gate contact is formed to be connected to the gate while a well contact formed to be connected to said part of the projecting portion of the active region.

The gate contact and the well contact may be connected to each other.

The active region may be formed to be surrounded by LOCOS.

The active region may be formed to be surrounded by STI.

The active region may be formed by a Si layer.

The active region may be formed by a Si/SiGe heterostructure.

According to the present invention, there is also provided a MISFET comprising: a substrate having a semiconductor layer; an active region formed in the semiconductor layer; a gate insulator formed on the active region; a source region and a drain region which are formed separate from each other in the active region so as to contact a periphery of the active region in plan view and which are imparted with a conductivity; and a gate formed on the gate insulator, wherein the gate is formed, in plan view, to cover not at least a portion of an intervening region between the source region and the drain region of the active region including a part of the periphery of the active region but the rest of the intervening region.

It is possible that: the active region is formed, in plan view, to have a body portion and a projecting portion projecting from a periphery of the body portion; the source region and the drain region are formed separate from each other so as to contact a periphery of the body portion of the active region; the projecting portion is formed so as to be continuous with a region intervening between the source region and the drain region of the body portion as a part of the intervening region; and the gate is formed to cover not a side portion of the projecting portion but the rest of the intervening region.

The foregoing and other objects, features and advantages of the present invention will become apparent from the following detailed description of the preferred embodiments to be read with reference to the accompanying drawings.

BRIEF DESCRIPTION OF THE DRAWINGS

FIG. 2A is a plan view of the SiGe-HMISFET and FIG. 2B is a perspective view of the SiGe-HMISFET with a section taken on line IIB—IIB of FIG. 2A;

FIG. 5A is a plan view of the SiGe-HMISFET and FIG. 5B is a perspective view of the SiGe-HMISFET with a section taken on line VB—VB of FIG. 5A;

FIG. 6A is a plan view of the SiGe-HMISFET and FIG. 6B is a perspective view of the SiGe-HMISFET with a section taken on line VIB—VIB of FIG. 6A;

FIG. 7A is a plan view showing dimensions of a gate of T-shaped structure, FIG. 7B is a plan view showing dimensions of a gate of H-shaped structure and FIG. 7C is a plan view showing dimensions of a gate of edgeless H-shaped gate;

FIGS. 8A to 8D are frequency graphs comparing SiGe-HMISFETs according to embodiment 1 of the present invention to a conventional SiGe-HMISFET as to frequency distribution of leakage currents; specifically, FIG. 8A is a graph obtained from a SiGe-HMISFET with a T-shaped gate structure, FIG. 8B is a graph obtained from a SiGe-HMISFET with an H-shaped gate structure, FIG. 8C is a graph obtained from a SiGe-HMISFET with an edgeless H-shaped gate structure and FIG. 8D is a graph obtained from the conventional SiGe-HMISFET with a conventional I-shaped gate structure;

FIG. 9A is a graph obtained from the SiGe-HMISFET with the T-shaped gate structure, FIG. 9B is a graph obtained from the SiGe-HMISFET with the H-shaped gate structure, FIG. 9C is a graph obtained from the SiGe-HMISFET with the edgeless H-shaped gate structure and FIG. 9D is a graph obtained from the conventional SiGe-HMISFET with the conventional I-shaped gate structure;

FIGS. 10A to 10D are frequency graphs comparing the SiGe-HMISFETs according to embodiment 1 of the present invention to the conventional SiGe-HMISFET as to threshold voltage; specifically, FIG. 10A is a graph obtained from the SiGe-HMISFET with the T-shaped gate structure, FIG. 10B is a graph obtained from the SiGe-HMISFET with the H-shaped gate structure, FIG. 10C is a graph obtained from the SiGe-HMISFET with the edgeless H-shaped gate structure and FIG. 10D is a graph obtained from the conventional SiGe-HMISFET with the conventional I-shaped gate structure;

FIG. 11A is a graph obtained from the SiGe-HMISFET with the T-shaped gate structure, FIG. 11B is a graph obtained from the SiGe-HMISFET with the H-shaped gate structure, FIG. 11C is a graph obtained from the SiGe-HMISFET with the edgeless H-shaped gate structure and FIG. 11D is a graph obtained from the conventional SiGe-HMISFET with the conventional I-shaped gate structure;

FIG. 14A is a perspective view showing a portion corresponding to the entire length of the section shown in FIG. 13, while

FIG. 16A is a perspective view showing a portion corresponding to the entire length of the section shown in FIG. 15, while

FIG. 17A is a plan view showing the shapes of a gate and a selectively-grown mesa of an ordinary SiGe-HMISFET and FIG. 17B is a plan view showing the shapes of a gate and a selectively-grown mesa of a specially-fabricated SiGe-HMISFET, FIG. 18A is a graph showing the frequency distribution of leakage currents of the SiGe-HMISFET, FIG. 18B is a graph plotting the Vg-Id characteristic of the SiGe-HMISFET, FIG. 18C is a graph showing the frequency distribution of threshold voltages of the SiGe-HMISFET and FIG. 18D is a graph showing the frequency distribution of subthreshold slopes of the SiGe-HMISFET;

FIG. 19A is a plan view showing the selectively-grown mesa structure of the conventional SiGe-MOSFET and FIG. 19B is a sectional view taken on line XIXB—XIXB of FIG. 19A;

FIG. 21A is a plan view of the Si-MISFET and FIG. 21B is a sectional view taken on line XXIB—XXIB of FIG. 21A;

FIG. 22A is a sectional view taken on line XXIIA—XXIIA of FIG. 21A and FIG. 22B is a sectional view taken on line XXIIB—XXIIB of FIG. 22A;

FIG. 24A is a plan view of the Si-DTMISFET and FIG. 24B is a sectional view taken on line XXIVB—XXIVB of FIG. 24A;

FIG. 25A is a plan view of the SiGe-HMISFET and FIG. 25B is a sectional view taken on line XXVB—XXVB of FIG. 25A;

FIG. 26A is a sectional view taken on line XXVIA—XXVIA of FIG. 25A and FIG. 26B is a sectional view taken on line XXVIB—XXVIB of FIG. 25A;

FIG. 28A is a plan view of the SiGe-HDTMISFET and FIG. 28B is a sectional view taken on line XXVIIIB—XXVIIIB of FIG. 28A;

FIG. 29A is a plan view of the stained Si-MISFET and FIG. 29B is a sectional view taken on line XXIXB—XXIXB of FIG. 29A;

FIG. 30A is a sectional view taken on line XXXA—XXXA of FIG. 29A and FIG. 30B is a sectional view taken on line XXXB—XXXB of FIG. 29A;

FIG. 32A is a plan view of the strained Si-DTMISFET and FIG. 32B is a sectional view taken on line XXXIIIB—XXXIIIB of FIG. 32A;

FIG. 33A is a plan view of the Si-MISFET and FIG. 33B is a sectional view taken on line XXXIIIB—XXXIIIB of FIG. 33A;

FIG. 34A is a sectional view taken on line XXXIVA—XXXIVA of FIG. 33A and FIG. 34B is a sectional view taken on line XXXIVB-XXXIVB of FIG. 33A;

FIG. 35A is a plan view of the Si-DTMISFET and FIG. 35B is a sectional view taken on line XXXVB—XXXVB of FIG. 35A;

FIG. 36A is a plan view of the SiGe-HMISFET and FIG. 36B is a sectional view taken on line XXXVIB—XXXVIB of FIG. 36A;

FIG. 37A is a sectional view taken on line XXXVIIA—XXXVIIA of FIG. 36A and FIG. 37B is a sectional view taken on line XXXVIIB—XXXVIIB of FIG. 36A;

FIG. 38A is a plan view of the SiGe-HDTMISFET and FIG. 38B is a sectional view taken on line XXXVIIIB—XXXVIIIB of FIG. 38A;

FIG. 39A is a plan view of the strained Si-MISFET and FIG. 39B is a sectional view taken on line XXXIXB—XXXIXB of FIG. 39A;

FIG. 40A is a sectional view taken on line XXXXA—XXXXA of FIG. 39A and FIG. 40B is a sectional view taken on line XXXXB—XXXXB of FIG. 39A;

FIG. 41A is a plan view of the strained Si-DTMISFET and FIG. 41B is a sectional view taken on line XXXXIB—XXXXIB of FIG. 41A;

FIG. 42A is a plan view of the Si-MISFET and FIG. 42B is a sectional view taken on line XXXXIIB—XXXXIIB of FIG. 42A;

FIG. 43A is a sectional view taken on line XXXIIIA—XXXIIIA of FIG. 42A and FIG. 43B is a sectional view taken on line XXXXIIIB—XXXXIIIB of FIG. 42A;

FIG. 44A is a plan view of the Si-DTMISFET and FIG. 44B is a sectional view taken on line XXXXIVB—XXXXIVB of FIG. 44A;

FIG. 45A is a plan view of the SiGe-HMISFET and FIG. 45B is a sectional view taken on line XXXXVB—XXXXVB of FIG. 45A;

FIG. 46A is a sectional view taken on line XXXXVIA—XXXXVIA of FIG. 45A and FIG. 46B is a sectional view taken on line XXXXVIB—XXXXVIB of FIG. 45A;

FIG. 47A is a plan view of the SiGe-HDTMISFET and FIG. 47B is a sectional view taken on line XXXXVIIB—XXXXVIIB of FIG. 47A;

FIG. 48A is a plan view of the strained Si-MISFET and FIG. 48B is a sectional view taken on line XXXXVIIIB—XXXXVIIIB of FIG. 48A;

FIG. 49A is a sectional view taken on line XXXXIXA—XXXXIXA of FIG. 48A and FIG. 49B is a sectional view taken on line XXXXIXB—XXXXIXB of FIG. 48A;

FIG. 50A is a plan view of the strained Si-DTMISFET and FIG. 50B is a sectional view taken on line XXXXXB—XXXXXB of FIG. 50A;

FIG. 51A is a plan view of the Si-MISFET and FIG. 51B is a sectional view taken on line XXXXXIB—XXXXXIB of FIG. 51A;

FIG. 52A is a sectional view taken on line XXXXXIIA—XXXXXIIA of FIG. 51A and FIG. 52B is a sectional view taken on line XXXXXIIB—XXXXXIIB of FIG. 51A;

FIG. 53A is a plan view of the Si-DTMISFET and FIG. 53B is a sectional view taken on line XXXXXIIIB—XXXXXIIIB of FIG. 53A;

FIG. 54A is a plan view of the SiGe-HMISFET and FIG. 54B is a sectional view taken on line XXXXXIVB—XXXXXIVB of FIG. 54A;

FIG. 55A is a sectional view taken on line XXXXXVA—XXXXXVA of FIG. 54A and FIG. 55B is a sectional view taken on line XXXXXVB—XXXXXVB of FIG. 54A;

FIG. 56A is a plan view of the SiGe-HDTMISFET and FIG. 56B is a sectional view taken on line XXXXXVIB—XXXXXVIB of FIG. 56A;

FIG. 57A is a plan view of the strained Si-MISFET and FIG. 57B is a sectional view taken on line XXXXXVIIB—XXXXXVIIB of FIG. 57A;

FIG. 58A is a sectional view taken on line XXXXXVIIIA—XXXXXVIIIA of FIG. 57A and FIG. 58B is a sectional view taken on line XXXXXVIIIB—XXXXXVIIIB of FIG. 57A;

FIG. 59A is a plan view of the strained Si-DTMISFET and FIG. 59B is a sectional view taken on line XXXXXIXB—XXXXXIXB of FIG. 59A;

FIG. 60A is a plan view of the Si-MISFET and FIG. 60B is a sectional view taken on line XXXXXXB—XXXXXXB of FIG. 60A;

FIG. 61A is a sectional view taken on line XXXXXXIA—XXXXXXIA of FIG. 60A and FIG. 61B is a sectional view taken on line XXXXXXIB—XXXXXXIB of FIG. 60A;

FIG. 62A is a plan view of the Si-DTMISFET and FIG. 62B is a sectional view taken on line XXXXXXIIB—XXXXXXIIB of FIG. 62A;

FIG. 63A is a plan view of the SiGe-HMISFET and FIG. 63B is a sectional view taken on line XXXXXXIIIB—XXXXXXIIIB of FIG. 63A;

FIG. 64A is a sectional view taken on line XXXXXXIVA—XXXXXXIVA of FIG. 63A and FIG. 64B is a sectional view taken on line XXXXXX-IVB—XXXXXXIVB of FIG. 63A;

FIG. 65A is a plan view of the SiGe-HDTMISFET and FIG. 65B is a sectional view taken on line XXXXXXVB—XXXXXXVB of FIG. 65A;

FIG. 66A is a plan view of the strained Si-MISFET and FIG. 66B is a sectional view taken on line XXXXXXVIB—XXXXXXVIB of FIG. 66A;

FIG. 67A is a sectional view taken on line XXXXXXVIIA—XXXXXXVIIA of FIG. 66A and FIG. 67B is a sectional view taken on line XXXXXXVIIB—XXXXXXVIIB of FIG. 66A;

FIG. 68A is a plan view of the strained Si-DTMISFET and FIG. 68B is a sectional view taken on line XXXXXXVIIIB—XXXXXXVIIIB of FIG. 68A;

FIG. 69A is a plan view of the conventional Si-MISFET and FIG. 69B is a sectional view taken on line XXXXXXIXB—XXXXXX-IXB of FIG. 69A;

FIG. 70A is a sectional view taken on line XXXXXXA—XXXXXXA of FIG. 69A and FIG. 70B is a sectional view taken on line XXXXXXXB—XXXXXXXB of FIG. 69A;

FIG. 71A is a plan view of the conventional Si-DTMISFET and FIG. 71B is a sectional view taken on line XXXXXXXIB—XXXXXXXIB of FIG. 71A;

FIG. 72A is a plan view of the conventional SiGe-HMISFET and FIG. 72B is a sectional view taken on line XXXXXXXIIB—XXXXXXXIIB of FIG. 72A FIGS. 73A, 73B are illustrations showing the construction of the conventional SiGe-HMISFET; specifically.

FIG. 74A is a plan view of the conventional SiGe-HDTMISFET and FIG. 74B is a sectional view taken on line XXXXXXX-IVB—XXXXXXXIVB of FIG. 74A;

FIG. 75A is a plan view of the conventional strained Si-MISFET and FIG. 75B is a sectional view taken on line XXXXXXXVB—XXXXXXXVB of FIG. 75A;

FIG. 76A is a sectional view taken on line XXXXXXXVIA—XXXXXXXVIA of FIG. 75A and FIG. 76B is a sectional view taken on line XXXXXXXVIB—XXXXXXXVIB of FIG. 75A; FIG. 77A is a plan view of the conventional strained Si-DTMISFET and FIG. 77B is a sectional view taken on line XXXXXXXVIIB—XXXXXXXVIIB of FIG. 77A.

DETAILED DESCRIPTION OF THE PREFERRED EMBODIMENTS

Hereinafter, embodiments of the present invention will be described with reference to the drawings.

In the first place, description is made of the cause of such a problem with SiGe-HMISFETs fabricated by selective growth that leakage current occurs at low gate voltage while at the same time the Ion-Ioff characteristics vary.

As a result of investigation on the cause of the problem with SiGe-HMISFETs fabricated by selective growth, the following facts were found.

Figure 12:
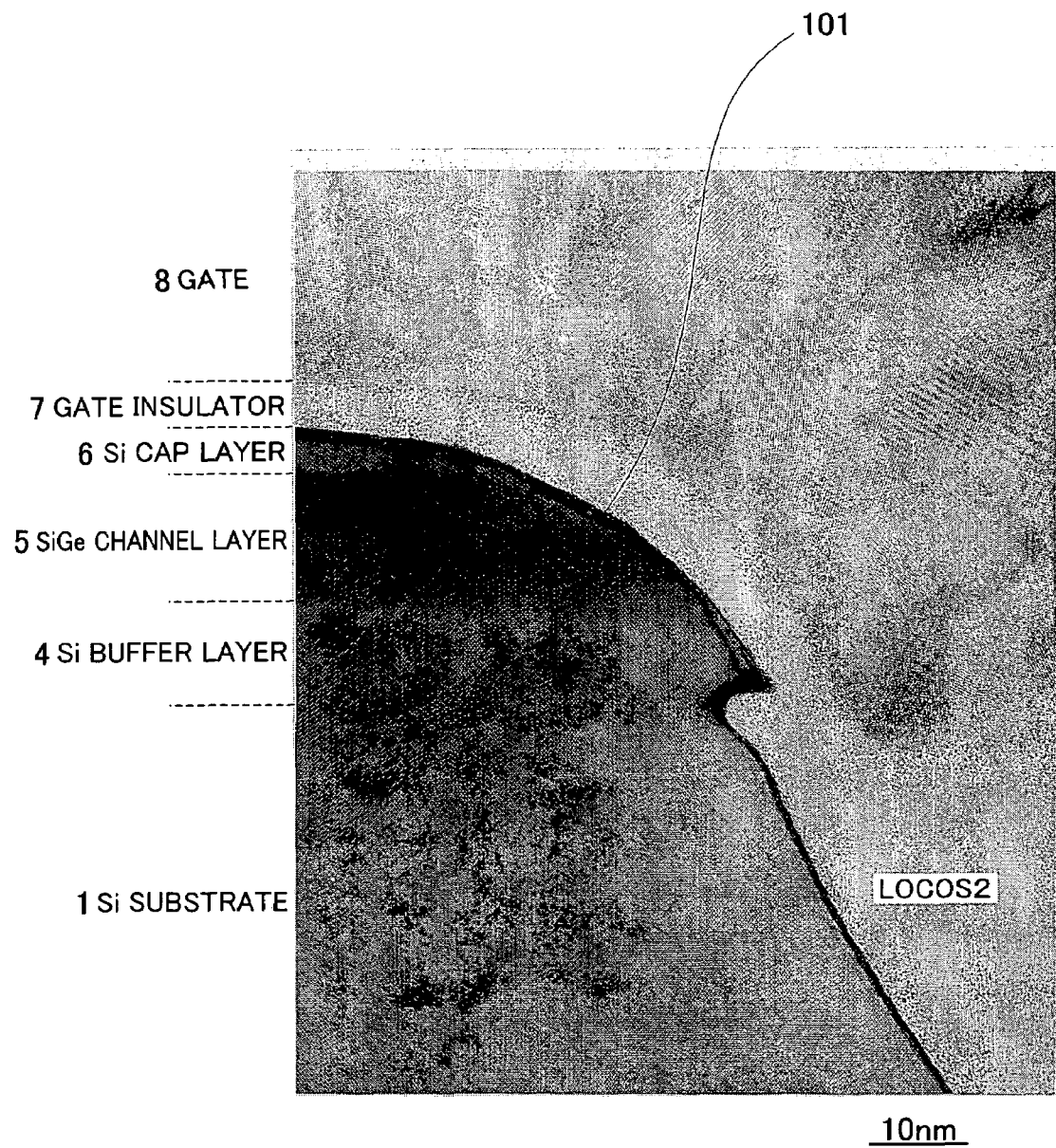
FIG. 12 is a photograph showing a section of an edge portion of a selectively-grown mesa of the conventional SiGe-HMISFET.

FIG. 12 is a photograph showing a section of an edge portion of selectively-grown mesa 21 of a conventional SiGe-HMISFET. As apparent from the photograph of the section, the selectively-grown mesa 21 has a sloped end face with a sharply bent point 101. This means that this end face consists of an inclined facet. That is, the phenomenon that each selectively-grown layer becomes thinner toward its end in the edge portion of the selectively-grown mesa 21 as schematically shown in FIG. 19B, is a phenomenon essential to selective growth of a specific semiconductor on a specific substrate. Phenomena including the occurrence of leakage current at low gate voltage are closely related to the structure of the edge portion of selectively-grown mesa 21, as will be described below.

Figure 13:
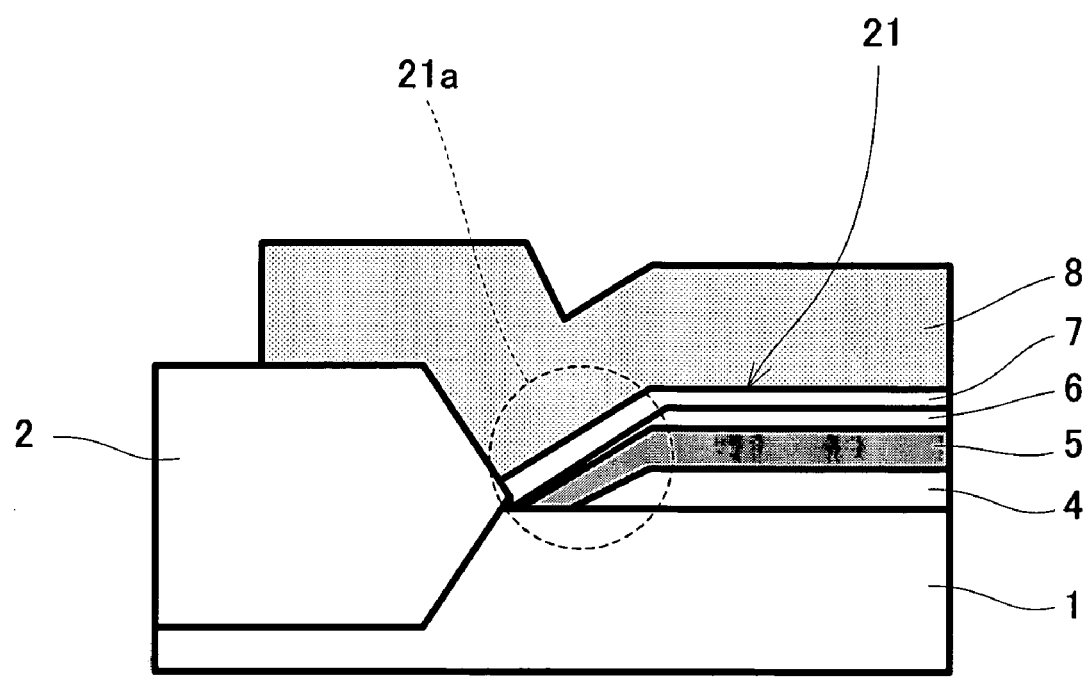
FIG. 13 is a sectional view, taken on line XIII—XIII of FIG. 19A, showing a section of a portion of the selectively-grown mesa of the conventional SiGe-HMISFET situated below the gate and extending in longitudinal direction of the gate.
Figure 14A:
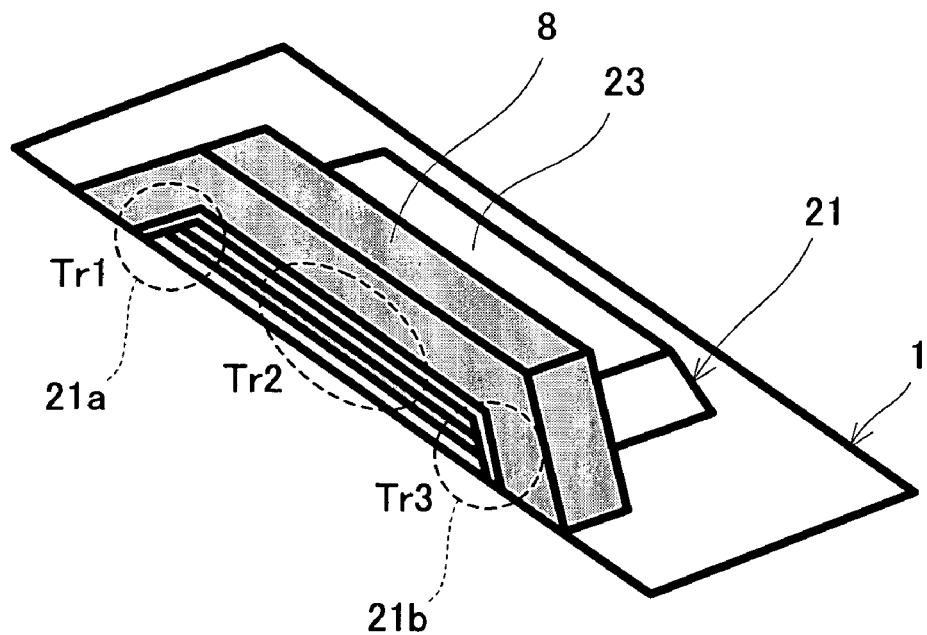
Figure 14B:
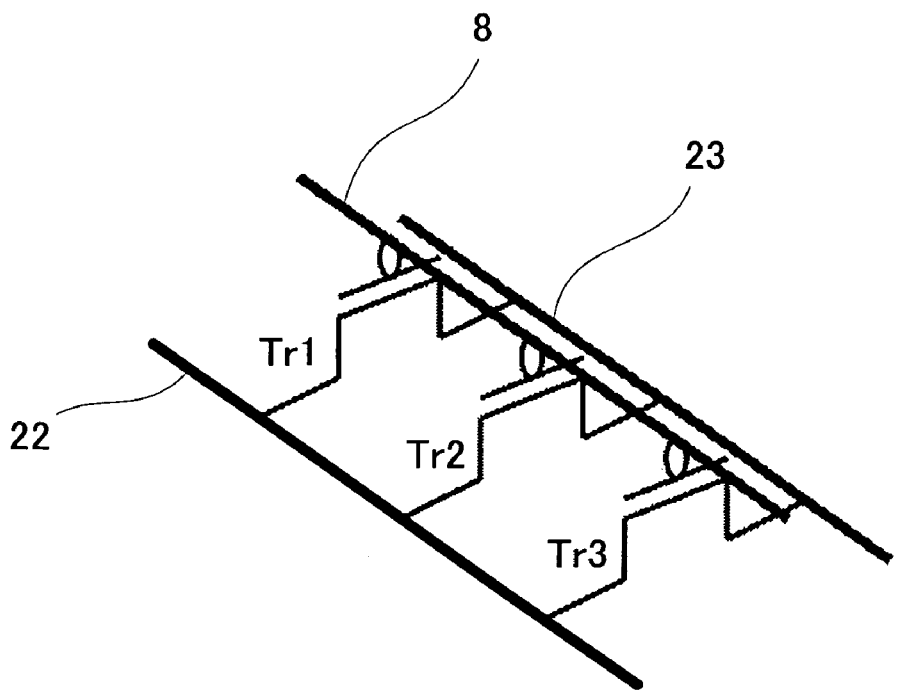
FIG. 14B is a schematic diagram showing an equivalent circuit of the conventional SiGe-HMISFET.
Figure 19A:
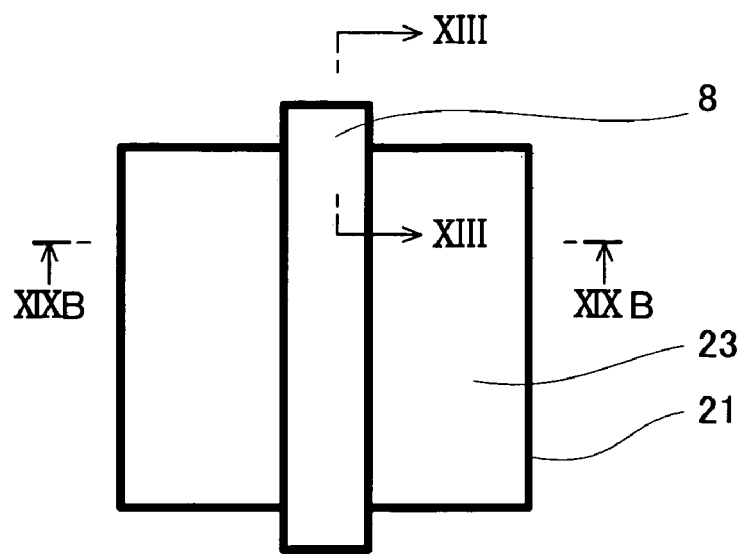
FIGS. 19A, 19B are illustrations showing the construction of a conventional SiGe-MOSFET, specifically.
Figure 19B:
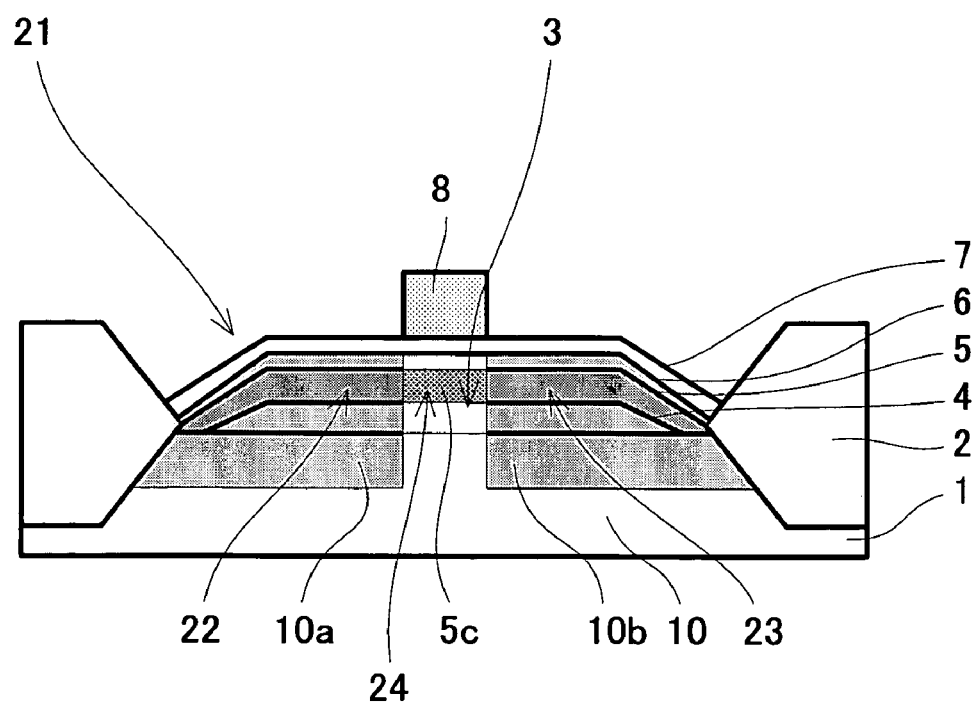
Figure 20:
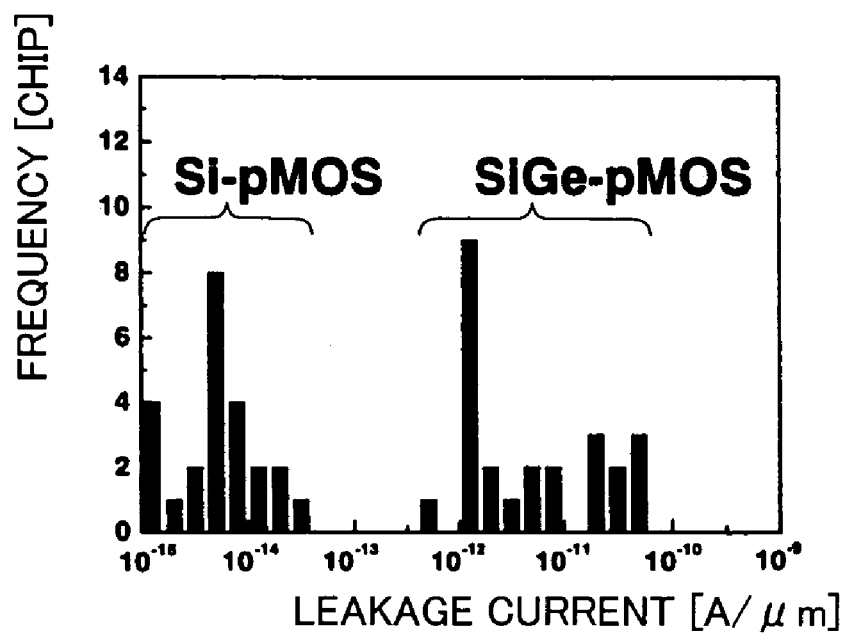
FIG. 20 is a frequency graph comparing the conventional SiGe-MISFET to the ordinary Si-MISFET as to frequency distribution of leakage currents.

FIG. 13 is a sectional view, taken on line XIII—XIII of FIG. 19A, showing a section of a portion of the selectively-grown mesa of the conventional SiGe-HMISFET situated below the gate and extending in longitudinal direction of the gate; and FIG. 14A is a perspective view showing a portion corresponding to the entire length of the section shown in FIG. 13, while FIG. 14B is a schematic diagram showing an equivalent circuit of the conventional SiGe-HMISFET.

The first cause of such phenomena is that Si cap layer 6 becomes thinner in the edge portion of selectively-grown mesa 21 as shown in FIGS. 13 and 14A. For this reason, SiGe channel layer 5 becomes closer to gate insulator 7 in regions 21a and 21b of the edge portion of selectively-grown mesa 21 situated below gate 8 (hereinafter will be referred to as "edge portion channel regions"), thus causing the threshold voltage to lower. Stated otherwise, this transistor is represented by an equivalent circuit in which an originally intended transistor Tr2 corresponding to a part of the channel region of selectively-grown mesa 21 other than the edge portion channel regions 21a and 21b, a transistor Tr1 corresponding to the edge portion channel region 21a, and a transistor Tr3 corresponding to the edge portion channel region 21b are connected in parallel with one another. It is therefore presumed that leakage current occurs at low gate voltage because the transistors Tr1 and Tr3 corresponding to the edge portion channel regions 21a and 21b are turned on before turning-on of the originally intended transistor Tr2.

Figure 15:
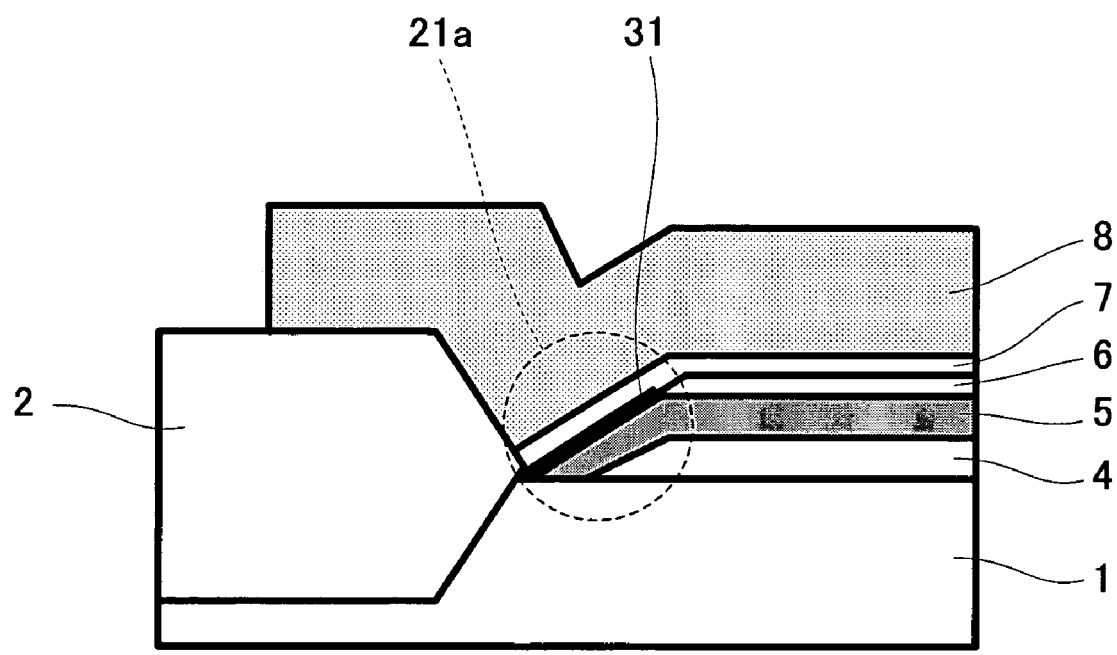
FIG. 15 is a sectional view showing the same section as in FIG. 14.
Figure 16A:
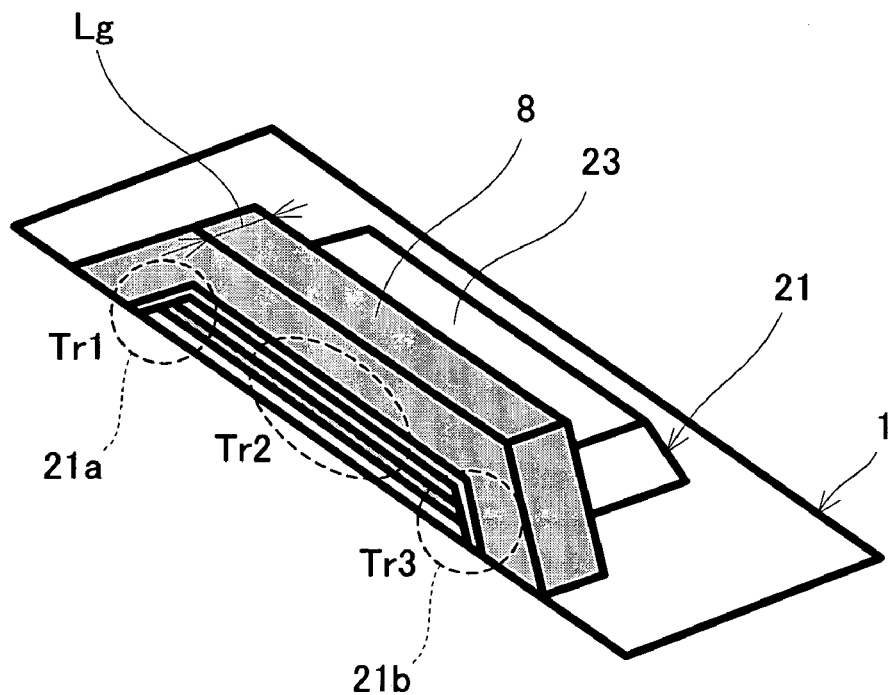
Figure 16B:
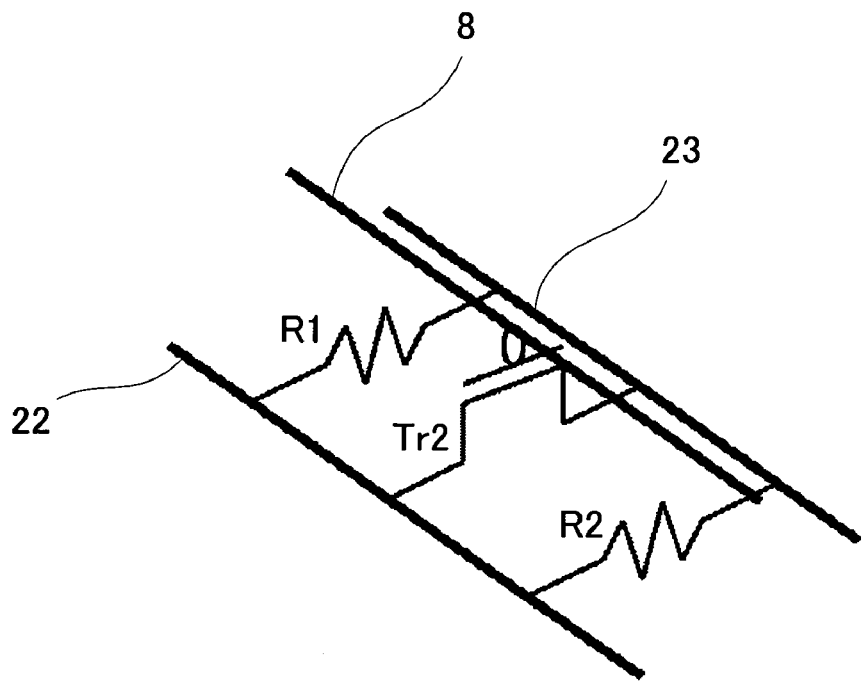
FIG. 16B is a schematic diagram showing another equivalent circuit of the conventional SiGe-HMISFET.

FIG. 15 is a sectional view showing the same section as in FIG. 13; and FIG. 16A is a perspective view showing a portion corresponding to the entire length of the section shown in FIG. 15, while FIG. 16B is a schematic diagram showing another equivalent circuit of the conventional SiGe-HMISFET.

The second cause is that SiGe channel layer 5 is oxidized in the edge portion channel regions 21a and 21b during the formation of gate insulator 7 by oxidation of Si cap layer 6 as shown in FIGS. 15 and 16A, which causes segregation of Ge to occur at the interface between resulting oxide film 31 and gate insulator 7. For this reason, this transistor is represented by an equivalent circuit in which the originally intended transistor Tr2 corresponding to the part of the channel region of selectively-grown mesa 21 other than the edge portion channel regions 21a and 21b, a resistor R1 corresponding to the edge portion channel region 21a, and a resistor R2 corresponding to the edge portion channel region 21b are connected in parallel with one another. It is therefore presumed that leakage current occurs at low voltage because current passes through the resistors R1 and R2 before turning-on of the originally intended transistor Tr2.

It can be considered that actually the first cause and the second cause exist either alone or in combination.

Next, description will be made of an experiment conducted for verifying the validity of this hypothesis.

Figure 17A:
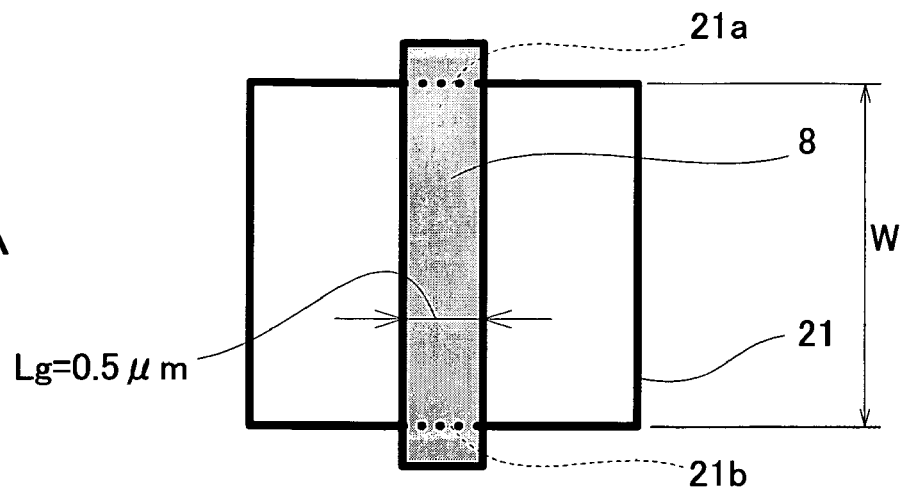
FIGS. 17A, 17B are illustrations showing the shapes of a gate and a selectively-grown mesa of each SiGe-HMISFET used to verify the validity of a hypothesis about the cause of a problem with SiGe-HMISFETs; specifically.
Figure 17B:
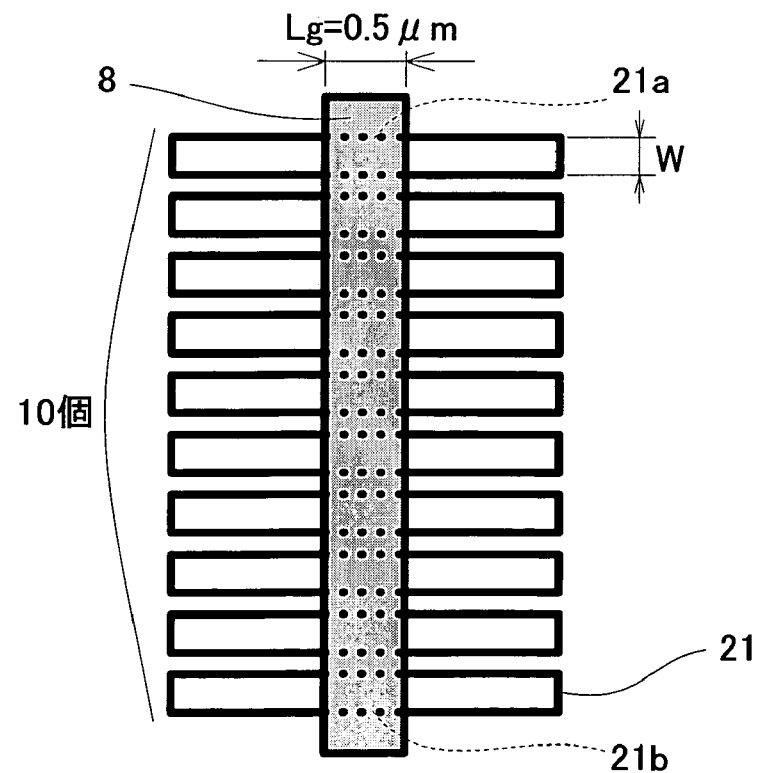

FIGS. 17A, 17B are illustrations showing the shapes of a gate and a selectively-grown mesa of each SiGe-HMISFET used to verify the validity of the hypothesis; specifically, FIG. 17A is a plan view showing the shapes of a gate and a selectively-grown mesa of an ordinary SiGe-HMISFET and FIG. 17B is a plan view showing the shapes of a gate and a selectively-grown mesa of a specially-fabricated SiGe-HMISFET.

In the ordinary SiGe-HMISFET, the selectively-grown mesa 21 was formed to provide a gate width W of 10 μm while the gate 8 formed to have a gate length Lg of 0.5 μm, as shown in FIG. 17A. In the specially-fabricated SiGe-HMISFET, on the other hand, ten selectively-grown mesas 21 were formed in a row to provide a gate width W of 1 μm each while the gate 8 formed to have a gate length Lg of 0.5 μm. That is, the number of edge portion channel regions 21a and 21b of the specially-fabricated SiGe-MISFET is 10 times as large as the number of edge portion channel regions 21a and 21b of the ordinary SiGe-HMISFET.

Figure 18A:
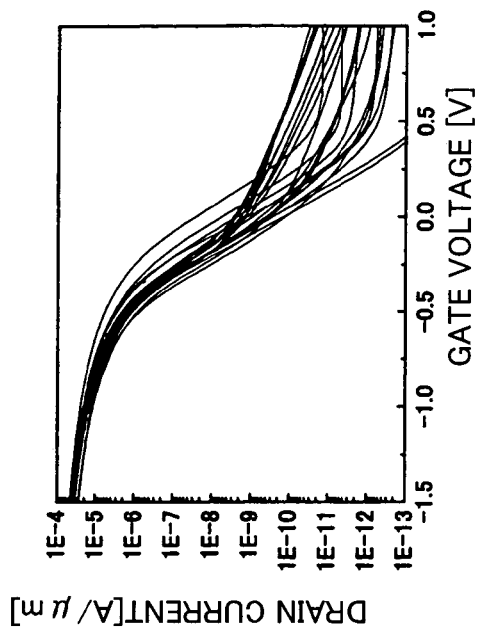
FIGS. 18A to 18D are graphs showing characteristics of the specially-fabricated SiGe-HMISFET; specifically.
Figure 18B:
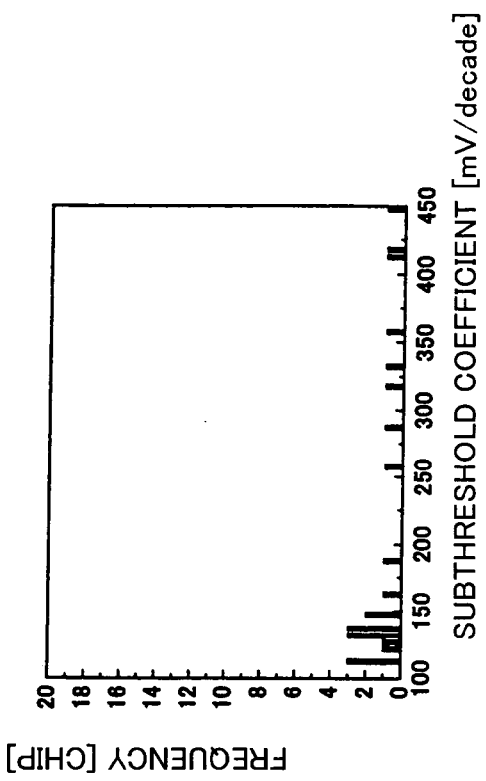
Figure 18C:
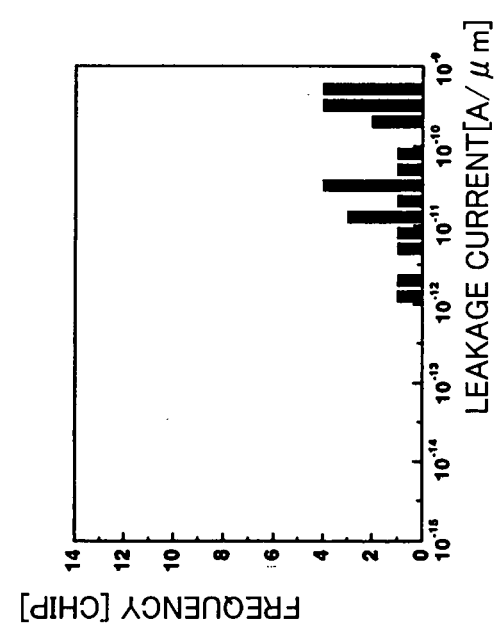
Figure 18D:
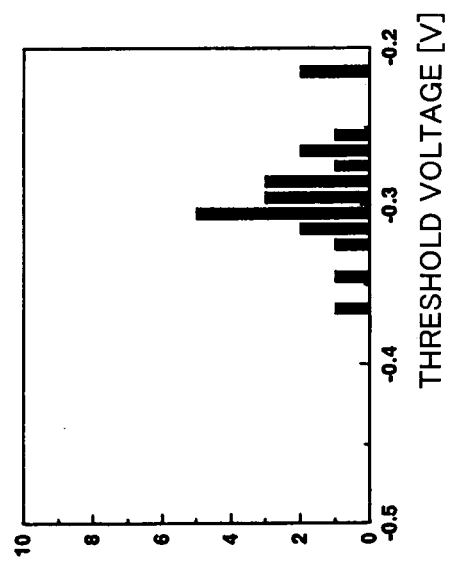

FIGS. 18A to 18C are graphs showing characteristics of the specially-fabricated SiGe-HMISFET; specifically, FIG. 18A is a graph showing the frequency distribution of leakage currents of the SiGe-HMISFET, FIG. 18B is a graph plotting the Vg-Id characteristic of the SiGe-HMISFET, FIG. 18C is a graph showing the frequency distribution of threshold voltages of the SiGe-HMISFET and FIG. 18D is a graph showing the frequency distribution of subthreshold slopes of the SiGe-HMISFET. As for the characteristics of the ordinary SiGe-HMISFET, the frequency distribution of leakage currents, Vg-Id characteristic, frequency distribution of threshold voltages and frequency distribution of subthreshold slopes are shown in FIGS. 8D, 9D, 10D and 11D, respectively. It should be noted that the leakage current was defined as a drain current that occurred when Vg of the Vg-Id characteristic was 0.25V. The Vg-Id characteristic was measured under the condition: Vd=−0.5V. The subthreshold slope was calculated from the gradient defined between two points of gate voltage Vg at which the drain current reached $1 \times 10^{-8}$ A/μm and $1 \times 10^{-10}$ A/μm, respectively, in Vg-Id characteristic. The threshold voltage was defined as a gate voltage at which the drain current reached $1 \times 10^{-7}$ A/μm in Vg-Id characteristic. The definitions of these characteristics hold true for the graphs shown in FIGS. 8 to 11.

As apparent from FIGS. 18, 8D, 9D, 10D and 11D, the specially-fabricated SiGe-HMISFET exhibited increased leakage current and poor Ion-Ioff characteristics as compared to the ordinary SiGe-HMISFET. Thus, it is obvious that the edge portion structure of selectively-grown mesa 21 is the cause of the problem with SiGe-HMISFETs.

Embodiment 1

Hereinafter, embodiment 1 of the present invention will be described with reference to relevant drawings.

Figure 1:
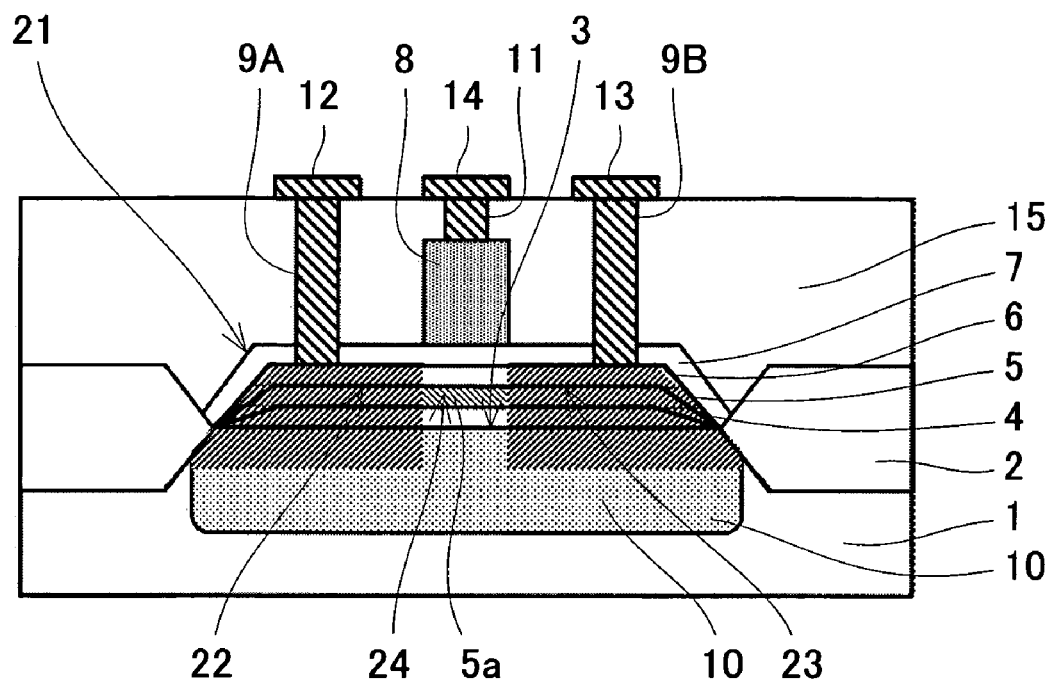
FIG. 1 is a sectional view showing a SiGe-HMISFET as a semiconductor device according to embodiment 1 of the present invention.
Figure 6A:
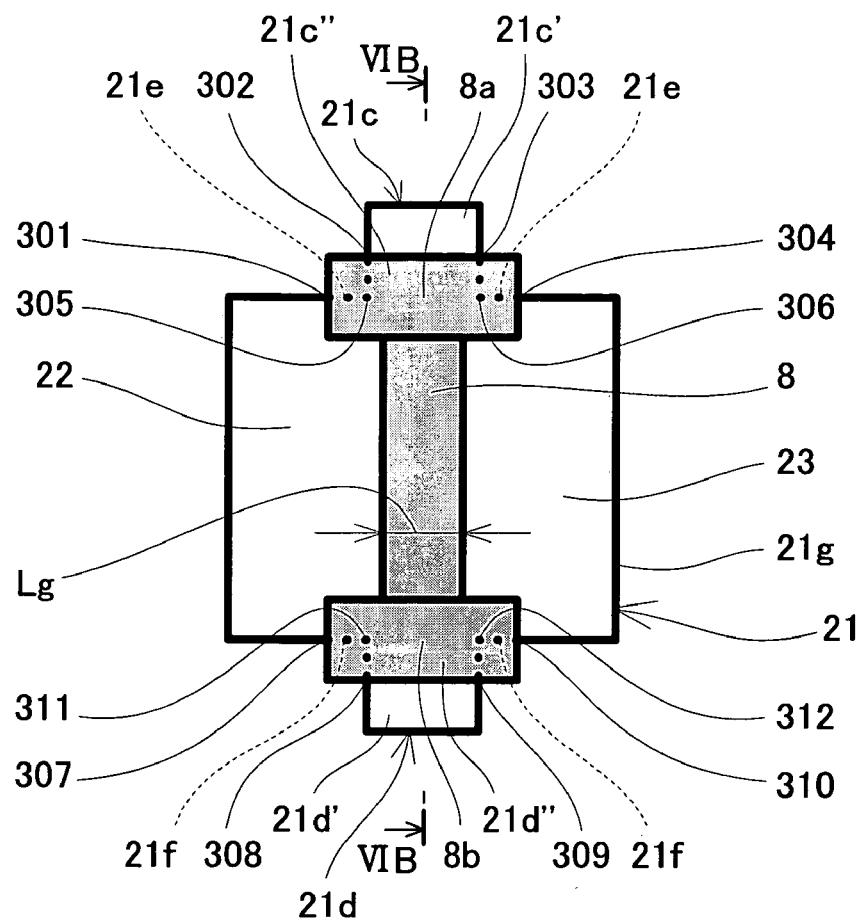
FIGS. 6A, 6B are illustrations showing the shapes of a gate and a selectively-grown mesa of the SiGe-HMISFET of FIG. 1; specifically.
Figure 6B:
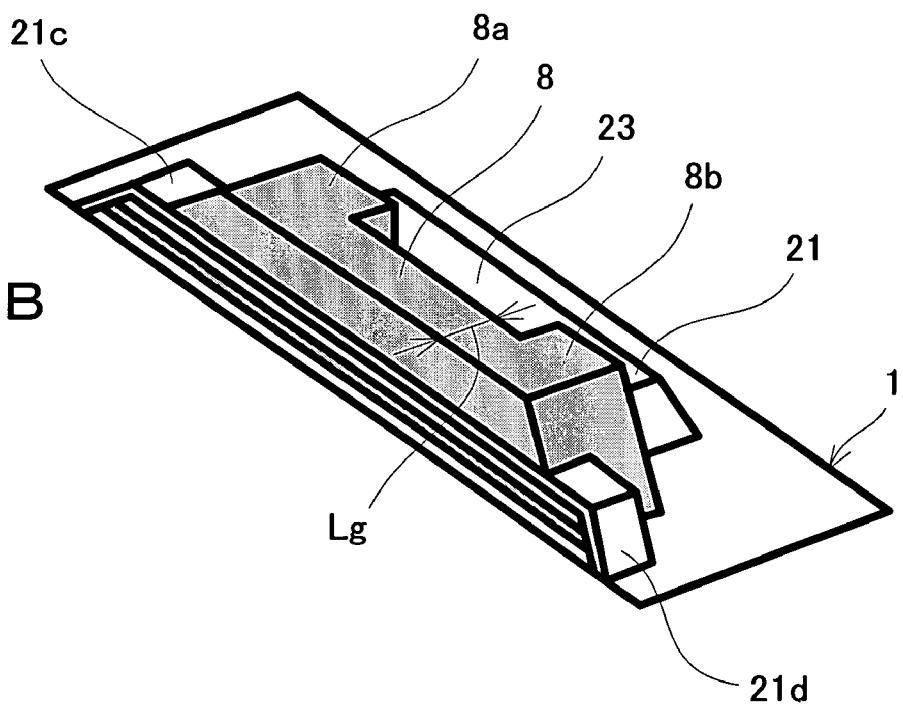

FIG. 1 is a sectional view showing a SiGe-HMISFET as a semiconductor device according to embodiment 1 of the present invention. FIG. 6 is an illustration showing the shapes of a gate and a selectively-grown mesa of the SiGe-HMISFET of FIG. 1; specifically, FIG. 6A is a plan view of the SiGe-HMISFET and FIG. 6B is a perspective view of the SiGe-HMISFET with a section taken on line VIB—VIB of FIG. 6A.

As shown in FIGS. 1 and 6, the SiGe-HMISFET according to this embodiment has n-well 10 and LOCOS 2 formed at surface portions of Si substrate 1. The n-well 10 is formed in active region 3, while the LOCOS 2 formed to surround the active region 3.

On the n-well 10 are formed Si buffer layer 4, SiGe channel layer 5 and Si cap layer 6 in this sequence by selective growth. The Si buffer layer 4, SiGe channel layer 5 and Si cap layer 6 form selectively-grown mesa 21. Gate insulator 7 comprising $SiO_2$ is formed on the selectively-grown mesa 21, specifically, on the Si cap layer 6. On the gate insulator 7 is formed a gate 8 comprising polysilicon.

As shown in FIG. 6, in this embodiment, gate 8 is formed into H-shape and rectangular projecting portions 21c and 21d are respectively formed on two opposite edges of selectively-grown mesa 21 on an extension of the body portion of gate 8. One edge portion 8a of gate 8 is formed to cover a base portion of the projecting portion 21c as well as a pair of edge portions 21e, 21e of selectively-grown mesa 21 on opposite sides of the base portion, while the other edge portion 8b of gate 8 formed to cover a base portion of the projecting portion 21d as well as edge portions 21f, 21f of selectively-grown mesa 21 on opposite sides of the base portion. Stated otherwise, gate 8 intersects body portion 21g of selectively-grown mesa 21 in plan view, so that the periphery of gate 8 intersects the periphery of body portion 21g of selectively-grown mesa 21 at points (hereinafter will be referred to as "first peripheral intersections") 301, 304, 307 and 310. One widthwise end portion 8a of gate 8 covers a pair of connecting portions (hereinafter will be referred to as "corner portions") 305 and 306 connecting the periphery of the projecting portion 21c to the periphery of body portion 21g of selectively-grown mesa 21, while a part 21c' of the projecting portion 21c projects from the periphery of the one end portion 8a of gate 8, so that the periphery of the one end portion 8a intersects the periphery of projecting portion 21c at points (hereinafter will be referred to as "second peripheral intersections") 302 and 303. The other widthwise end portion 8b of gate 8 covers a pair of corner portions 311 and 312 defined by the periphery of the projecting portion 21d and the periphery of body portion 21g of selectively-grown mesa 21, while a part 21d' of the projecting portion 21d projects from the periphery of the other end portion 8b of gate 8, so that the periphery of the other end portion 8b intersects the periphery of projecting portion 21c at second peripheral intersections 308 and 309. The two projecting portions 21c and 21d have respective covered portions 21c" and 21d" covered with the end portions 8a and 8b of gate 8 (hereinafter will be referred to as "gate-covered portions") and respective uncovered portions 21c' and 21d' not covered with the end portions 8a and 8b of gate 8 (hereinafter will be referred to as "gate-uncovered portions".) Hereinafter, the structure comprising such gate 8 and selectively-grown mesa 21 will be referred to as "edgeless H-shaped structure".

Source region 22 and drain region 23, which are doped with a p-type impurity, are formed in regions extending over selectively-grown mesa 21 and a surface portion of n-well 10 of Si substrate 1 on opposite sides of gate 8 in plan view, as shown in FIGS. 1 and 6. A region situated below gate 8 and between source region 22 and drain region 23 forms channel region 24. Accordingly, this SiGe-HMISFET is a p-MISFET. It should be noted that a portion of selectively-grown mesa 21 situated substantially under gate 8 is not implanted with ion impurities. The "active region 3", as used here, means a region surrounded by LOCOS 2 of substrate 1 in which selectively-grown mesa 21 is formed. More specifically, the active region 3 is a region including selectively-grown mesa 21 and an upper portion of n-well 10. In the present specification, the "lengthwise direction of gate 8" means the direction along the gate length, that is, the direction connecting source region 22 and drain region 23 in plan view, while the "widthwise direction of gate 8" means the direction perpendicular to the lengthwise direction of gate 8 in plan view.

Interlayer insulator 15 is formed to cover the surface of substrate 1 covered with LOCOS 2, gate insulator 7 and gate 8. Aluminum conductor lines 9A and 9B are formed to extend upwardly from Si cap layer 6 situated in source region 22 and drain region 23 through gate insulator 7 and interlayer insulator 15. Source electrode 12 and drain electrode 13 are formed on upper ends of the aluminum conductor lines 9A and 9B, respectively. Further, aluminum conductor line 11 is formed to extend upwardly from gate 8 through interlayer insulator 15. Gate electrode 14 is formed on the upper end of aluminum conductor line 11.

The following description is directed to a method of fabricating the SiGe-HMISFET thus constructed.

FIGS. 3A to 3D and 4A to 4C are sectional views illustrating respective fabrication steps for the SiGe-HMISFET shown in FIG. 1.

Figure 3A:
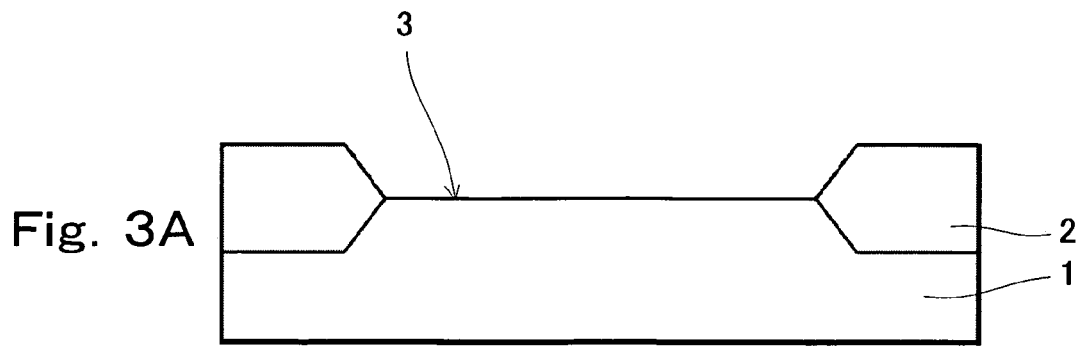
FIGS. 3A to 3D are sectional views illustrating respective fabrication steps for the SiGe-HMISFET of FIG. 1.

First, at the step illustrated in FIG. 3A, LOCOS 2 is formed to a thickness of 330 nm in predetermined region of a surface of Si substrate 1 surrounding active region 3. At that time, active region 3 is shaped to have a plane configuration having body portion 21g and a pair of projecting portions 21c and 21d projecting from body portion 21g as shown in FIG. 6A.

Figure 3B:
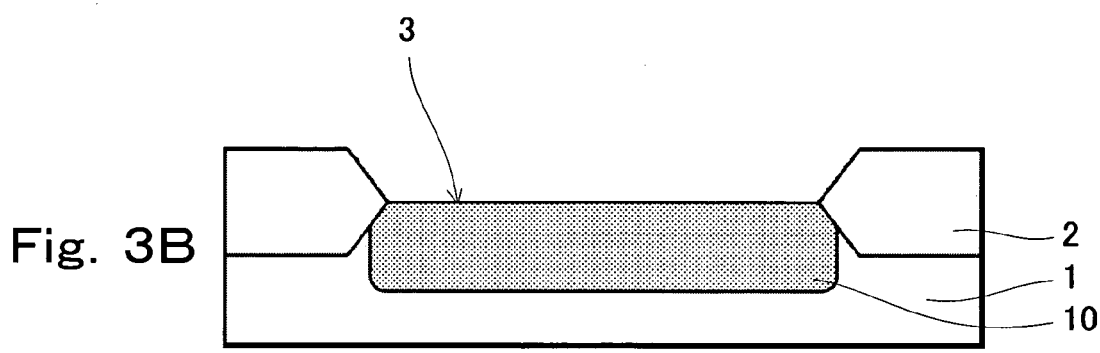

Subsequently, at the step illustrated in FIG. 3B, phosphorus P is implanted into active region 3 of substrate 1 to form n-well 10. The implantation of phosphorus P is conducted under the conditions: implantation energy=90 keV, dose=4×$10^{13}$ cm$^{-2}$.

Figure 3C:
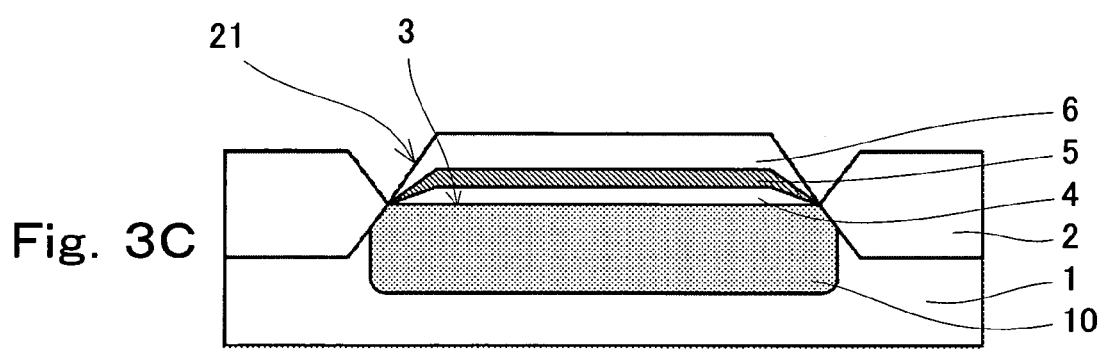

In turn, at the step illustrated in FIG. 3C, Si buffer layer 4 (thickness=10 nm), SiGe channel layer 5 (thickness=15 nm) and Si cap layer 6 (thickness=15 nm) are formed sequentially on active region 3 by selective growth using UHV-CVD (Ultra High Vacuum Chemical Vapor Deposition) apparatus. Thus, selectively-grown mesa 21 is formed. In this case, GeH$_4$ and Si$_2$H$_6$ are used as reactive gases and the growth temperature is set to 530° C.

Figure 3D:
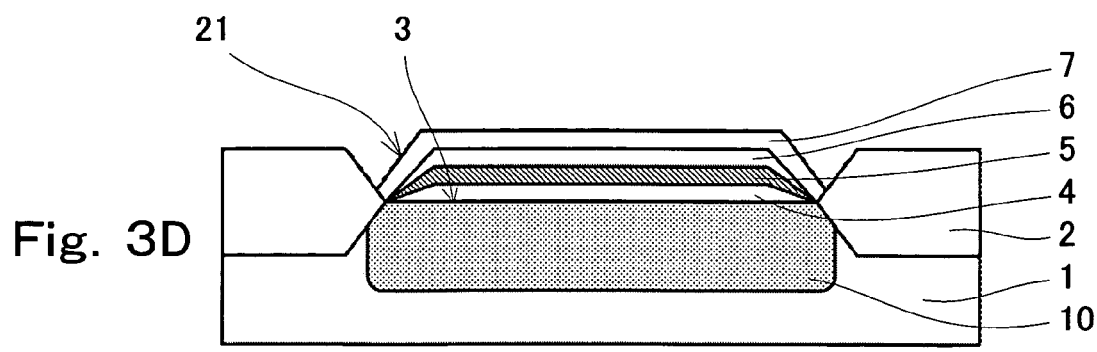

Subsequently, at the step illustrated in FIG. 3D, Si cap layer 6 is oxidized at 750° C. to form gate insulator 7 comprising SiO$_2$ (thickness=6 nm).

Figure 4A:
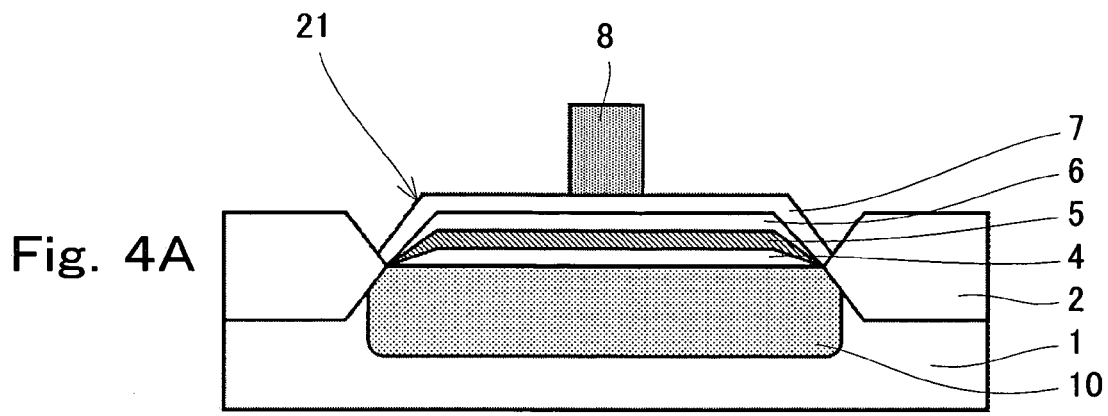
FIGS. 4A to 4C are sectional views illustrating respective fabrication steps for the SiGe-HMISFET of FIG. 1.

Subsequently, at the step illustrated in FIG. 4A, a polysilicon film is formed to a thickness of 200 nm over the entire surface of Si substrate 1 in which LOCOS 2 and gate insulator 7 are formed. The polysilicon film is then patterned into an H-shaped configuration as shown in FIG. 6A to form gate 8.

Figure 4B:
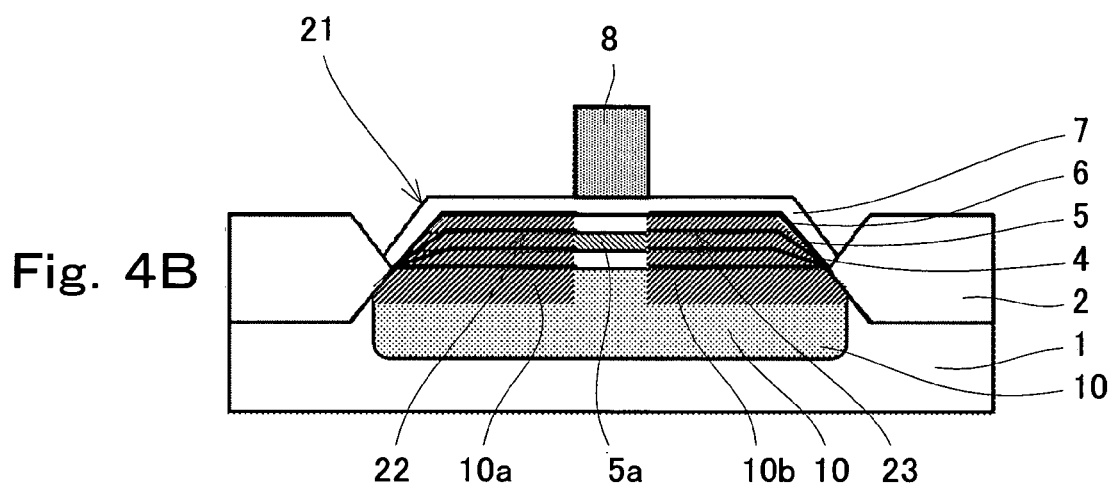

In turn, at the step illustrated in FIG. 4B, BF$_2$ is implanted into the region of substrate 1 in which selectively-grown mesa 21 is formed using gate 8 as a mask, thereby forming source region 22 and drain region 23 on opposite sides of gate 8 in plan view, each of the regions 22 and 23 extending over selectively-grown mesa 21 and a surface portion of n-well 10. The implantation of BF$_2$ is conducted under the conditions: implantation energy=30 keV, dose=4×$10^{15}$ cm$^{-2}$.

Figure 4C:
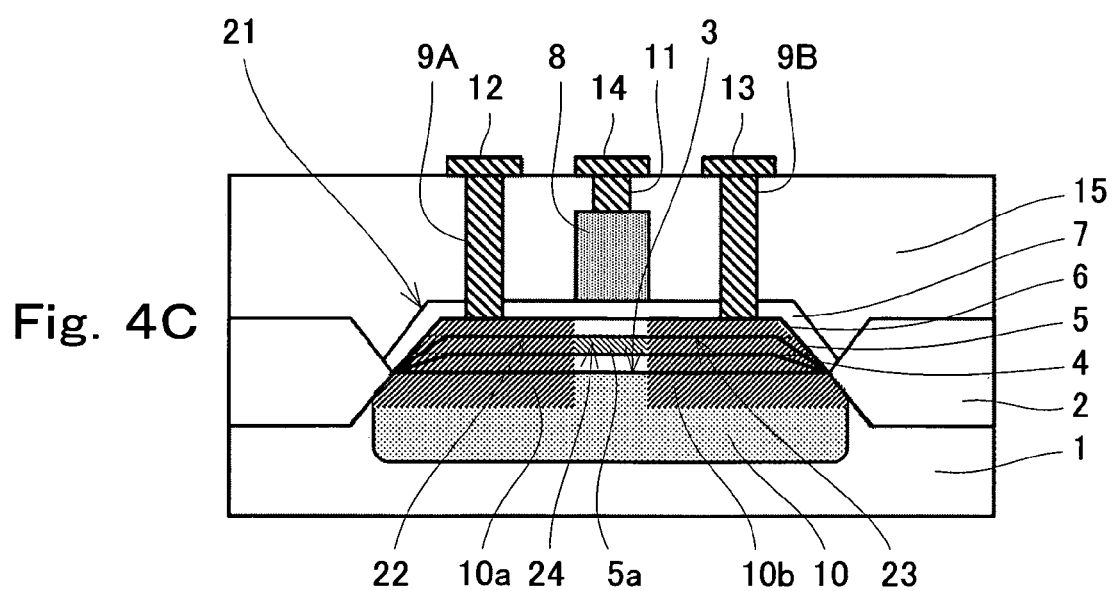

Subsequently, at the step illustrated in FIG. 4C, interlayer insulator 15 is formed over the surface of substrate 1 covered with LOCOS 2, gate insulator 7 and gate 8. Formed thereafter are aluminum conductor lines 9A and 9B, which extend upwardly from Si cap layer 6 situated in source region 22 and drain region 23 through gate insulator 7 and interlayer insulator 15, respectively, and aluminum conductor line 11, which extends upwardly from gate 8 through interlayer insulator 15. Finally, source electrode 12 and drain electrode 13 are formed at upper ends of respective aluminum conductor lines 9A and 9B, while gate electrode 14 formed at the upper end of aluminum conductor line 11.

Thus, the SiGe-HMISFET is completed.

In the SiGe-HMISFET thus constructed and fabricated, a portion not covered with gate 8 (periphery of gate-uncovered portion 21c') exists in a part of the periphery (edge) of selectively-grown mesa 21 which is situated between first peripheral intersections 301 and 304, the first peripheral intersection 301 being one end of a part of the periphery of selectively-grown mesa 21 which forms a periphery of source region 22, the first peripheral intersection 304 being one end of a part of the periphery of selectively-grown mesa 21 which forms a periphery of drain region 23. The periphery of this gate-uncovered portion 21c' is free from being applied with voltage by gate 8. Likewise, a portion not covered with gate 8 (periphery of gate-uncovered portion 21d') exists in a part of the periphery (edge) of selectively-grown mesa 21 which is situated between first peripheral intersections 307 and 310, the first peripheral intersection 307 being other end of the part of the periphery of selectively-grown mesa 21 which forms the periphery of source region 22, the first peripheral intersection 310 being other end of the part of the periphery of selectively-grown mesa 21 which forms the periphery of drain region 23. The periphery of this gate-uncovered portion 21d' is free from being applied with voltage by gate 8. For this reason, a channel region interconnecting source region 22 and drain region 23 is not formed in the edge portion of selectively-grown mesa 21. It is therefore possible to prevent the occurrence of leakage current essential to the edge portion of selectively-grown mesa 21.

Next, comparative examples of this embodiment will be described.

First Comparative Example

Figure 2A:
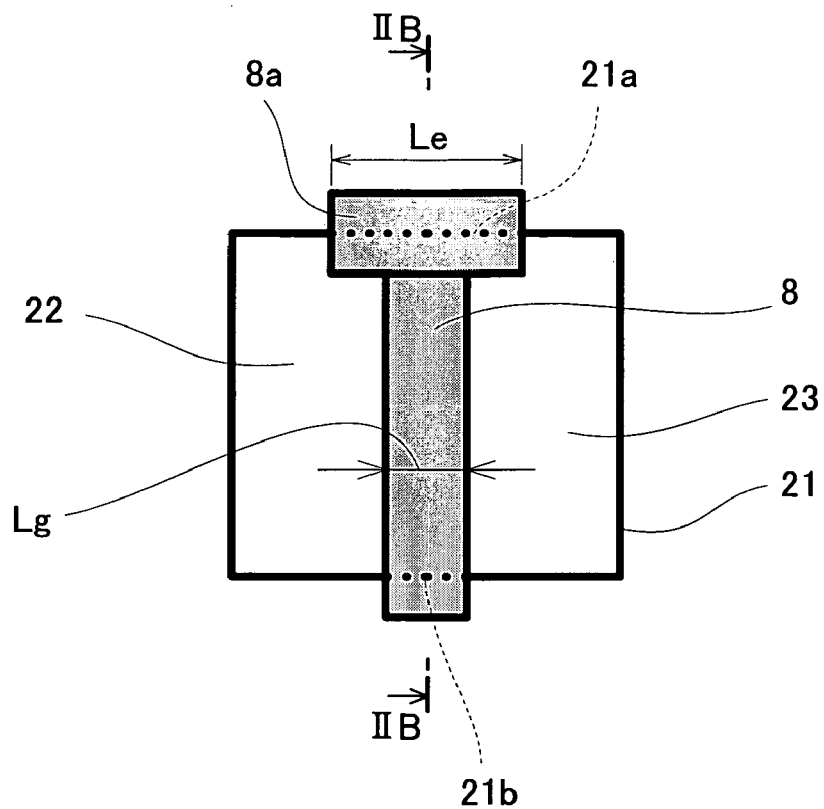
FIGS. 2A, 2B are illustrations showing the shape of a gate of a SiGe-HMISFET according to a first comparative example of embodiment 1 of the present invention; specifically.
Figure 2B:
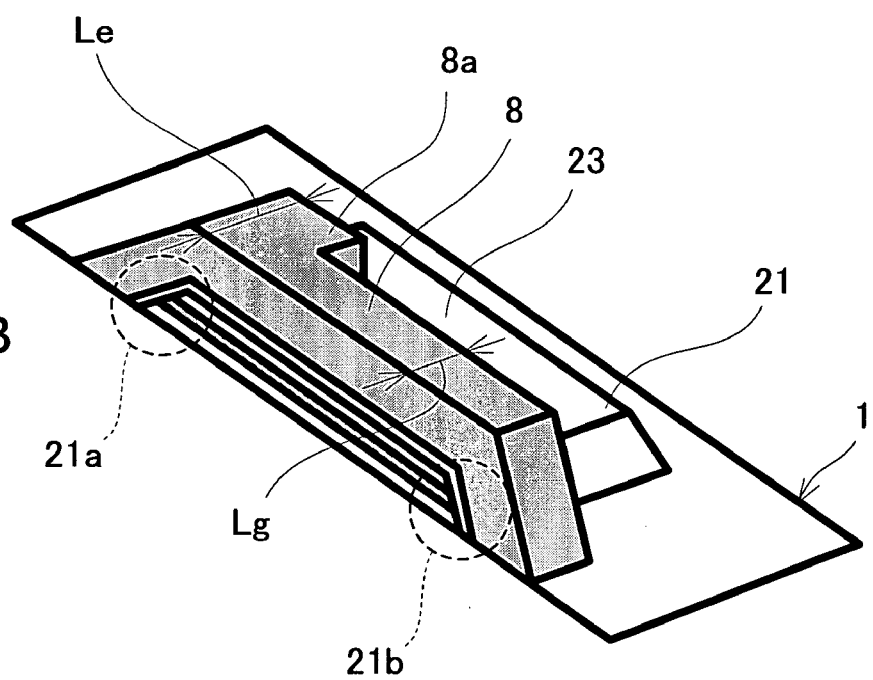

FIGS. 2A, 2B are illustrations showing the shape of a gate of a SiGe-HMISFET according to a first comparative example of embodiment 1 of the present invention; specifically, FIG. 2A is a plan view of the SiGe-HMISFET and FIG. 2B is a perspective view of the SiGe-HMISFET with a section taken on line IIB—IIB of FIG. 2A.

Since the SiGe-HMISFET according to the first comparative example is similar to the SiGe-HMISFET of the construction shown in FIG. 6 (hereinafter will be referred to as "regular construction") in sectional structure and fabrication method, description of the sectional structure and fabrication method will be omitted.

In the subject comparative example, gate 8 is formed into a T-shaped configuration in plan view as shown in FIG. 2A, having a body portion extending linearly in a central portion of selectively-grown mesa 21 and an edge portion 8$a$ at one end of the body portion, the edge portion 8$a$ extending along an edge portion of selectively-grown mesa 21. Hereinafter, the structure of this gate 8 will be referred to as "T-shaped structure". Here, the ratio (Le/Lg) of edge length Le, which is the width of edge portion 8$a$ of gate 8, to gate length Lg, which is the width of the body portion of gate 8, is preferably not less than 1.5 and not more than 10, more preferably not less than 2 and not more than 8, much more preferably not less than 3 and not more than 5.

Since gate 8 of the subject comparative example is of the T-shaped structure as shown in FIG. 2A, a region of the edge portion of selectively-grown mesa 21 situated below the edge portion 8$a$ of gate 8, namely edge portion channel region 21$a$, has a larger length than a corresponding region of a conventional SiGe-MISFET having gate 8 of the conventional I-shaped structure. Accordingly, it becomes more difficult for current to flow at the edge portion channel region 21$a$ because of the increased length of region 21$a$, resulting in reduced leakage current. In addition, the Ion-Ioff characteristics are improved.

Second Comparative Example

Figure 5A:
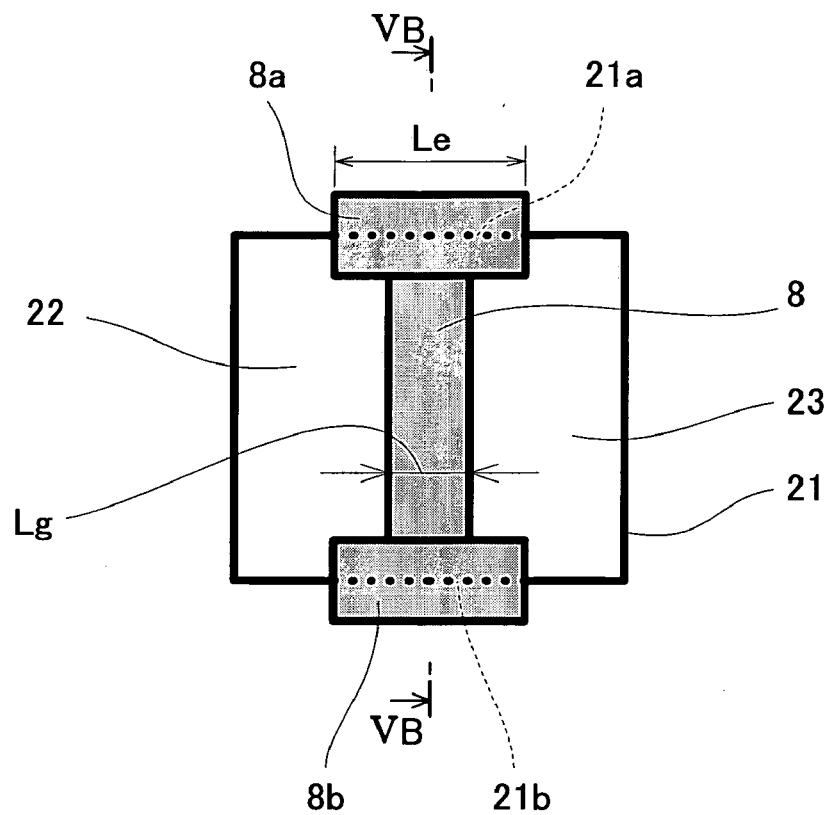
FIGS. 5A, 5B are illustrations showing the shape of a gate of a SiGe-HMISFET according to a second comparative example of embodiment 1 of the present invention; specifically.
Figure 5B:
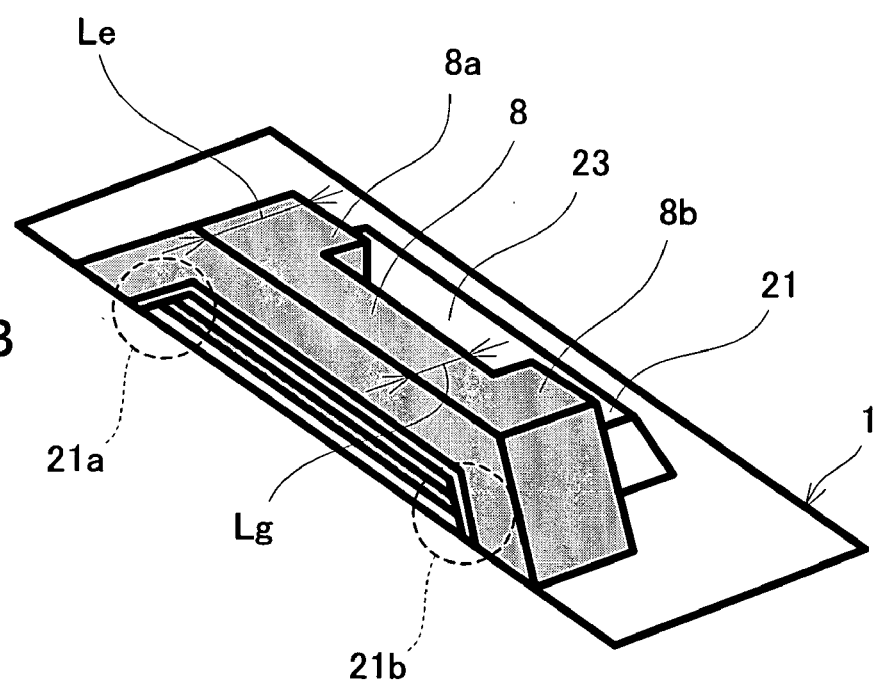

FIGS. 5A, 5B are illustrations showing the shape of a gate of a SiGe-HMISFET according to a second comparative example of embodiment 1 of the present invention; specifically, FIG. 5A is a plan view of the SiGe-HMISFET and FIG. 5B is a perspective view of the SiGe-HMISFET with a section taken on line VB—VB of FIG. 5A.

Since the SiGe-HMISFET according to the second comparative example is similar to the SiGe-HMISFET of the regular construction shown in FIG. 6 in sectional structure and fabrication method, description of the sectional structure and fabrication method will be omitted.

In the subject comparative example, gate 8 is formed into an H-shaped configuration in plan view. (Hereinafter, the structure of this gate 8 be referred to as "H-shaped structure".) Accordingly, each of edge portion channel regions 21$a$ and 21$b$ situated below the opposite edge portions 8$a$ and 8$b$ of gate 8, respectively, has a larger length than a corresponding region of the conventional SiGe-HMISFET having gate 8 of the conventional I-shaped structure. It is therefore possible to further reduce leakage current.

Comparison Between Regular Construction and Comparative Examples

As described above, each of the first comparative example (FIGS. 2A, 2B) and the second comparative example (FIGS. 5A, 5B) can reduce leakage current essential to the edge portion of the selectively-grown mesa by making the length of edge portion channel region larger than that of the corresponding region of the conventional SiGe-HMISFET having gate 8 of the conventional I-shaped structure. However, lengthening the length of the edge portion channel region to the longest can merely lead to a reduction in leakage current, hence cannot prevent the occurrence of leakage current. By contrast, the regular construction (FIG. 6) can prevent the occurrence of leakage current essential to the edge portion of the selectively-grown mesa, as described above.

Next, detailed description will be made of the characteristics of each of the SiGe-HMISFETs according to the regular construction and the first and second comparative examples of this embodiment. (Hereinafter, any one of these SiGe-HMISFETs will be called a SiGe-HMISFET according to the subject embodiment for convenience.)

Figure 7A:
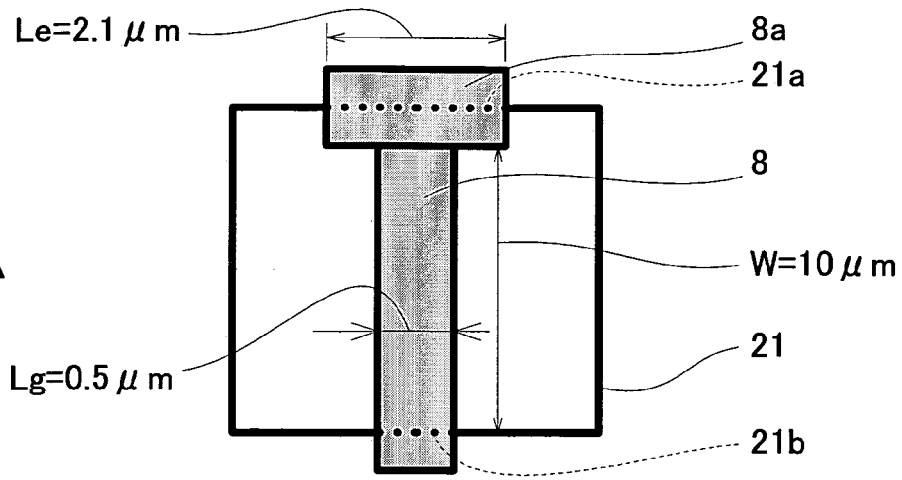
FIGS. 7A to 7C show dimensions of SiGe-HMISFETs used in evaluation of characteristics; specifically.
Figure 7B:
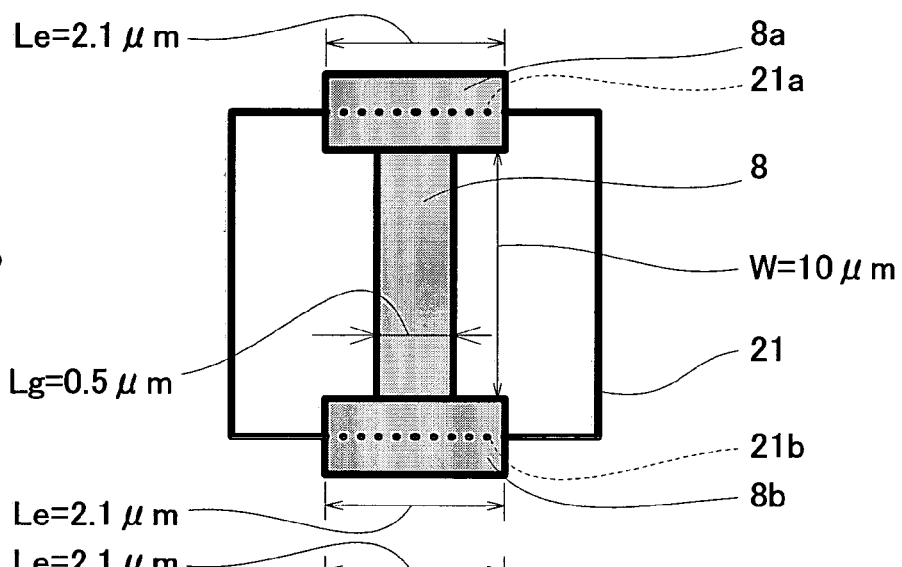
Figure 7C:
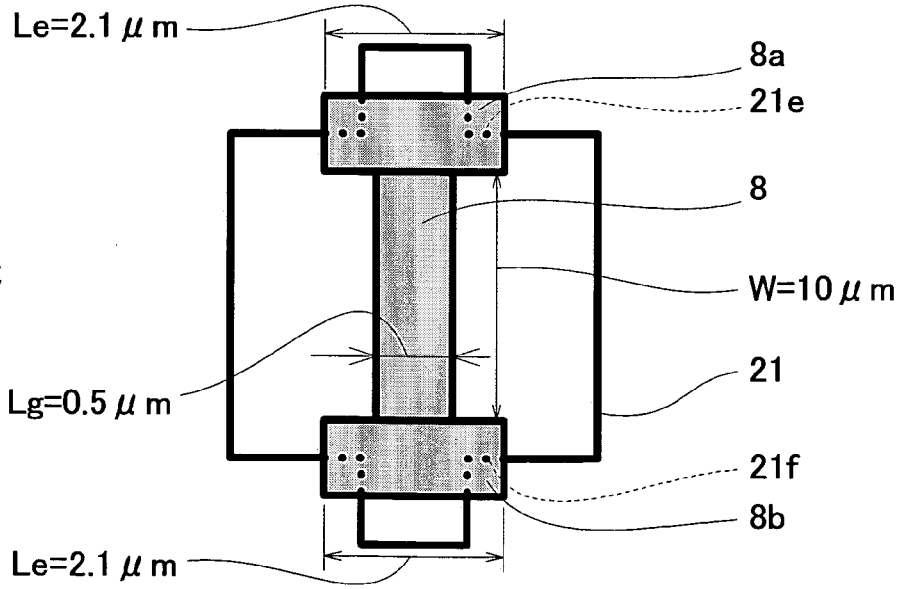

FIGS. 7A to 7C show dimensions of SiGe-HMISFETs used in evaluation of the characteristics; specifically, FIG. 7A is a plan view showing dimensions of a gate of T-shaped structure, FIG. 7B is a plan view showing dimensions of a gate of H-shaped structure and FIG. 7C is a plan view showing dimensions of a gate of edgeless H-shaped structure.

Gate 8 of any one of the structures shown in FIG. 7 was formed to have the dimensions: gate length Lg=0.5 μm, width Le of edge portion 8$a$, 8$b$ of gate 8 (hereinafter will be referred to as "edge length")=2.1 μm and gate width W=10 μm. The ratio of edge length to gate length Le/Lg was 2.1/0.5=4.2. A SiGe-HMISFET having the conventional I-shaped gate structure was also fabricated for comparison. The gate 8 of this conventional SiGe-HMISFET was formed to have the dimensions: gate length Lg=0.5 μm and gate width W=10 μm, as shown in FIG. 17A. Here, since the ratio of the edge length to the gate length of the conventional I-shaped gate structure was 1, each of the T-shaped gate structure and H-shaped gate structure according to the subject embodiment had edge portion channel region 21$a$, 21$b$ having a length 4.2 times as large as the length of a corresponding region of the conventional I-shaped gate structure.

Figure 9A:
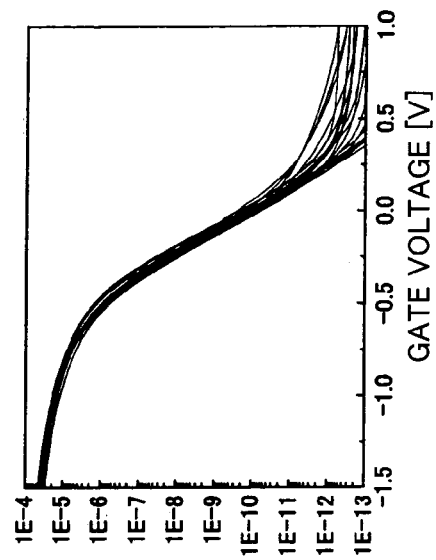
FIGS. 9A to 9D are graphs comparing the SiGe-HMISFETs according to embodiment 1 of the present invention to the conventional SiGe-HMISFET as to Vg-Id characteristic; specifically.
Figure 9B:
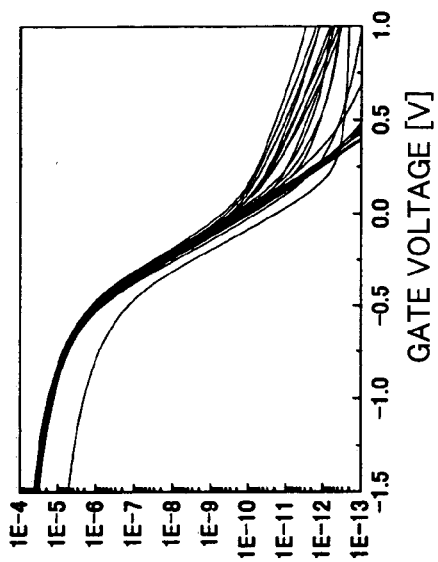
Figure 9C:
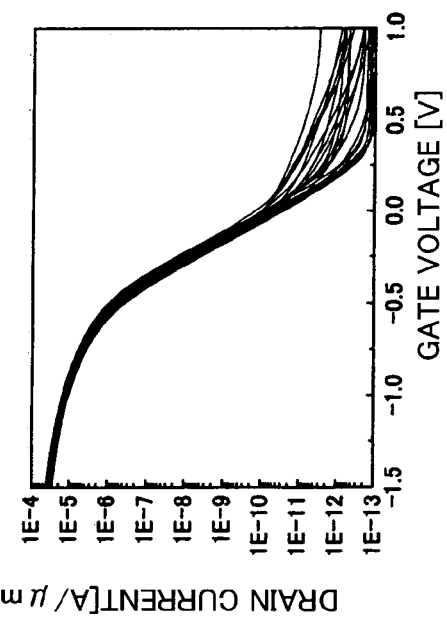
Figure 9D:
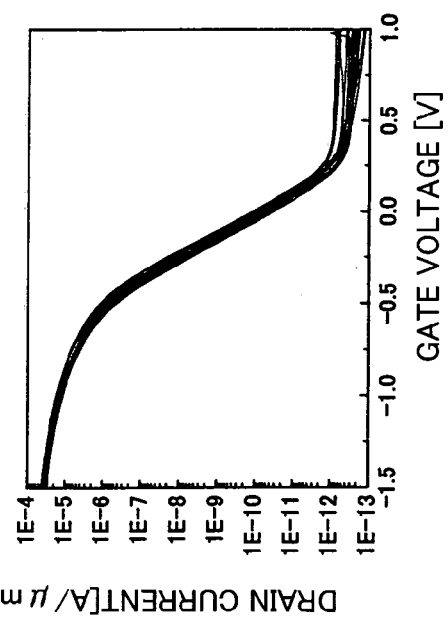
Figure 11A:
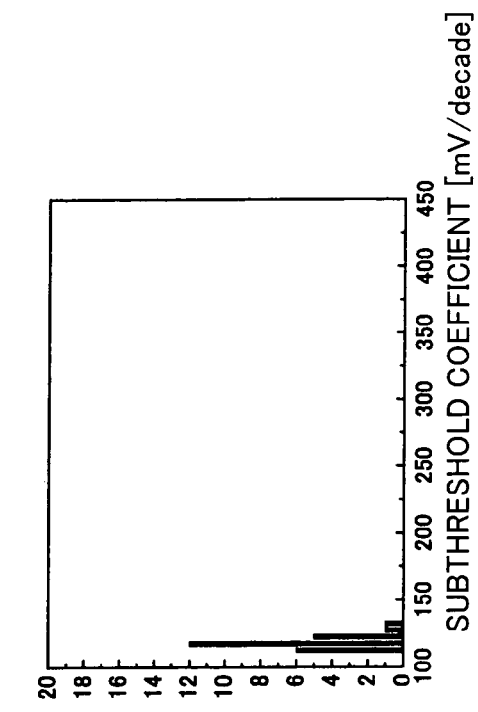
FIGS. 11A to 11D are frequency graphs comparing the SiGe-HMISFETs according to embodiment 1 of the present invention to the conventional SiGe-HMISFET as to subthreshold slope; specifically.
Figure 11B:
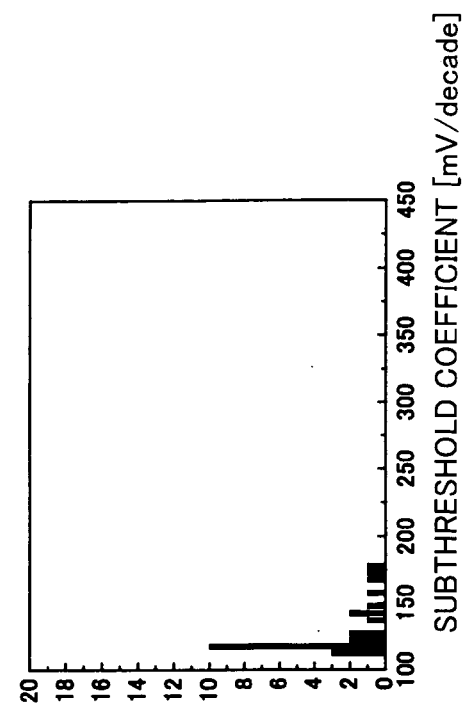
Figure 11C:
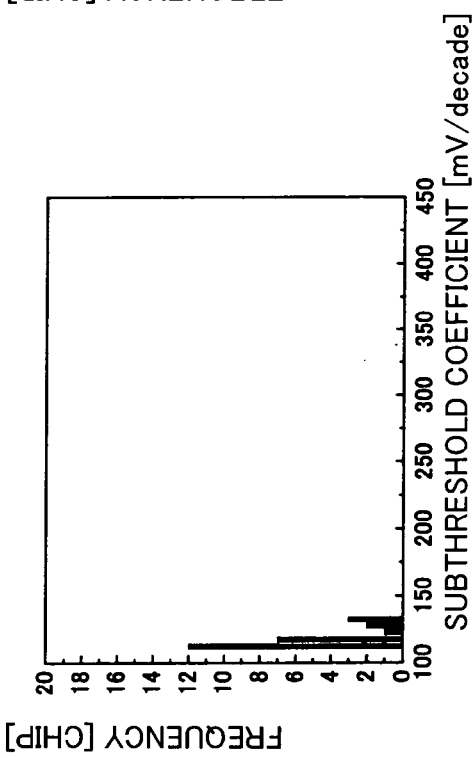
Figure 11D:
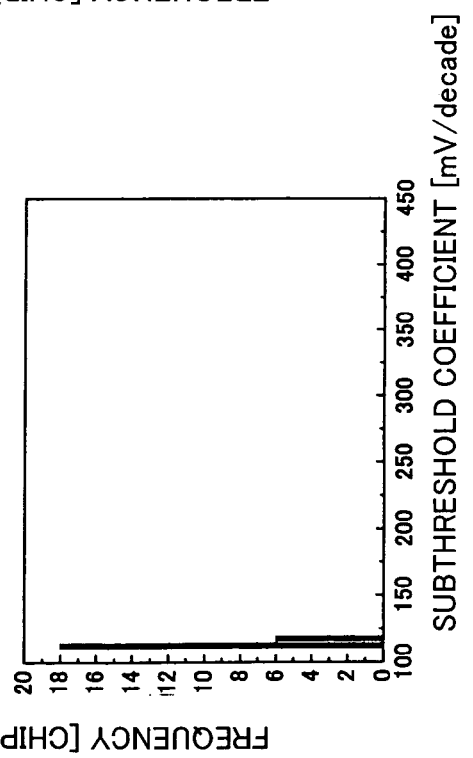

FIGS. 8A to 8D are frequency graphs comparing the SiGe-HMISFETs according to the subject embodiment to the conventional SiGe-HMISFET as to frequency distribution of leakage currents; specifically, FIG. 8A is a graph obtained from the SiGe-HMISFET with the T-shaped gate structure, FIG. 8B is a graph obtained from the SiGe-HMISFET with the H-shaped gate structure, FIG. 8C is a graph obtained from the SiGe-HMISFET with the edgeless H-shaped gate structure and FIG. 8D is a graph obtained from the conventional SiGe-HMISFET with the conventional I-shaped gate structure. FIGS. 9A to 9D are graphs comparing the SiGe-HMISFETs according to the subject embodiment to the conventional SiGe-HMISFET as to Vg-Id characteristic; specifically, FIG. 9A is a graph obtained from the SiGe-HMISFET with the T-shaped gate structure, FIG. 9B is a graph obtained from the SiGe-HMISFET with the H-shaped gate structure, FIG. 9C is a graph obtained from the SiGe-HMISFET with the edgeless H-shaped gate structure and FIG. 9D is a graph obtained from the conventional SiGe-HMISFET with the conventional I-shaped gate structure. FIGS. 10A to 10D are frequency graphs comparing the SiGe-HMISFETs according to the subject embodiment to the conventional SiGe-HMISFET as to threshold voltage; specifically, FIG. 10A is a graph obtained from the SiGe-HMISFET with the T-shaped gate structure, FIG. 10B is a graph obtained from the SiGe-HMISFET with the H-shaped gate structure, FIG. 10C is a graph obtained from the SiGe-HMISFET with the edgeless H-shaped gate structure and FIG. 10D is a graph obtained from the conventional SiGe-HMISFET with the conventional I-shaped gate structure. FIGS. 11A to 11D are frequency graphs comparing the SiGe-HMISFETs according to the subject embodiment to the conventional SiGe-HMISFET as to subthreshold slope; specifically, FIG. 11A is a graph obtained from the SiGe-HMISFET with the T-shaped gate structure, FIG. 11B is a graph obtained from the SiGe-HMISFET with the H-shaped gate structure, FIG. 11C is a graph obtained from the SiGe-HMISFET with the edgeless H-shaped gate structure and FIG. 10D is a graph obtained from the conventional SiGe-HMISFET with the conventional I-shaped gate structure.

As apparent from FIGS. 8A to 11D, the SiGe-HMISFETs according to the subject embodiment were improved over the conventional SiGe-HMISFET with the conventional I-shaped gate structure in any one of the characteristics: leakage current, Vg-Id, threshold voltage and subthreshold slope, with increasing degree of improvement in the sequence of T-shaped gate structure, H-shaped gate structure and edgeless H-shaped gate structure. Particularly, the SiGe-HMISFET with the edgeless H-shaped gate structure was substantially improved as to variations in leakage current, Vg-Id characteristic and subthreshold slope. Variations in subthreshold coefficient, in particular, were hardly observed. Thus, the SiGe-HMISFET with the edgeless H-shaped gate structure exhibited favorable Ion-Ioff characteristics.

While body portion 21g of the selectively-grown mesa of the above-described embodiment has a rectangular plane configuration, the body portion 21g may have any plane configuration.

Though the foregoing embodiment is an application of the present invention to a SiGe-pMISFET, the present invention may be applied to a SiGe-nMISFET similarly.

Embodiment 2

Embodiment 1 having been described above is the case where the present invention is applied to a SiGe-HMISFET fabricated by selective growth. According to the study made by the inventors of the present invention, however, it was found that, even when any one of the gate structures according to embodiment 1 was used in any MISFET other than the SiGe-HMISFET fabricated by selective growth, leakage current could be reduced and that particularly the use of the edgeless gate structure of embodiment 1 in such a MISFET made it possible to prevent the occurrence of leakage current.

Embodiment 2 and the embodiments to be described thereafter according to the present invention are examples where the edgeless gate structure is employed in Si-MISFET, Si-DTMISFET, SiGe-HMISFET, SiGe-DTMISFET (Dynamic Threshold-voltage MISFET), strained Si-MISFET and strained Si-DTMISFET, which are device-isolated by STI (Shallow Trench Isolation).

As the background of the description of embodiment 2 and the subsequent embodiments, description will be made of the cause of the occurrence of leakage current in Si-MISFET, Si-DTMISFET, SiGe-HMISFET, SiGe-DTMISFET, strained Si-MISFET and strained Si-DTMISFET, which are device-isolated by conventional STI (hereinafter will be referred to as "conventional" simply.)

Figure 69A:
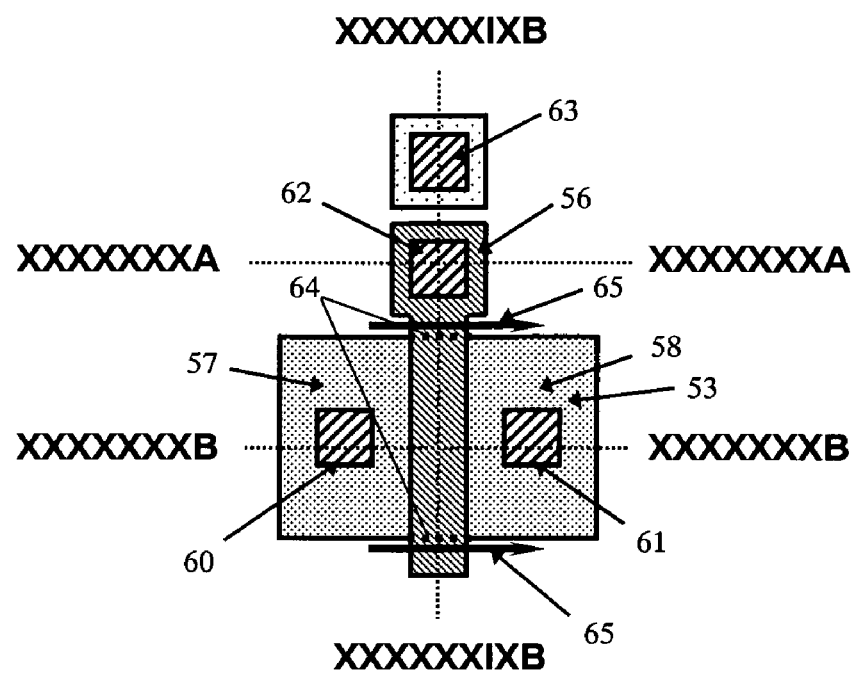
FIGS. 69A, 69B are illustrations showing the construction of a conventional Si-MISFET; specifically.
Figure 69B:
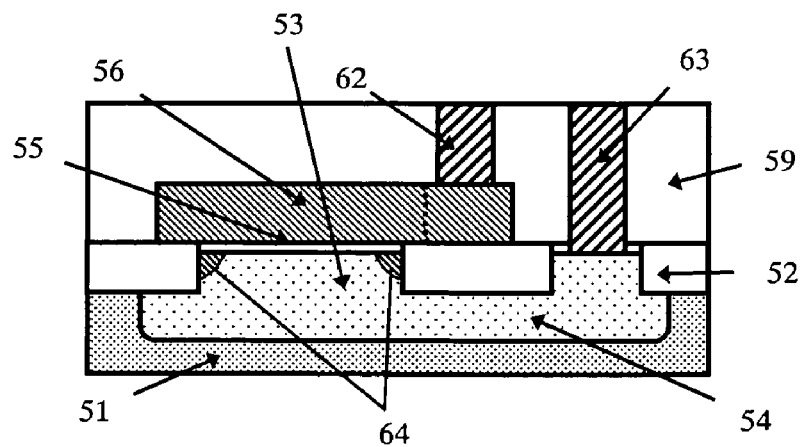
Figure 70A:
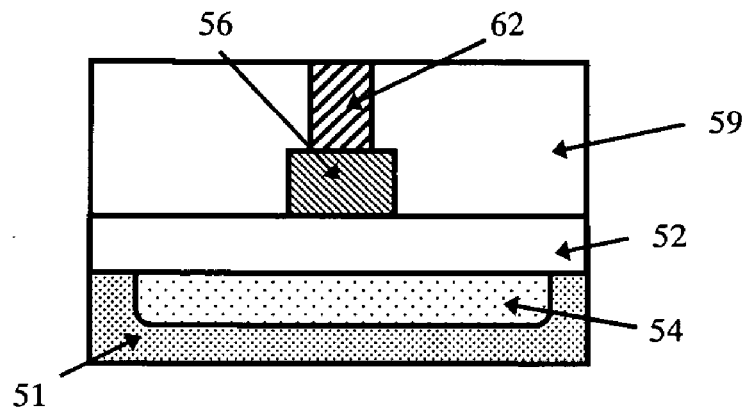
FIGS. 70A, 70B are illustrations showing the construction of the conventional Si-MISFET, specifically.
Figure 70B:
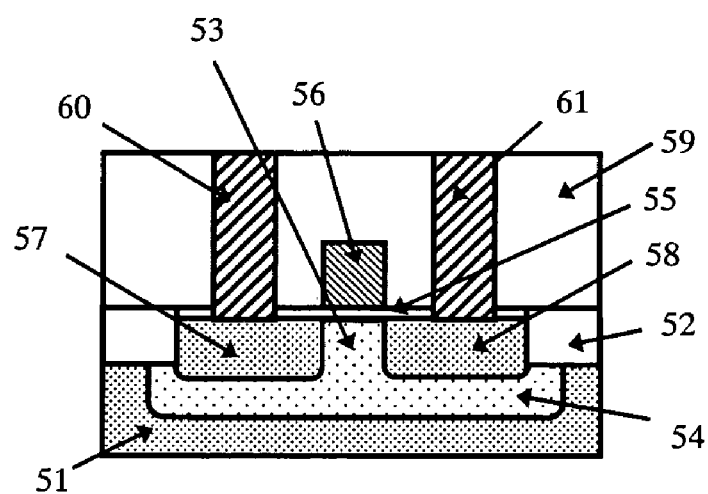

FIGS. 69A, 69B are illustrations showing the construction of a conventional Si-MISFET, specifically, FIG. 69A is a plan view of the conventional Si-MISFET and FIG. 69B is a sectional view taken on line XXXXXXIXB—XXXXXX-IXB of FIG. 69A. FIGS. 70A, 70B are illustrations showing the construction of the conventional Si-MISFET, specifically, FIG. 70A is a sectional view taken on line XXXXXXXA—XXXXXXXA of FIG. 69A and FIG. 70B is a sectional view taken on line XXXXXXXB—XXXXXXXB of FIG. 69A.

As shown in FIGS. 69A to 70B, the conventional Si-MISFET (which is of n-channel type in this embodiment but may be of p-channel type instead) has active region 53 formed as surrounded by STI 52 in a surface portion of Si substrate 51, gate insulator 55 formed on active region 53, and gate (gate electrode) 56 formed on gate insulator 55. Gate 56 is formed to extend across active region 53 in plan view, and an n-type source region (hereinafter will be referred to as "n-source region") 57 and an n-type drain region (hereinafter will be referred to as "n-drain region") 58 are formed in active region 53 on opposite sides of gate 56 in plan view. A portion of active region 53 situated substantially below gate 56 is doped into p-type to form a channel region. Reference numerals 54 and 59 designate a well of p-type (hereinafter will be referred to as "p-well") and an interlayer insulator, respectively. Reference numerals 60, 61, 62 and 63 designate source contact, drain contact, gate contact and well contact, respectively.

In the Si-MISFET thus constructed, stress is developed at corner portions of the periphery of active region 53 during the formation of STI. Such stress is caused due to the difference in thermal expansion coefficient between the silicon oxide film mainly used in the STI portion and the semiconductor. As apparent from FIG. 69B, the electric field produced by gate 56 is concentrated at those corner portions 64 which are situated below gate 56 (hereinafter will be referred to as "below-gate corner portions".) For this reason, leakage current 65 flows at these below-gate corner portions 64.

Figure 71A:
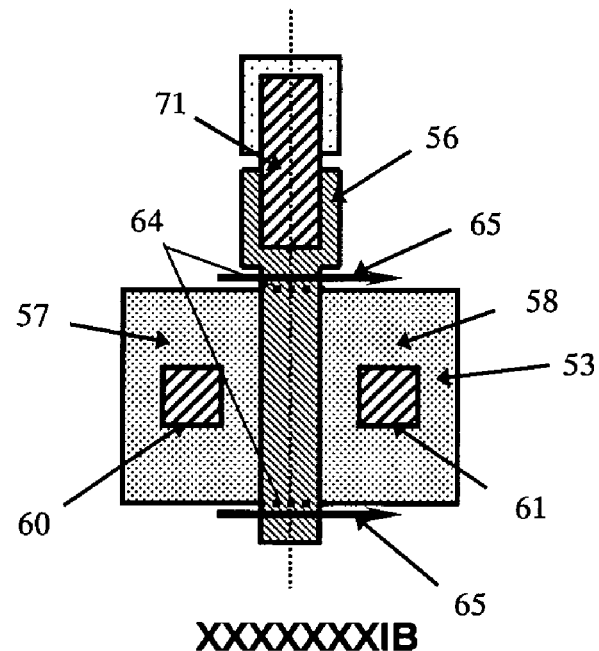
FIGS. 71A, 71B are illustrations showing the construction of a conventional Si-DTMISFET; specifically.
Figure 71B:
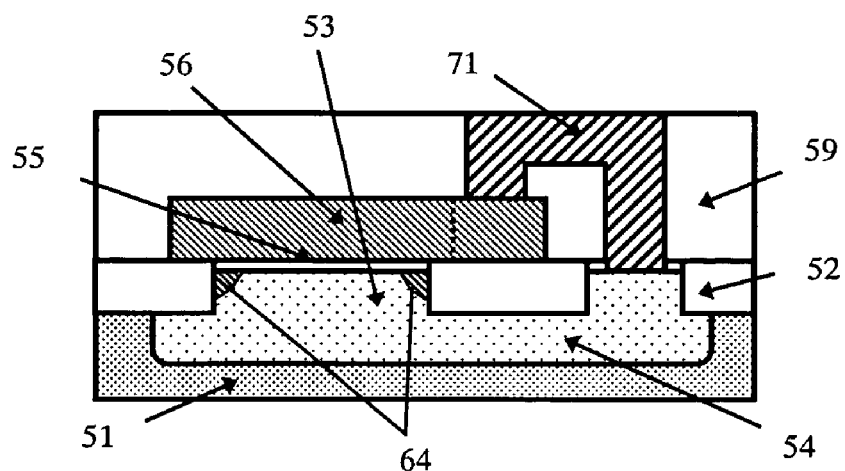

FIGS. 71A, 71B are illustrations showing the construction of a conventional Si-DTMISFET, specifically, FIG. 71A is a plan view of the conventional Si-DTMISFET and FIG. 71B is a sectional view taken on line XXXXXXXIB—XXXXXXXIB of FIG. 71A.

As shown in FIGS. 71A and 71B, the Si-DTMISFET is of the same construction as the Si-MISFET except that the gate contact and the well contact are formed integral with each other as gate-and-well contact 71. Therefore, leakage current 65 flows at below-gate corner portions 64 as in the Si-MISFET.

Figure 72A:
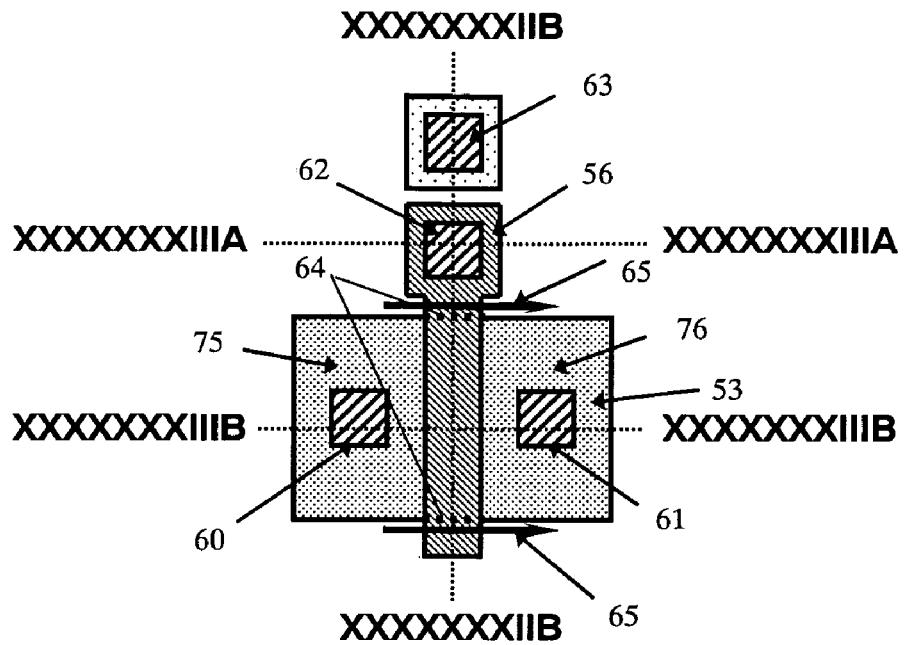
FIGS. 72A, 72B are illustrations showing the construction of a conventional SiGe-HMISFET; specifically.
Figure 72B:
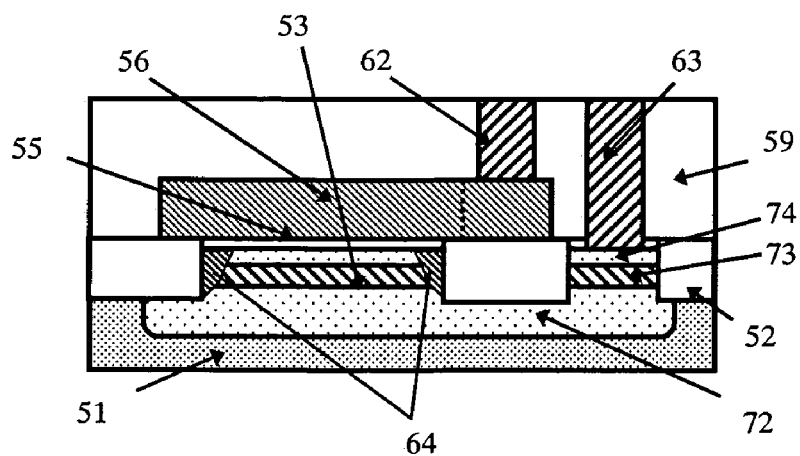
Figure 73A:
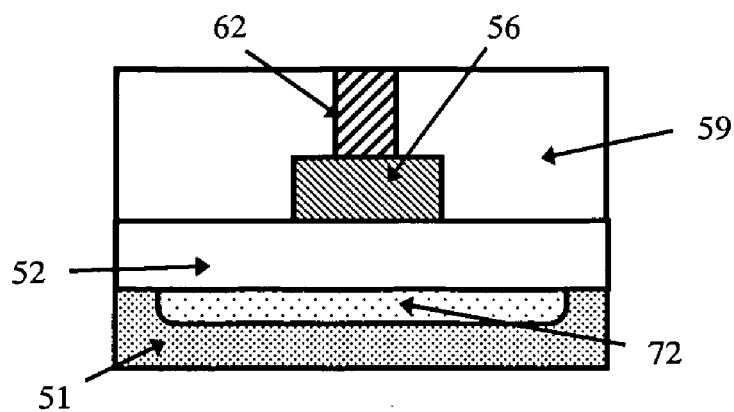
FIG. 73A is a sectional view taken on line XXXXXXXIIIA—XXXXXXXIIIA of FIG. 72A
Figure 73B:
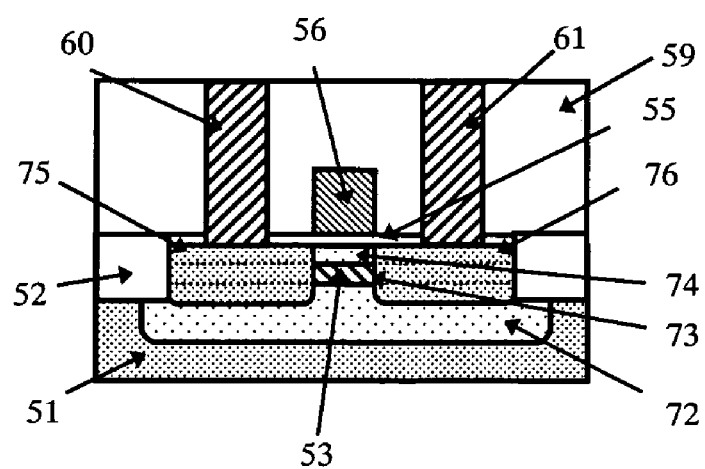
FIG. 73B is a sectional view taken on line XXXXXXXIIIB—XXXXXXXIIIB of FIG. 72A.

FIGS. 72A, 72B are illustrations showing the construction of a conventional SiGe-HMISFET; specifically, FIG. 72A is a plan view of the conventional SiGe-HMISFET and FIG. 72B is a sectional view taken on line XXXXXXXIIB—XXXXXXXIIB of FIG. 72A. FIGS. 73A, 73B are illustrations showing the construction of the conventional SiGe-HMISFET, specifically, FIG. 73A is a sectional view taken on line XXXXXXXIIIA—XXXXXXXIIIA of FIG. 72A and FIG. 73B is a sectional view taken on line XXXXXXXIIIB—XXXXXXXIIIB of FIG. 72A.

As shown in FIGS. 72A, 72B, 73A and 73B, the SiGe-HMISFET is of the same construction as the Si-MISFET except that SiGe layer 73 and Si layer 74 are layered on active region 53. Therefore, leakage current 65 flows at below-gate corner portions 64 as in the Si-MISFET.

Figure 74A:
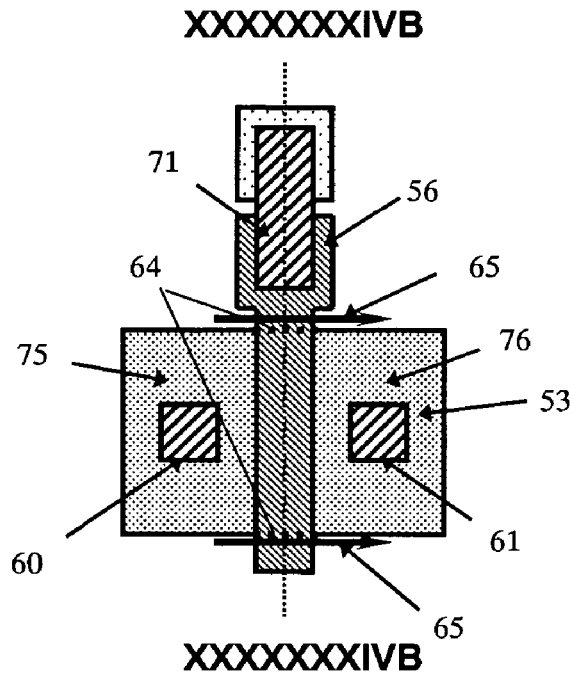
FIGS. 74A, 74B are illustrations showing the construction of a conventional SiGe-HDTMISFET, specifically.
Figure 74B:
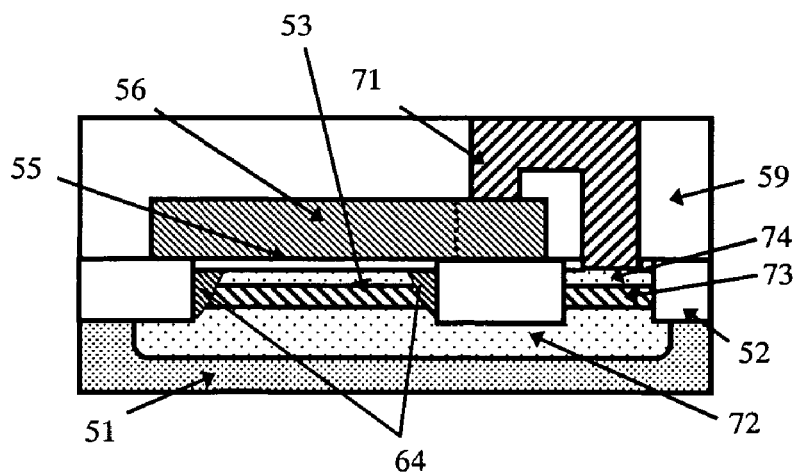

FIGS. 74A, 74B are illustrations showing the construction of a conventional SiGe-HDTMISFET, specifically, FIG. 74A is a plan view of the conventional SiGe-HDTMISFET and FIG. 74B is a sectional view taken on line XXXXXXX-IVB—XXXXXXXIVB of FIG. 74A.

As shown in FIGS. 74A and 74B, the SiGe-HDTMISFET is of the same construction as the SiGe-HMISFET except that the gate contact and the well contact are formed integral with each other as gate-and-well contact 71. Therefore, leakage current 65 flows at below-gate corner portions 64 as in the SiGe-HMISFET.

Figure 75A:
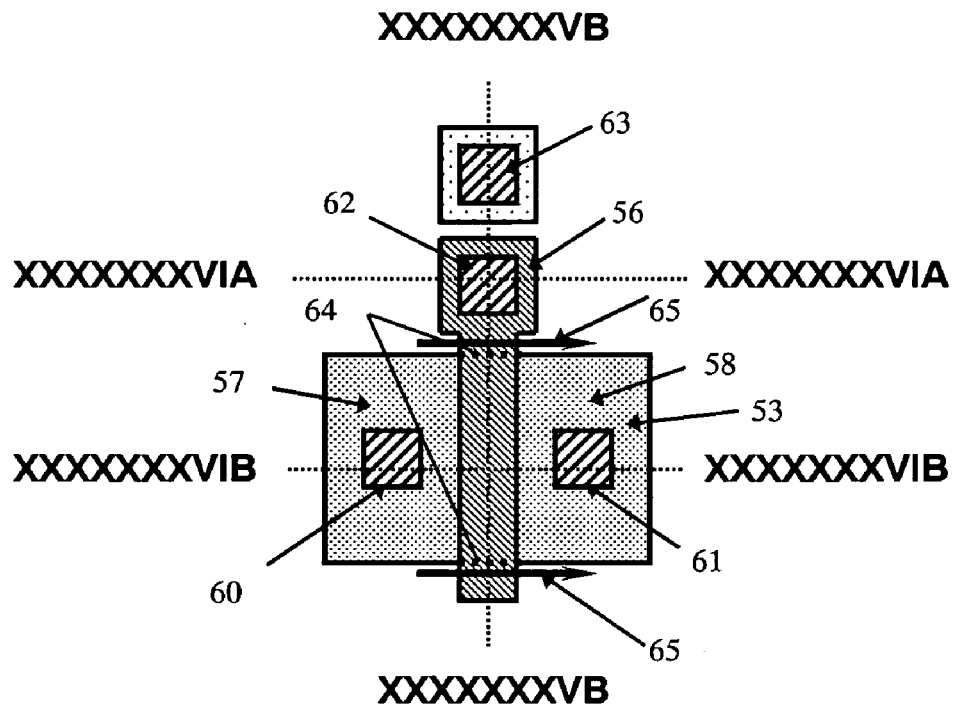
FIGS. 75A, 75B are illustrations showing the construction of a conventional strained Si-MISFET; specifically.
Figure 75B:
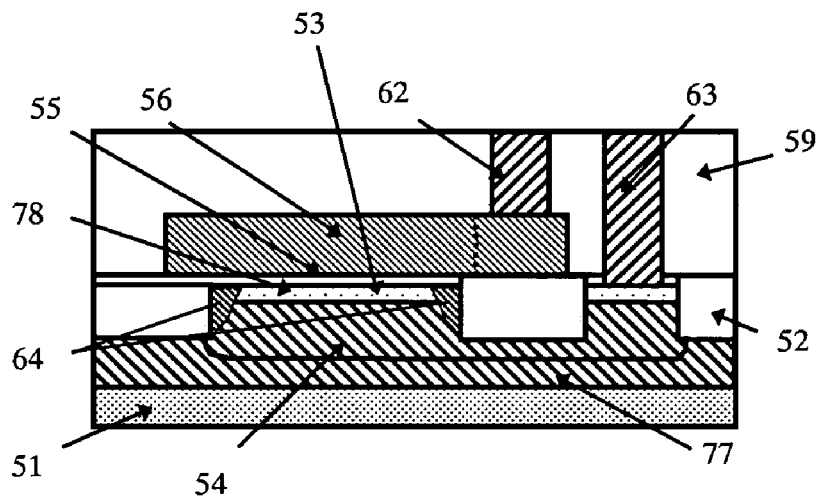
Figure 76A:
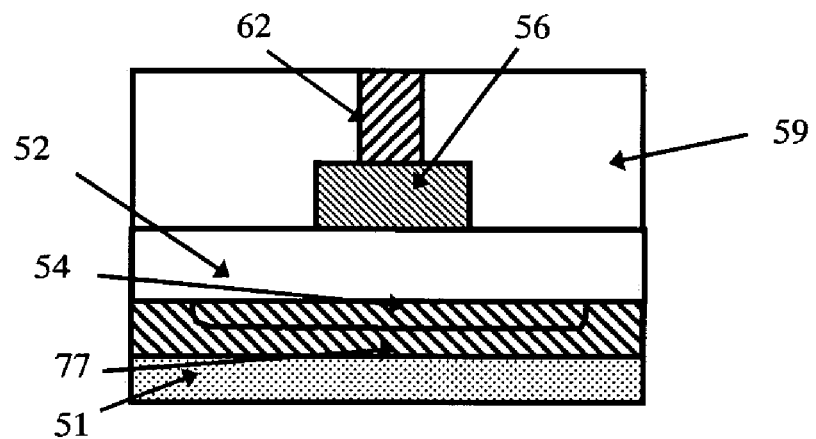
FIGS. 76A, 76B are illustrations showing the construction of the conventional strained Si-MISFET; specifically.
Figure 76B:
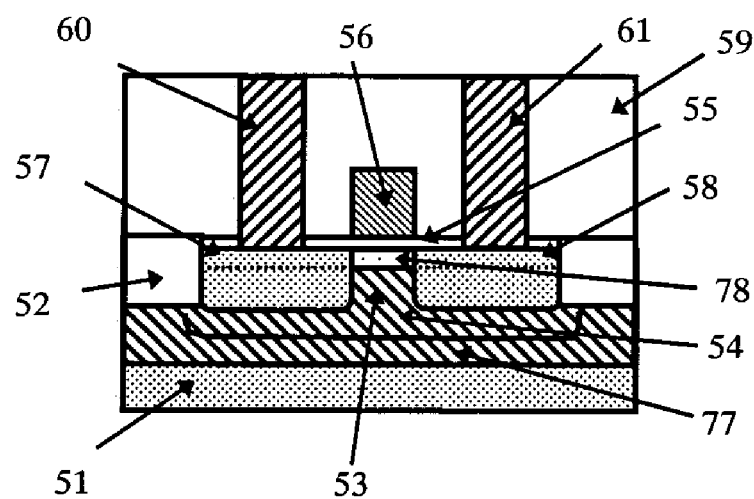

FIGS. 75A, 75B are illustrations showing the construction of a conventional strained Si-MISFET; specifically, FIG. 75A is a plan view of the conventional strained Si-MISFET and FIG. 75B is a sectional view taken on line XXXXXXXVB—XXXXXXXVB of FIG. 75A. FIGS. 76A, 76B are illustrations showing the construction of the conventional strained Si-MISFET; specifically, FIG. 76A is a sectional view taken on line XXXXXXXVIA—XXXXXXXVIA of FIG. 75A and FIG. 76B is a sectional view taken on line XXXXXXXVIB—XXXXXXXVIB of FIG. 75A.

As shown in FIGS. 75A, 75B, 76A and 76B, the strained Si-MISFET is of the same construction as the Si-MISFET except that relaxed SiGe layer 77 is formed on Si substrate 51 while strained Si layer 78 formed on relaxation SiGe layer 77 and in active region 53. Therefore, leakage current 65 flows at below-gate corner portions 64 as in the Si-MISFET.

Figure 77A:
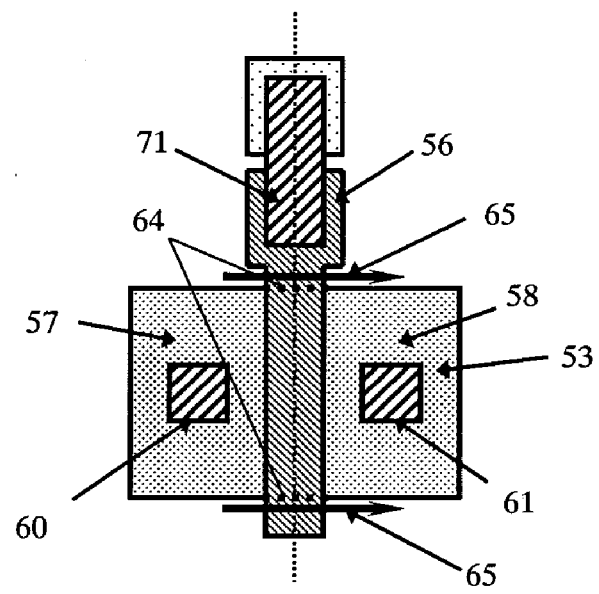
FIGS. 77A, 77B are illustrations showing the construction of a conventional strained Si-DTMISFET; specifically.
Figure 77B:
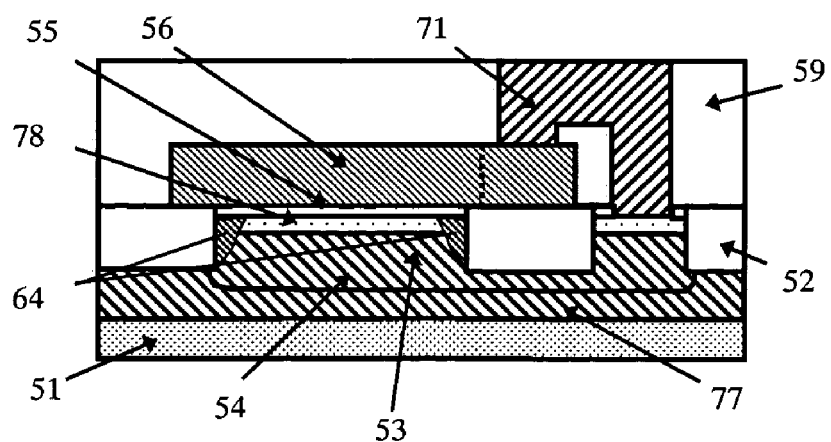

FIGS. 77A, 77b are illustrations showing the construction of a conventional strained Si-DTMISFET; specifically, FIG. 77A is a plan view of the conventional strained Si-DTMISFET and FIG. 77B is a sectional view taken on line XXXXXXXVIIB—XXXXXXXVIIB of FIG. 77A.

As shown in FIGS. 77A and 77B, the strained Si-DTMISFET is of the same construction as the strained Si-MISFET except that the gate contact and the well contact are formed integral with each other as gate-and-well contact 71. Therefore, leakage current 65 flows at below-gate corner portions 64 as in the strained Si-MISFET.

Embodiments for preventing the occurrence of the above-described leakage current will be described sequentially.

First, description will be made of embodiment 2. Embodiment 2 shows a Si-MISFET employing an edgeless structure at one widthwise end of the gate and shows a Si-DTMISFET employing an edgeless structure at one widthwise end of the gate as a variation.

Figure 21A:
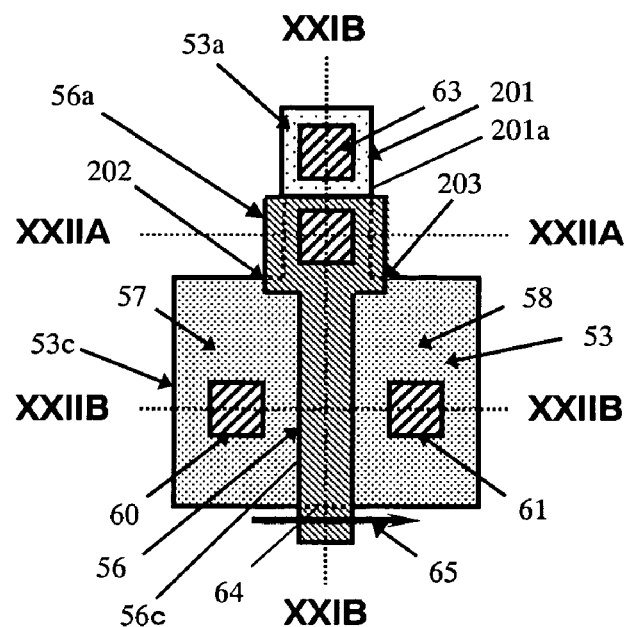
FIGS. 21A, 21B are illustrations showing the construction of a Si-MISFET according to embodiment 2 of the present invention; specifically.
Figure 21B:
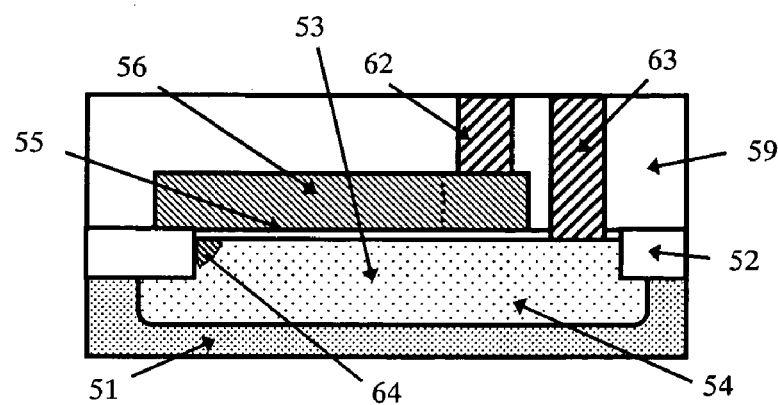
Figure 22A:
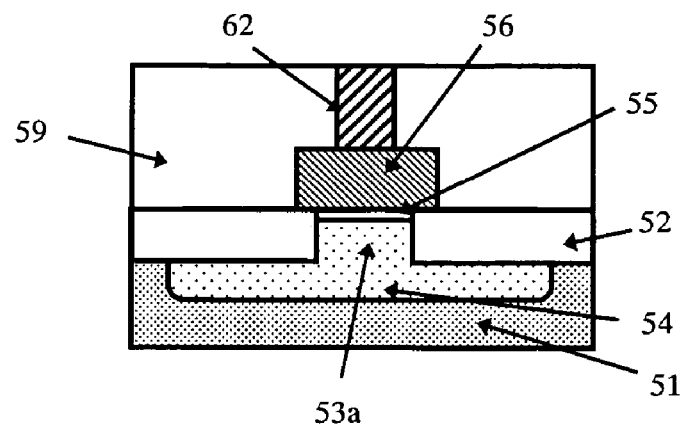
FIGS. 22A, 22B are illustrations showing the construction of the Si-MISFET according to embodiment 2 of the present invention; specifically.
Figure 22B:
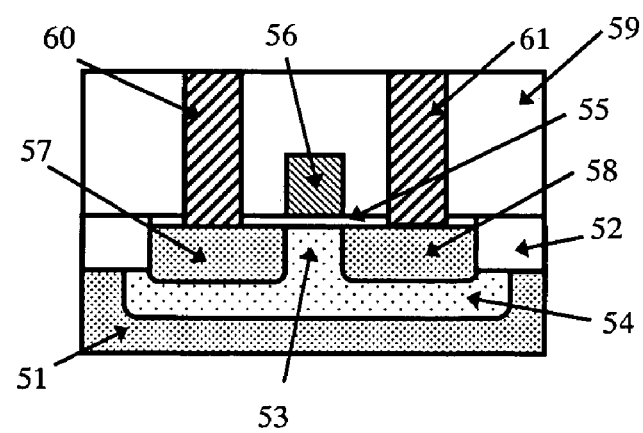

FIGS. 21A, 21B are illustrations showing the construction of the Si-MISFET according to embodiment 2 of the present invention; specifically, FIG. 21A is a plan view of the Si-MISFET and FIG. 21B is a sectional view taken on line XXIB—XXIB of FIG. 21A. FIGS. 22A, 22B are illustrations showing the construction of the Si-MISFET according to embodiment 2 of the present invention; specifically, FIG. 22A is a sectional view taken on line XXIIA—XXIIA of FIG. 21A and FIG. 22B is a sectional view taken on line XXIIB—XXIIB of FIG. 21A.

As shown in FIGS. 21A, 21B, 22A and 22B, the Si-MISFET according to embodiment 2 has Si substrate 51. Si substrate 51 is device-isolated by STI 52 and has active region 53 formed in a surface portion thereof so as to be surrounded by STI 52. Active region 53 has body portion 53c and first projecting portion 53a formed to project from a part of the periphery of body portion 53c. Here, body portion 53 is shaped rectangular in plan view. Of course, body portion 53 may have any desired plane configuration. First projecting portion 53a shown here is shaped rectangular. First projecting portion 53a may also have any desired plane configuration. On a surface of active region 53 is formed a gate insulator 55 comprising SiO₂ and gate 56 is formed on the gate insulator 55. Gate 56 is formed, in plan view, such that one widthwise end portion thereof (hereinafter will be referred to as "first end portion") 56a is located on the base portion of first projecting portion 53a of active region 53 while gate 56 extends linearly from there and other widthwise end portion thereof is located on a portion of the periphery of active region 53 which is opposite to first projecting portion 53a. Accordingly, a tip portion of first projecting portion 53a of active region 53 is not covered with gate 56. Body portion 53c of active region 53 is roughly divided into two by gate 56. Here, gate 56 comprises a portion other than first end portion 56a (hereinafter will be referred to as "body portion") which has a predetermined width equal to the gate length, and first end portion 56a having a larger width than the body portion 56b. Since gate 56 is usually made to have a gate length as short as the limit of fabrication accuracy (i.e., made to have body portion 56c narrowed in width) in order to make the device (Si-MISFET) as small as possible in size and operable at a saturation current as high as possible, first projecting portion 53a of active region 53 is wider than body portion 56c, which results in first end portion 56a of gate 56 having a larger width than body portion 56c. Therefore, gate 56 may have a constant width if the device calls for neither reduction in size nor operability at high current.

N-source region 57 and n-drain region 58 are formed in regions of body portion 53c of active region 53 on opposite sides of the gate in plan view.

P-well 54 is formed in a region of Si substrate 51 extending over active region 53 and a region downwardly continuous therewith exclusive of n-source region 57 and n-drain region 58. A portion of this p-well 54 between n-source region 57 and n-drain region 58 forms the channel region. First projecting portion 53a of active region 53 forms a part of p-well 54.

Interlayer insulator 59 is formed to cover the surface of Si substrate 51 in which STI 52, gate insulator 55 and gate 56 is formed. Gate contact 62 is formed to extend from the surface of interlayer insulator 59 to gate 56 through interlayer insulator 59, while well contact 63 formed to extend from the surface of interlayer insulator 59 to the tip portion of first projecting portion 53a of active region 53 through interlayer insulator 59 and gate insulator 55. Further, source contact 60 and drain contact 61 are formed to extend from the surface of interlayer insulator 59 to n-source region 57 and n-drain region 58, respectively, through interlayer insulator 59 and gate insulator 55. In this embodiment, gate contact 62 is formed to be connected to first end portion 56a of gate 56.

The following description is directed to a method of fabricating the Si-MISFET thus constructed according to the subject embodiment.

FIGS. 23A to 23D are sectional views illustrating, step by step, the method of fabricating the Si-MISFET according to the subject embodiment.

Figure 23A:
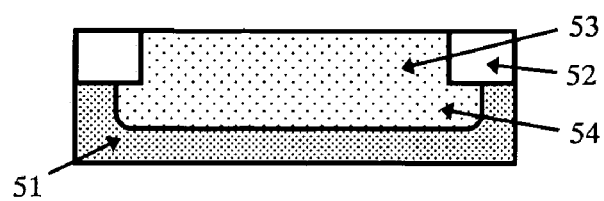
FIGS. 23A to 23D are sectional views illustrating, step by step, a method of fabricating the Si-MISFET according to embodiment 2 of the present invention.

First, at the step illustrated in FIG. 23A, STI 52 is formed at the surface of Si substrate 51. Subsequently, p-well 54 doped with a p-type impurity is formed by ion implantation. In this way, active region 53 surrounded by STI 52 is formed on Si substrate 51. At that time, active region 53 is shaped to have a plane configuration having rectangular body portion 53c and rectangular first projecting portion 53a as shown in FIG. 21A.

Figure 23B:
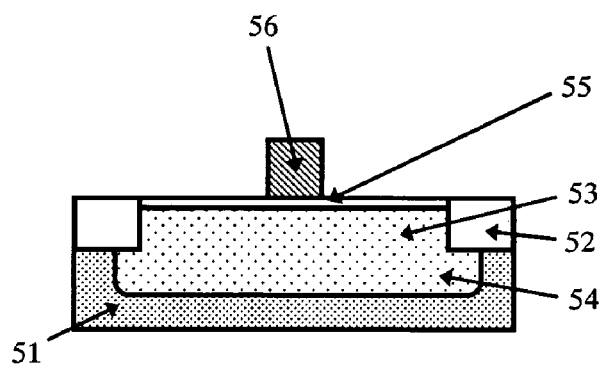

Subsequently, at the step illustrated in FIG. 23B, the surface of Si substrate 51 is oxidized to form gate insulator 55 comprising SiO₂ on the surface of active region 53. In turn, a polysilicon film is formed over the surface of Si substrate 1 by CVD and then patterned using photolithography to form gate 56 on gate insulator 55. At that time, gate 56 is shaped as shown in FIG. 21A. Specifically, gate 56 is formed, in plan view, such that first end portion 56a thereof is located on the base portion of first projecting portion 53a of active region 53 while gate 56 extends linearly from there and other widthwise end portion thereof is located on the portion of the periphery of active region 53 which is opposite to first projecting portion 53a, as shown in FIG. 21A.

Figure 23C:
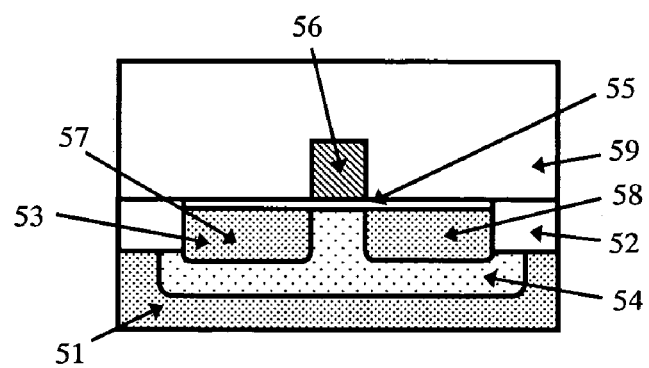

In turn, at the step illustrated in FIG. 23C, an n-type impurity is implanted into Si substrate 1 using gate 8 as a mask, thereby forming n-source region 57 and n-drain region 58 in regions of body portion 53a of active region 53 which are situated on opposite sides of gate 8 in plan view. In the formation of the regions 57 and 58, use of a predetermined mask having an opening allowing ion implantation to n-source region 57 and n-drain region 58 to be achieved can avoid ion implantation to the tip portion of first projecting portion 53 of active region (see FIG. 21A.) Thereafter, interlayer insulator 59 is formed over the surface of Si substrate 51 by CVD.

Figure 23D:
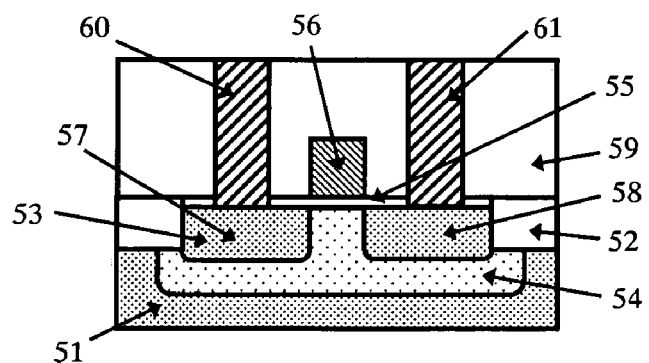

Subsequently, at the step illustrated in FIG. 23D, contact holes are formed through interlayer insulator 59 or through interlayer insulator 59 and gate insulator 55 by etching and then filled with metal to form contacts 60 to 63. Specifically, source contact 60 and drain contact 61 are formed to extend from the surface of interlayer insulator 59 to n-source region 57 and n-drain region 58, respectively, through interlayer insulator 59 and gate insulator 55. Gate contact 62 is formed to extend from the surface of interlayer insulator 59 to gate 56 through interlayer insulator, while well contact 63 formed to extend from the surface of interlayer insulator 59 to the tip portion of first projecting portion 53a of active region 53 through interlayer insulator 59 and gate insulator 55 (see FIG. 21B.)

In this way, the Si-MISFET is fabricated.

The operation and effect of the Si-MISFET thus constructed and fabricated will be described with reference to FIGS. 21A and 21B.

As described in the beginning of the description of this embodiment, leakage current 65 flows at those corner portions 64 of active region 53 which are located below gate 56. However, the Si-MISFET according to this embodiment has the feature that first projecting portion 53a is formed to project from a part of the periphery of body portion 53c of active region 53 while one widthwise end portion (first end portion) 56a of gate 56 formed to cover not the tip portion but the base portion of first projecting portion 53a. For this reason, a portion 201a not covered with gate 56 (hereinafter will be referred to as "gate-uncovered portion") exists in a portion 201 of the periphery of active region 53 (hereinafter will be referred to as "first active region periphery between source-drain") which is located between one end of a portion of the periphery of n-source region 57 (hereinafter will be referred to as "first active region peripheral end of source region") and one end of a portion of the periphery of n-drain region 58 (hereinafter will be referred to as "first active region peripheral end of drain region".) Since this gate-uncovered portion 201a is free from being applied with voltage by gate 56, the electric field concentration phenomenon will not occur at this portion. Therefore, the occurrence of leakage current flowing from the first active region peripheral end 202 of source region to the first active region peripheral end 203 of drain region along the first active region periphery 201 between source-drain, can be prevented. It should be noted that a portion of the periphery of active region 53 situated opposite to first projecting portion 53a is covered with gate 56 and hence allows leakage current 65 to flow therethrough. The Si-MISFET according to this embodiment can be realized by merely modifying the masks for the formation of active region 53 and gate 56 because the Si-MISFET according to this embodiment differs only in the shapes of active region 53 and gate 56 from the conventional one shown in FIGS. 69A, 69B.

Variation

Figure 24A:
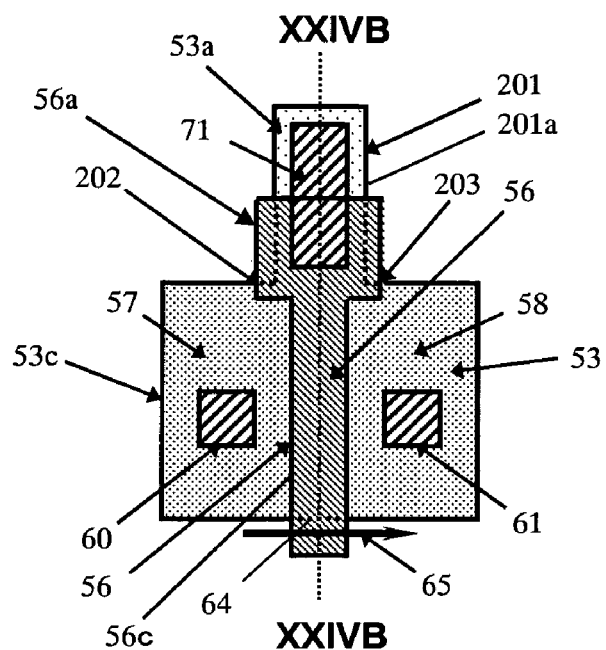
FIGS. 24A, 24B are illustrations showing the construction of a Si-DTMISFET according to a variation of embodiment 2 of the present invention; specifically.
Figure 24B:
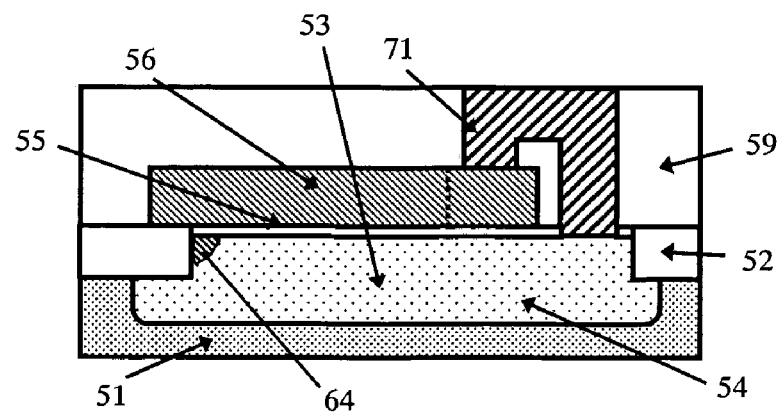

FIGS. 24A, 24b are illustrations showing the construction of a Si-DTMISFET according to a variation of the subject embodiment of the present invention; specifically, FIG. 24A is a plan view of the Si-DTMISFET and FIG. 24B is a sectional view taken on line XXIVB—XXIVB of FIG. 24A.

As shown in FIGS. 24A and 24B, the Si-DTMISFET is of the same construction as the Si-MISFET of the subject embodiment except that the gate contact and the well contact are formed integral with each other as gate-and-well contact 71. Therefore, like the Si-MISFET of the subject embodiment, the Si-DTMISFET can prevent the occurrence of leakage current flowing from first active region peripheral end 202 of source region to first active region peripheral end 203 of drain region along first active region periphery 201 between source-drain. It should be noted that a portion of the periphery of active region 53 situated opposite to first projecting portion 53a is covered with gate 56 and hence allows leakage current 65 to flow therethrough. The Si-DTMISFET according to this embodiment can be realized by merely modifying the masks for the formation of active region 53 and gate 56.

Embodiment 3

Figure 25A:
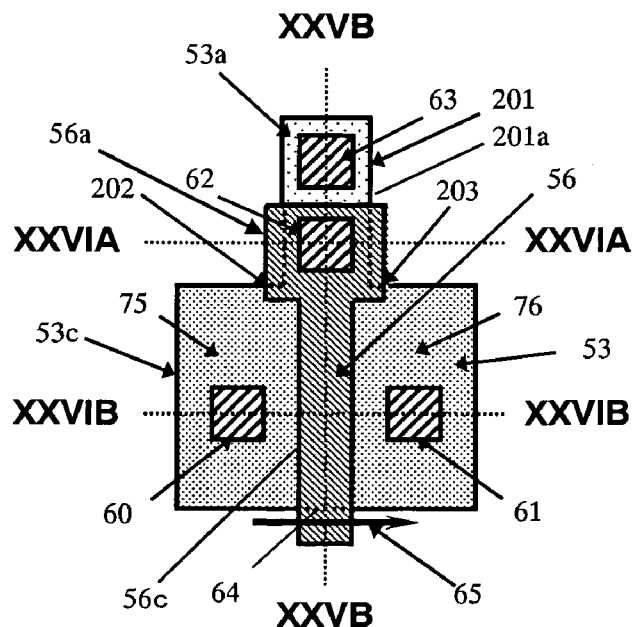
FIGS. 25A, 25B are illustrations showing the construction of a SiGe-HMISFET according to embodiment 3 of the present invention; specifically.
Figure 25B:
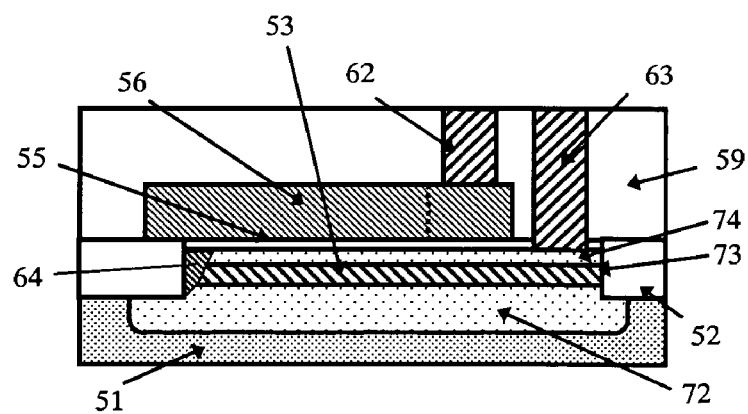
Figure 26A:
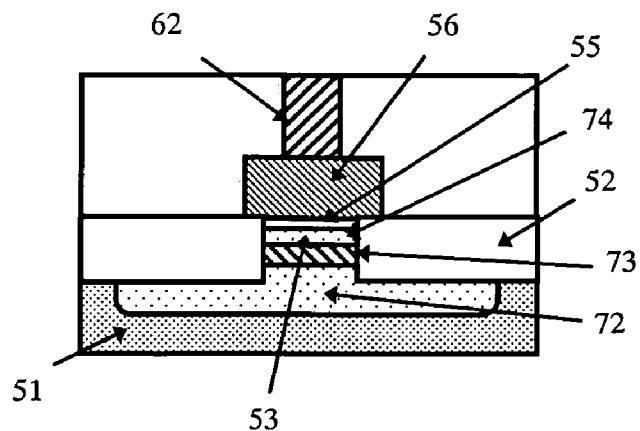
FIGS. 26A, 26B are illustrations showing the construction of the SiGe-HMISFET according to embodiment 3 of the present invention; specifically.
Figure 26B:
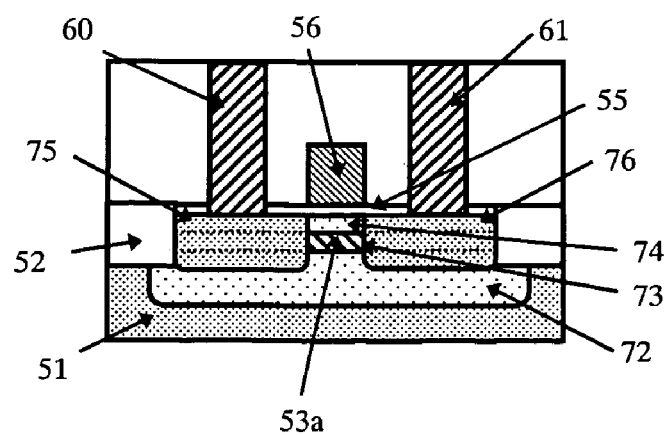

FIGS. 25A, 25B are illustrations showing the construction of a SiGe-HMISFET according to embodiment 3 of the present invention; specifically, FIG. 25A is a plan view of the SiGe-HMISFET and FIG. 25B is a sectional view taken on line XXVB—XXVB of FIG. 25A. FIGS. 26A, 26B are illustrations showing the construction of the SiGe-HMISFET according to embodiment 3 of the present invention; specifically, FIG. 26A is a sectional view taken on line XXVIA—XXVIA of FIG. 25A and FIG. 26B is a sectional view taken on line XXVIB—XXVIB of FIG. 25A. In FIGS. 25 and 26, parts identical with or equivalent to corresponding parts shown in FIGS. 21 and 22 are designated by like reference characters for the purpose of omitting the description thereof.

As shown in FIGS. 25A, 25B, 26A and 26B, the SiGe-HMISFET according to this embodiment has source region 75 and drain region 76 which are doped into p-type (hereinafter will be referred to as "p-source region" and "p-drain region", respectively), and an n-type well (hereinafter will be referred to as "n-well") 72 formed under p-source region 75 and p-drain region 76. In the channel region between p-source region 75 and p-drain region 76 of Si substrate 51 and in first projecting portion 53a of active region 53, undoped SiGe layer 73 and Si layer 74 forming heterojunction with SiGe layer 73 are layered on the n-well 72 in this sequence. Features other than described above are same as in the Si-MISFET according to embodiment 2.

The following description summarizes a method of fabricating the SiGe-HMISFET thus constructed and fabricated.

FIGS. 27A to 27E are sectional views illustrating, step by step, the method of fabricating the SiGe-HMISFET according to the subject embodiment.

Figure 27A:
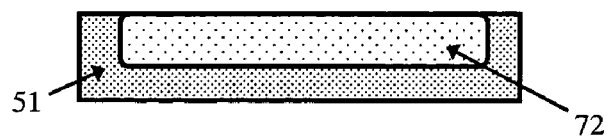
FIGS. 27A to 27E are sectional views illustrating, step by step, a method of fabricating the Si-HMISFET according to embodiment 3 of the present invention.

First, at the step illustrated in FIG. 27A, n-well 72 doped with an n-type impurity is formed in a predetermined region of Si substrate 51 by ion implantation.

Figure 27B:
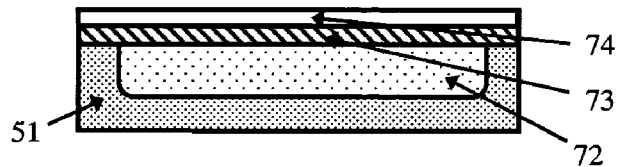

Subsequently, at the step illustrated in FIG. 27B, SiGe layer 73 and Si layer 74 are sequentially formed on Si substrate 51, in which n-well 72 is formed, by UHV-CVD.

Figure 27C:
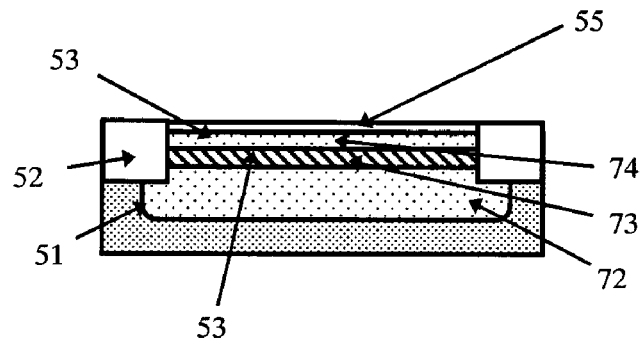

In turn, at the step illustrated in FIG. 27C, STI 52 is formed to surround an upper portion of n-well 72 and a predetermined region of SiGe layer 73 and Si layer 74, thereby defining active region 53 on Si substrate 51. At that time, active region 53 is shaped to have a plane configuration having rectangular body portion 53c and rectangular first projecting portion 53a as shown in FIG. 25A. Thereafter, the surface of Si substrate 51 is oxidized to form gate insulator 55 comprising $SiO_2$ on the surface of active region 53.

Figure 27D:
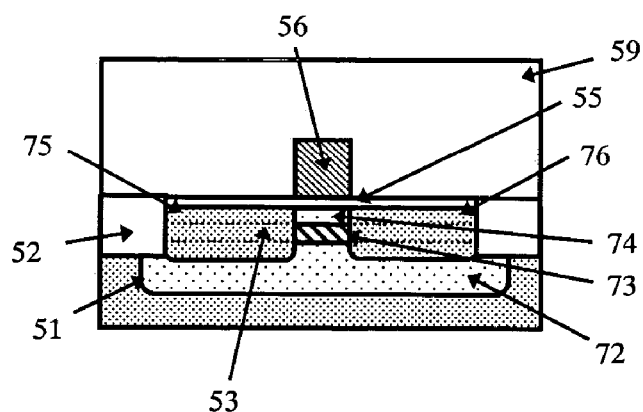

Subsequently, at the step illustrated in FIG. 27D, a polysilicon film is formed over the surface of Si substrate 1 by CVD and then patterned using photolithography to form gate 56 on gate insulator 55. At that time, gate 56 is shaped as shown in FIG. 25A. Thereafter, a p-type impurity is ion-implanted into Si substrate 1 using gate 8 as a mask, thereby forming p-source region 75 and p-drain region 76 in regions of body portion 53a of active region 53 which are situated on opposite sides of gate 8 in plan view. In the formation of the regions 75 and 76, use of a predetermined mask having an opening allowing ion implantation to p-source region 75 and p-drain region 76 to be achieved can avoid ion implantation to the tip portion of first projecting portion 53 of active region 53 (see FIG. 25A.) Thereafter, interlayer insulator 59 is formed over the surface of Si substrate 51 by CVD.

Figure 27E:
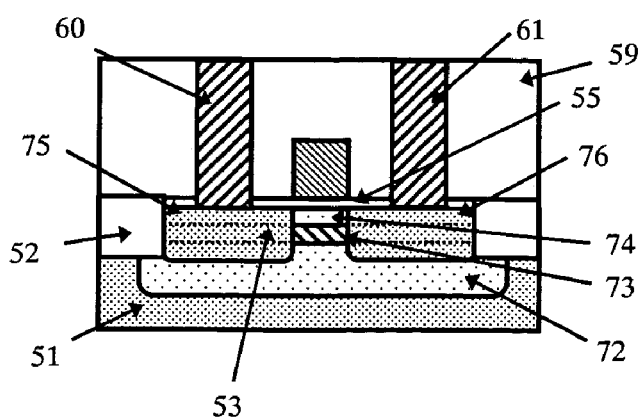

Subsequently, at the step illustrated in FIG. 27E, source contact 60, drain contact 61, gate contact 62 and well contact 63 are formed in the same manner as with the Si-MISFET (see FIG. 25B.)

In this way, the SiGe-HMISFET is fabricated.

Like the Si-MISFET according to embodiment 2, the SiGe-HMISFET thus constructed and fabricated has gate-uncovered portion 201a on first active region periphery 201 between source-drain and hence can prevent the occurrence of leakage current flowing from first active region peripheral end 202 of source region to first active region peripheral end 203 of drain region along first active region periphery 201 between source-drain. It should be noted that a portion of the periphery of active region 53 situated opposite to first projecting portion 53a is covered with gate 56 and hence allows leakage current 65 to flow therethrough. The SiGe-HMISFET according to this embodiment can be realized by merely modifying the masks for the formation of active region 53 and gate 56 because the SiGe-HMISFET according to this embodiment differs only in the shapes of active region 53 and gate 56 from the conventional one shown in FIGS. 72A, 72B.

Variation

Figure 28A:
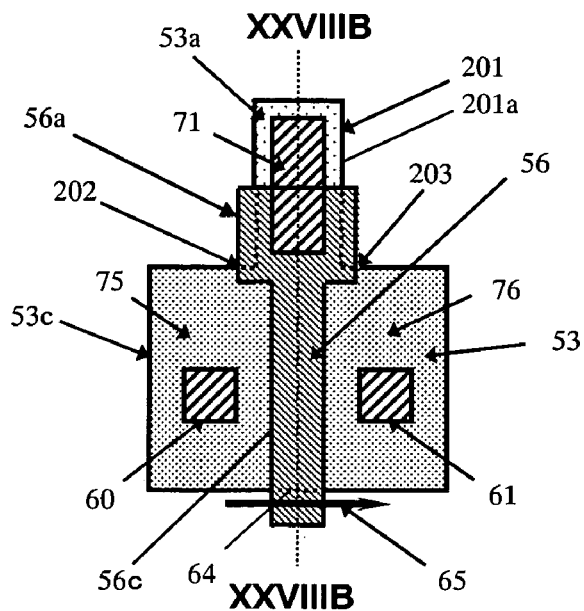
FIGS. 28A, 28B are illustrations showing the construction of a SiGe-HDTMISFET according to a variation of embodiment 3 of the present invention; specifically.
Figure 28B:
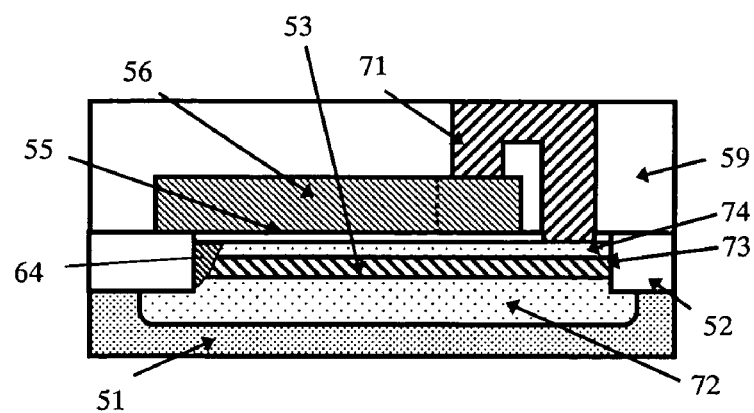

FIGS. 28A, 28B are illustrations showing the construction of a SiGe-HDTMISFET according to a variation of the subject embodiment; specifically, FIG. 28A is a plan view of the SiGe-HDTMISFET and FIG. 28B is a sectional view taken on line XXVIIIB—XXVIIIB of FIG. 28A.

As shown in FIGS. 28A and 28B, the SiGe-HDTMISFET is of the same construction as the SiGe-HMISFET of the subject embodiment except that the gate contact and the well contact are formed integral with each other as gate-and-well contact 71. Therefore, like the SiGe-HMISFET of the subject embodiment, the SiGe-HDTMISFET according to this variation can prevent the occurrence of leakage current flowing from first active region peripheral end 202 of source region to first active region peripheral end 203 of drain region along first active region periphery 201 between source-drain. It should be noted that a portion of the periphery of active region 53 situated opposite to first projecting portion 53a is covered with gate 56 and hence allows leakage current 65 to flow therethrough. The SiGe-HDTMISFET according to this embodiment can be realized by merely modifying the masks for the formation of active region 53 and gate 56.

Embodiment 4

Figure 29A:
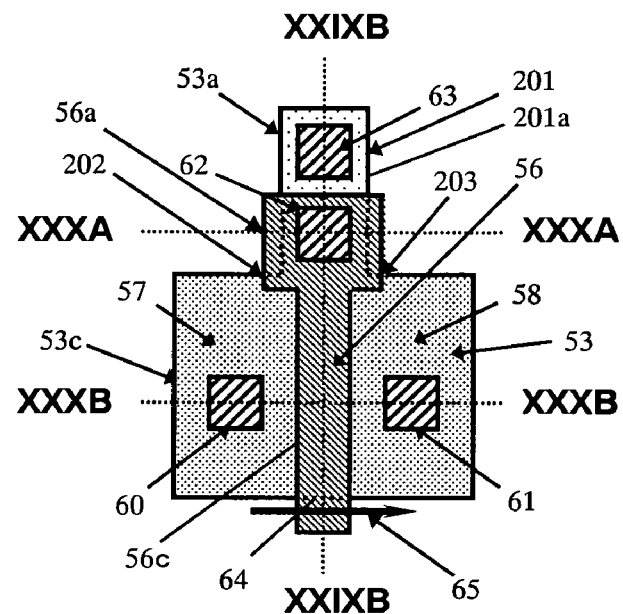
FIGS. 29A, 29B are illustrations showing the construction of a strained Si-MISFET according to embodiment 4 of the present invention; specifically.
Figure 29B:
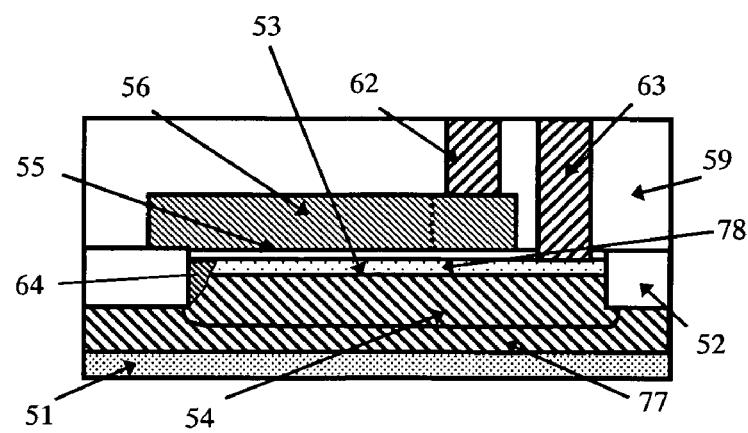
Figure 30A:
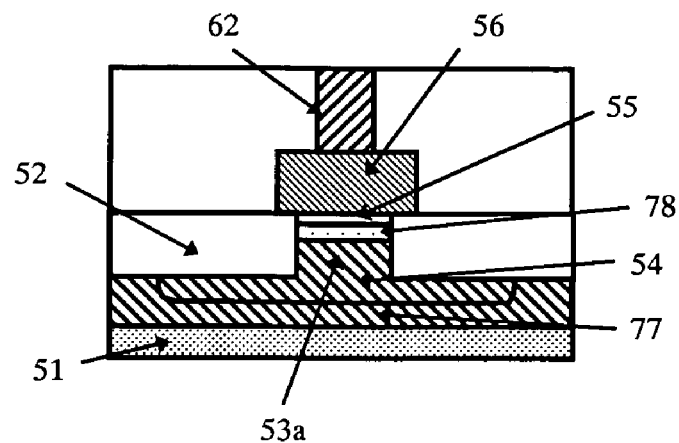
FIGS. 30A, 30B are illustrations showing the construction of the strained Si-MISFET according to embodiment 4 of the present invention; specifically.
Figure 30B:
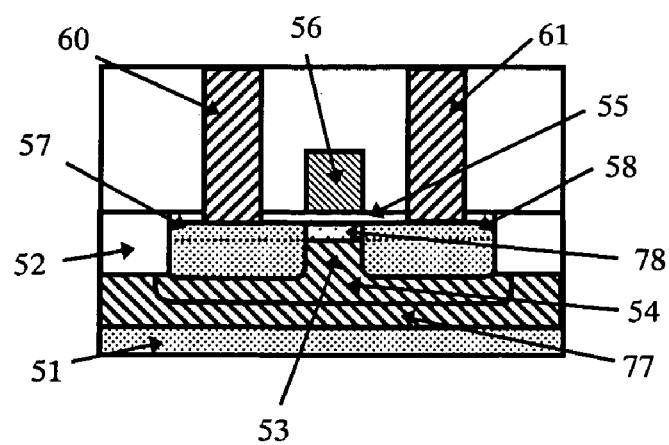

FIGS. 29A, 29B are illustrations showing the construction of a strained Si-MISFET according to embodiment 4 of the present invention; specifically, FIG. 29A is a plan view of the stained Si-MISFET and FIG. 29B is a sectional view taken on line XXIXB-XXIXIB of FIG. 29A. FIGS. 30A, 30B are illustrations showing the construction of the strained Si-MISFET according to embodiment 4 of the present invention; specifically, FIG. 30A is a sectional view taken on line XXXA—XXXA of FIG. 29A and FIG. 30B is a sectional view taken on line XXXB—XXXB of FIG. 29A. In FIGS. 29 and 30, parts identical with or equivalent to corresponding parts shown in FIGS. 21 and 22 are designated by like reference characters for the purpose of omitting the description thereof.

As shown in FIGS. 29A, 29B, 30A and 30B, the strained Si-MISFET according to this embodiment has relaxed SiGe layer 77 formed on Si substrate 51 and strained Si layer 78 formed on relaxed SiGe layer 77. STI 52 is formed to surround an upper portion of relaxed SiGe layer and strained Si layer 78 to define active region 53. As in the Si-MISFET, n-source region 57 and n-drain region 58 are formed in active region 53. P-well 54 is formed in a portion of relaxed SiGe layer 77 situated in a region of Si substrate 51 extending over active region 53 and a region downwardly continuous therewith exclusive of n-source region 57 and n-drain region 58. An upper portion of this p-well 54 and undoped strained Si layer 78 form the channel region between n-source region 57 and n-drain region 58 and the first projecting portion 53a of active region 53. Features other than described above are same as in the Si-MISFET according to embodiment 2.

The following description is directed to a method of fabricating the strained Si-MISFET thus constructed and fabricated.

FIGS. 31A to 31D are sectional views illustrating, step by step, the method of fabricating the strained Si-MISFET according to the subject embodiment.

Figure 31A:
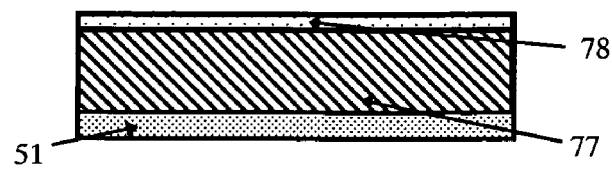
FIGS. 31A to 31D are sectional views illustrating, step by step, a method of fabricating the strained Si-MISFET according to embodiment 4 of the present invention.

First, at the step illustrated in FIG. 31A, relaxed SiGe layer 77 and strained Si layer 78 are sequentially deposited on Si substrate 51 by CVD.

Figure 31B:
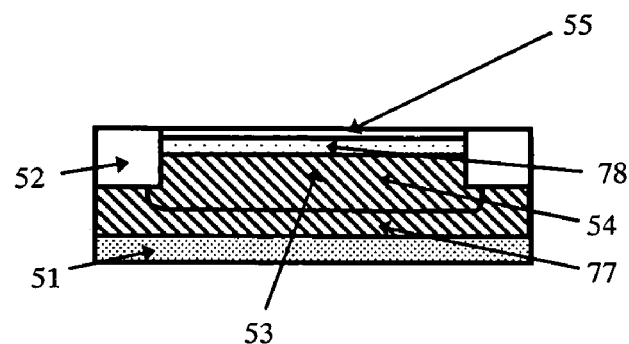

Subsequently, at the step illustrated in FIG. 31B, STI 52 is formed to surround a predetermined region of strained Si layer 78. In turn, p-well 54 doped with a p-type impurity is formed by ion implantation. In this way, active region 53 is defined on Si substrate 51. At that time, active region 53 is shaped to have a plane configuration having rectangular body portion 53c and rectangular first projecting portion 53a as shown in FIG. 29A. Thereafter, the surface of Si substrate 51 is oxidized to form gate insulator 55 comprising $SiO_2$ on the surface of active region 53.

Figure 31C:
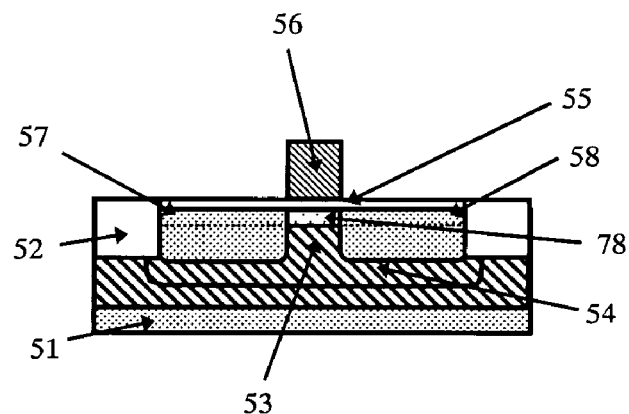

In turn, at the step illustrated in FIG. 31C, a polysilicon film is formed over the surface of Si substrate 51 by CVD and then patterned using photolithography to form gate 56 on gate insulator 55. At that time, gate 56 is shaped as shown in FIG. 29A. Thereafter, an n-type impurity is ion-implanted into Si substrate 1 using gate 8 as a mask, thereby forming n-source region 57 and n-drain region 58 in regions of body portion 53c of active region 53 which are situated on opposite sides of gate 56 in plan view. In the formation of the regions 57 and 58, use of a predetermined mask having an opening allowing ion implantation to n-source region 57 and n-drain region 58 to be achieved can avoid ion implantation to the tip portion of first projecting portion 53a of active region 53 (see FIG. 29A.)

Figure 31D:
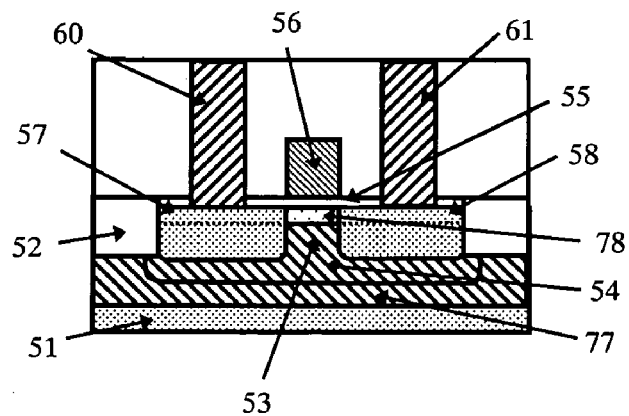

Subsequently, at the step illustrated in FIG. 31D, interlayer insulator 59 is formed over the surface of Si substrate

51 by CVD. Thereafter, source contact 60, drain contact 61, gate contact 62 and well contact 63 are formed as in the Si-MISFET (see FIG. 29B.)

In this way, the strained Si-MISFET is fabricated.

Like the Si-MISFET according to embodiment 2, the strained Si-MISFET thus constructed and fabricated has gate-uncovered portion 201a on first active region periphery 201 between source-drain and hence can prevent the occurrence of leakage current flowing from first active region peripheral end 202 of source region to first active region peripheral end 203 of drain region along first active region periphery 201 between source-drain. It should be noted that a portion of the periphery of active region 53 situated opposite to first projecting portion 53a is covered with gate 56 and hence allows leakage current 65 to flow therethrough. The strained Si-MISFET according to this embodiment can be realized by merely modifying the masks for the formation of active region 53 and gate 56 because the strained Si-MISFET according to this embodiment differs only in the shapes of active region 53 and gate 56 from the conventional one shown in FIGS. 75A, 75B.

Variation

Figure 32A:
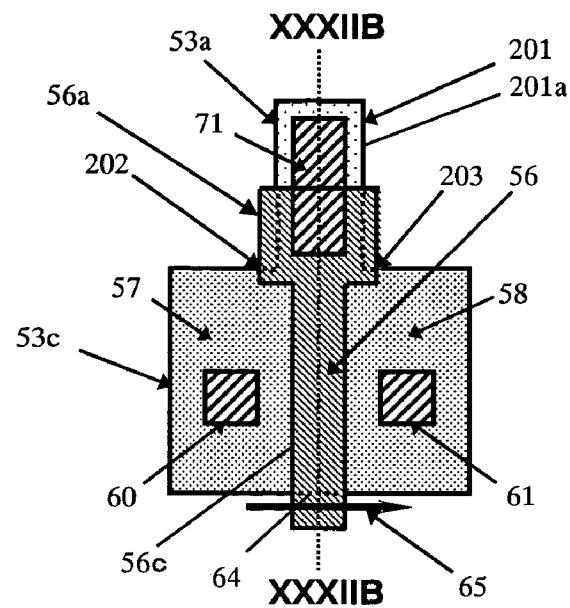
FIGS. 32A, 32B are illustrations showing the construction of a strained Si-DTMISFET according to a variation of embodiment 4 of the present invention; specifically.
Figure 32B:
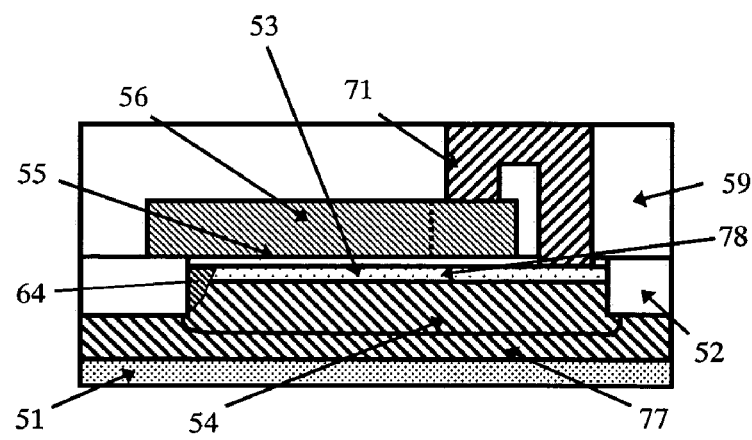

FIGS. 32A, 32B are illustrations showing the construction of a strained Si-DTMISFET according to a variation of the subject embodiment; specifically, FIG. 32A is a plan view of the strained Si-DTMISFET and FIG. 32B is a sectional view taken on line XXXIIB—XXXIIB of FIG. 32A.

As shown in FIGS. 32A and 32B, the strained Si-DTMISFET according to this variation is of the same construction as the strained Si-MISFET of the subject embodiment except that the gate contact and the well contact are formed integral with each other as gate-and-well contact 71. Therefore, like the strained Si-MISFET of the subject embodiment, the strained Si-DTMISFET according to this variation can prevent the occurrence of leakage current flowing from first active region peripheral end 202 of source region to first active region peripheral end 203 of drain region along first active region periphery 201 between source-drain. It should be noted that a portion of the periphery of active region 53 situated opposite to first projecting portion 53a is covered with gate 56 and hence allows leakage current 65 to flow therethrough. The strained Si-DTMISFET according to this embodiment can be realized by merely modifying the masks for the formation of active region 53 and gate 56.

Embodiment 5

Figure 33A:
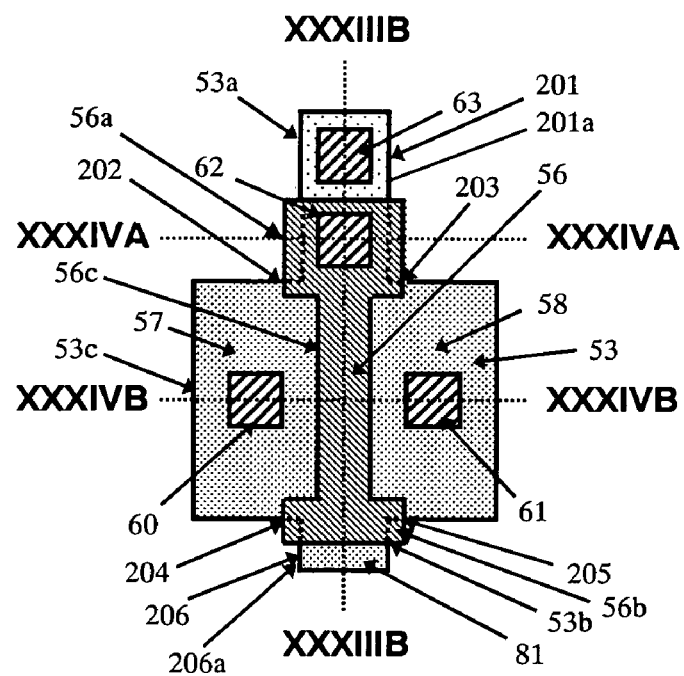
FIGS. 33A, 33B are illustrations showing the construction of a Si-MISFET according to embodiment 5 of the present invention; specifically.
Figure 33B:
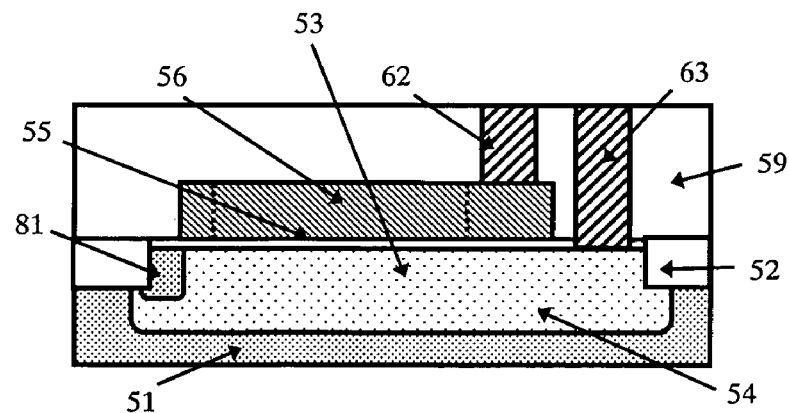
Figure 34A:
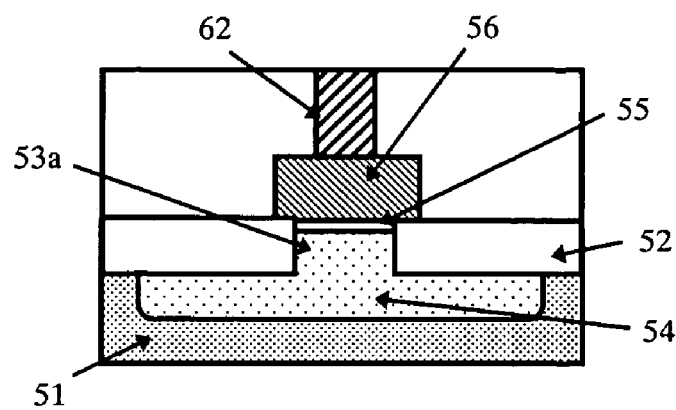
FIGS. 34A, 34B are illustrations showing the construction of the Si-MISFET according to embodiment 5 of the present invention; specifically.
Figure 34B:
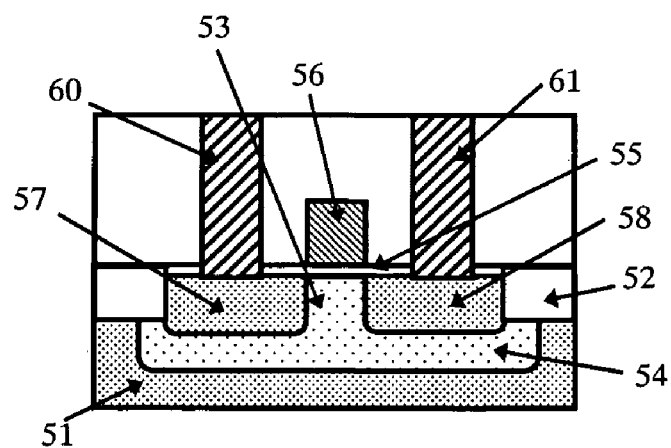

FIGS. 33A, 33B are illustrations showing the construction of a Si-MISFET according to embodiment 5 of the present invention; specifically, FIG. 33A is a plan view of the Si-MISFET and FIG. 33B is a sectional view taken on line XXXIIIB—XXXIIIB of FIG. 33A. FIGS. 34A, 34B are illustrations showing the construction of the Si-MISFET according to embodiment 5 of the present invention; specifically, FIG. 34A is a sectional view taken on line XXXIVA—XXXIVA of FIG. 33A and FIG. 34B is a sectional view taken on line XXXIVB—XXXIVB of FIG. 33A. In FIGS. 33 and 34, parts identical with or equivalent to corresponding parts shown in FIGS. 21 and 22 are designated by like reference characters for the purpose of omitting the description thereof.

As shown in FIGS. 33A, 33B, 34A and 34B, active region 53 of the Si-MISFET according to this embodiment includes body region 53c provided with second projecting portion 53b in addition to first projecting portion 53a. Second projecting portion 53a has a rectangular plane configuration and is located opposite to first projecting portion 53a on the periphery of body portion 53c. Gate 56 is formed such that linear body portion 56c having a predetermined width has first end portion 56a wider than body portion 56c at one end thereof and second end portion 56b wider than body portion 56c at the other end thereof. First end portion 56a of gate 56 covers the base portion of first projecting portion 53a of active region 53, while second end portion 56b covers the base portion of second projecting portion 53b of active region 53. Tip portion 81 of second projecting portion 53c, which is not covered with first end portion 56a of gate 56, is doped into n-type (hereinafter will be referred to as "n-type region") as are n-source region 57 and n-drain region 58. Tip portion 81 of second projecting portion 53c is isolated from both of n-source region 57 and n-drain region 58 and hence need not be electrically insulated from each of the regions 57 and 58. For this reason, tip portion 81 may have any conductivity type and hence need not necessarily be masked against ion implantation for forming n-source region 57 and n-drain region 58. Features other than described above are same as in the Si-MISFET according to embodiment 2.

Like the Si-MISFET according to embodiment 2, the Si-MISFET according to this embodiment can prevent the occurrence of leakage current flowing from first active region peripheral end 202 of source region to first active region peripheral end 203 of drain region along first active region periphery 201 between source-drain.

Further, in the Si-MISFET according to this embodiment, second projecting portion 53b is formed on the periphery of body portion 53c of active region 53 while second end portion 56b of gate 56 formed to cover not the tip portion but the base portion of second projecting portion 53b. For this reason, a gate-uncovered portion 206a exists in a portion 206 of the periphery of active region 53 (hereinafter will be referred to as "second active region periphery between source-drain") between other end 204 of the portion forming the periphery of n-source region 57 (hereinafter will be referred to as "second active region peripheral end of source region") and other end 205 of the portion forming the periphery of n-drain region 58 (hereinafter will be referred to as "second active region peripheral end of drain region".) Since this gate-uncovered portion 206a is free from being applied with voltage by gate 56, the electric field concentration phenomenon will not occur at this portion. Therefore, the occurrence of leakage current flowing from second active region peripheral end 204 of source region to second active region peripheral end 205 of drain region along second active region periphery 206 between source-drain, can be prevented.

In brief, the Si-MISFET according to the subject embodiment can prevent the occurrence of leakage current essential to the peripheral portion of active region 53.

As in embodiment 2, the Si-MISFET according to this embodiment can be realized by merely modifying the masks for the formation of active region 53 and gate 56.

Variation

Figure 35A:
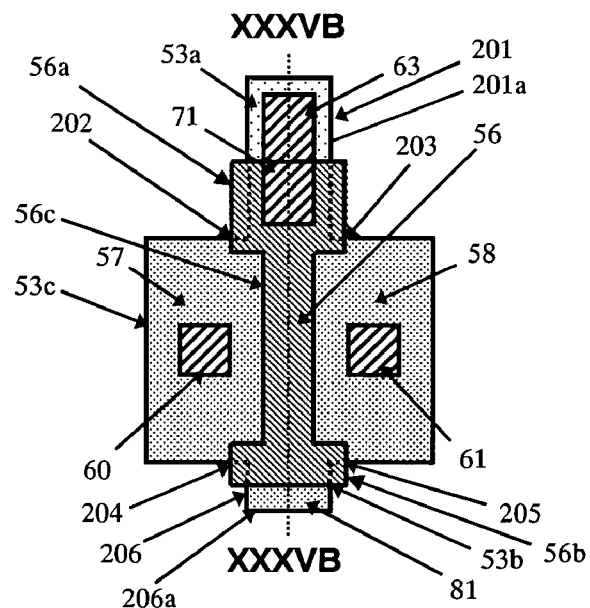
FIGS. 35A, 35B are illustrations showing the construction of a Si-DTMISFET according to a variation of embodiment 5 of the present invention; specifically.
Figure 35B:
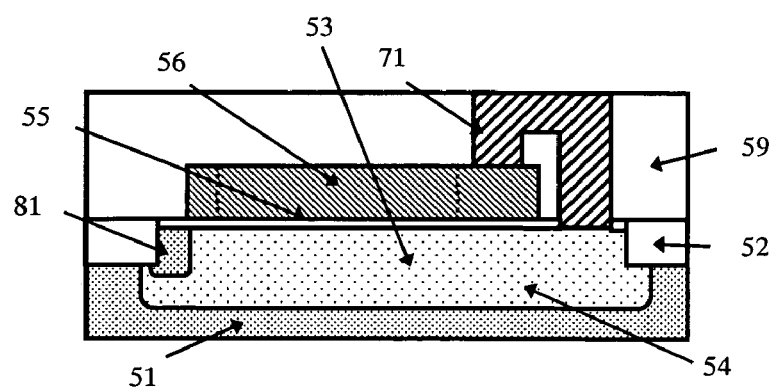

FIGS. 35A, 35B are illustrations showing the construction of a Si-DTMISFET according to a variation of the subject embodiment; specifically, FIG. 35A is a plan view of the Si-DTMISFET and FIG. 35B is a sectional view taken on line XXVB—XXVB of FIG. 35A.

As shown in FIGS. 35A and 35B, the Si-DTMISFET according to this variation is of the same construction as the Si-MISFET of the subject embodiment except that the gate contact and the well contact are formed integral with each other as gate-and-well contact 71. Therefore, like the Si-MISFET of the subject embodiment, the Si-DTMISFET according to this variation can prevent the occurrence of leakage current essential to the peripheral portion of active region 53. Further, the Si-DTMISFET according to this embodiment can be realized by merely modifying the masks for the formation of active region 53 and gate 56.

Embodiment 6

Figure 36A:
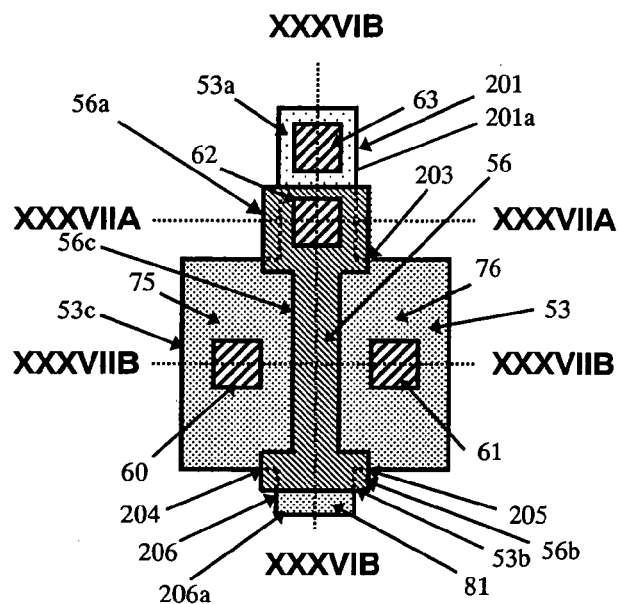
FIGS. 36A, 36B are illustrations showing the construction of a SiGe-HMISFET according to embodiment 6 of the present invention; specifically.
Figure 36B:
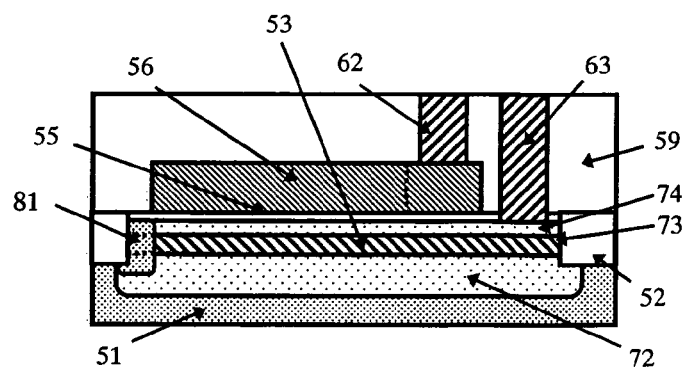
Figure 37A:
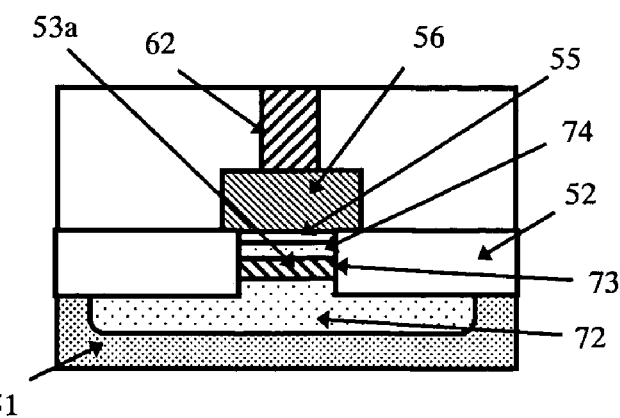
FIGS. 37A, 37B are illustrations showing the construction of the SiGe-HMISFET according to embodiment 6 of the present invention; specifically.
Figure 37B:
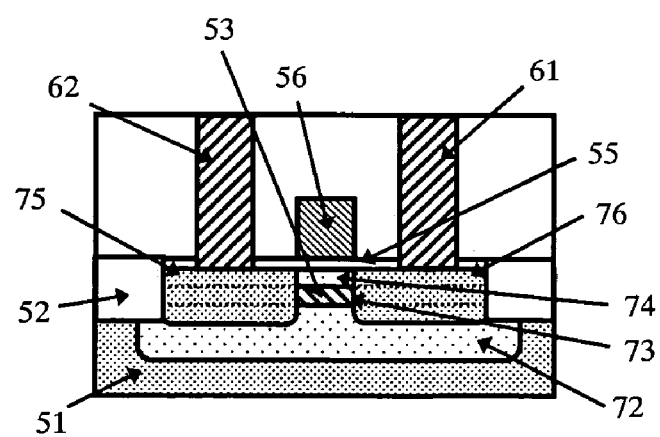

FIGS. 36A, 36B are illustrations showing the construction of a SiGe-HMISFET according to embodiment 6 of the present invention; specifically, FIG. 36A is a plan view of the SiGe-HMISFET and FIG. 36B is a sectional view taken on line XXXVIB—XXXVIB of FIG. 36A. FIGS. 37A, 37B are illustrations showing the construction of the SiGe-HMISFET according to embodiment 6 of the present invention; specifically, FIG. 37A is a sectional view taken on line XXXVIIA—XXXVIIA of FIG. 36A and FIG. 37B is a sectional view taken on line XXXVIIB—XXXVIIB of FIG. 36A. In FIGS. 36 and 37, parts identical with or equivalent to corresponding parts shown in FIGS. 25, 26, 33 and 34 are designated by like reference characters for the purpose of omitting the description thereof.

As shown in FIGS. 36A, 36B, 37A and 37B, like the Si-MISFET according to embodiment 5, the SiGe-MISFET according to this embodiment is provided with second projecting portion 53b on the periphery of body portion 53c of active region 53 in the construction of the SiGe-HMISFET of embodiment 3, wherein second end portion 56b of gate 56 covers not the tip portion but the base portion of second projecting portion 53b. Therefore, gate-uncovered portion 206a exists on second active region periphery 206 between source-drain and, hence, it is possible to prevent the occurrence of leakage current flowing from second active region peripheral end 204 of source region to second active region peripheral end 205 of drain region along second active region periphery 206 between source-drain. Thus, the SiGe-HMISFET according to the subject embodiment can prevent the occurrence of leakage current essential to the peripheral portion of active region 53.

As in embodiment 3, the SiGe-HMISFET according to this embodiment can be realized by merely modifying the masks for the formation of active region 53 and gate 56.

Variation

Figure 38A:
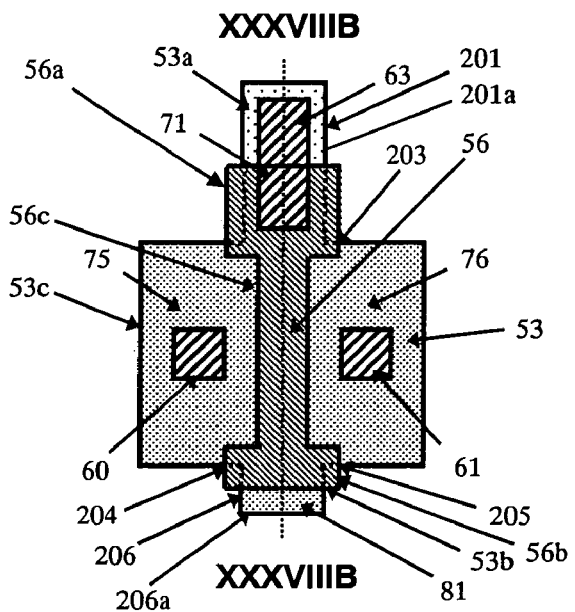
FIGS. 38A, 38B are illustrations showing the construction of a SiGe-HDTMISFET according to a variation of embodiment 6 of the present invention; specifically.
Figure 38B:
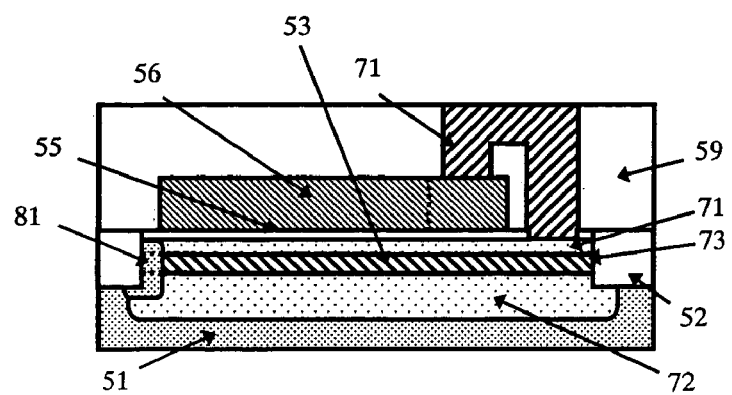

FIGS. 38A, 38B are illustrations showing the construction of a SiGe-HDTMISFET according to a variation of the subject embodiment; specifically, FIG. 38A is a plan view of the SiGe-HDTMISFET and FIG. 38B is a sectional view taken on line XXXVIIIB—XXXVIIIB of FIG. 38A.

As shown in FIGS. 38A and 38B, the SiGe-HDTMISFET according to this variation is of the same construction as the Si-MISFET of the subject embodiment except that the gate contact and the well contact are formed integral with each other as gate-and-well contact 71. Therefore, like the SiGe-HMISFET of the subject embodiment, the SiGe-HDTMISFET according to this variation can prevent the occurrence of leakage current essential to the peripheral portion of active region 53. Further, the SiGe-HDTMISFET according to this embodiment can be realized by merely modifying the masks for the formation of active region 53 and gate 56.

Embodiment 7

Figure 39A:
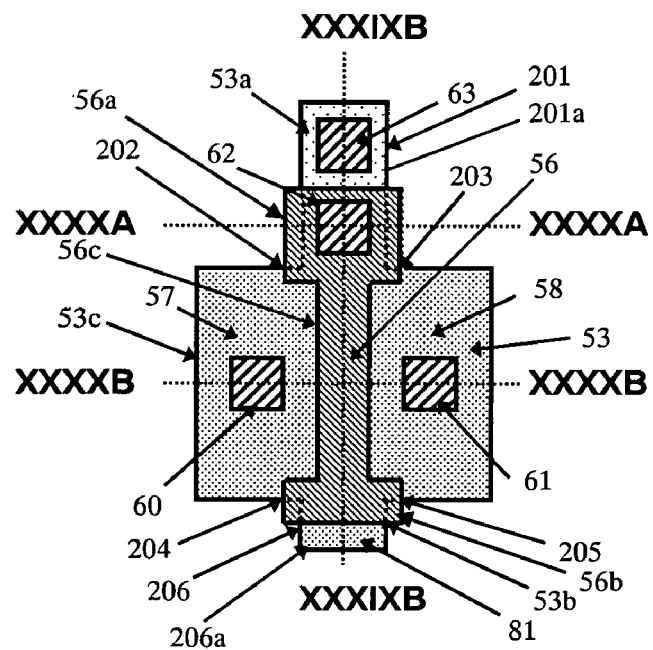
FIGS. 39A, 39B are illustrations showing the construction of a strained Si-MISFET according to embodiment 7 of the present invention; specifically.
Figure 39B:
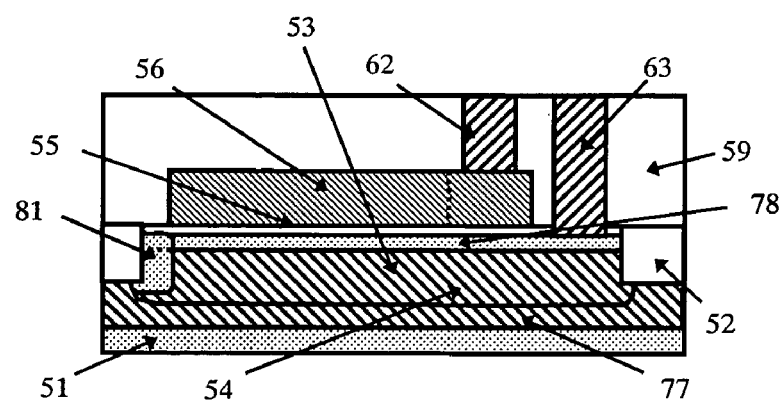
Figure 40A:
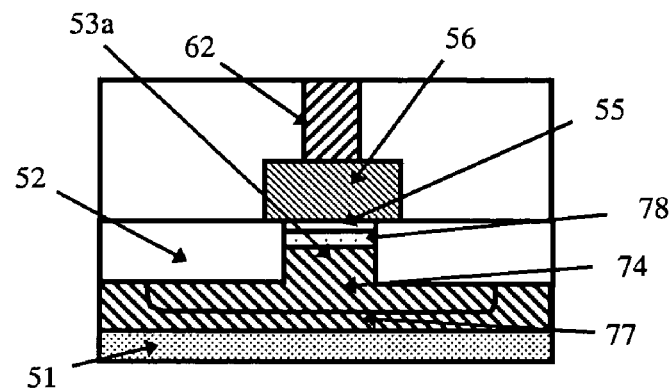
FIGS. 40A, 40B are illustrations showing the construction of the strained Si-MISFET according to embodiment 7 of the present invention; specifically.
Figure 40B:
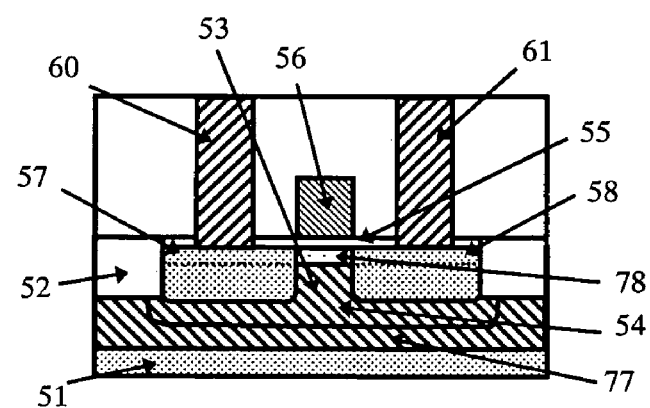

FIGS. 39A, 39B are illustrations showing the construction of a strained Si-MISFET according to embodiment 7 of the present invention; specifically, FIG. 39A is a plan view of the strained Si-MISFET and FIG. 39B is a sectional view taken on line XXXIXB—XXXIXB of FIG. 39A. FIGS. 40A, 40B are illustrations showing the construction of the strained Si-MISFET according to embodiment 7 of the present invention; specifically, FIG. 40A is a sectional view taken on line XXXXA—XXXXA of FIG. 39A and FIG. 40B is a sectional view taken on line XXXXB—XXXXB of FIG. 39A. In FIGS. 39 and 40, parts identical with or equivalent to corresponding parts shown in FIGS. 29, 30, 33 and 34 are designated by like reference characters for the purpose of omitting the description thereof.

As shown in FIGS. 39A, 39B, 40A and 40B, like the Si-MISFET according to embodiment 5, the strained Si-MISFET according to this embodiment is provided with second projecting portion 53b on the periphery of body portion 53c of active region 53 in the construction of the strained Si-MISFET of embodiment 4, wherein second end portion 56b of gate 56 covers not the tip portion but the base portion of second projecting portion 53b. Therefore, gate-uncovered portion 206a exists on second active region periphery 206 between source-drain and, hence, it is possible to prevent the occurrence of leakage current flowing from second active region peripheral end 204 of source region to second active region peripheral end 205 of drain region along second active region periphery 206 between source-drain. Thus, the strained Si-MISFET according to the subject embodiment can prevent the occurrence of leakage current essential to the peripheral portion of active region 53.

As in embodiment 4, the strained Si-MISFET according to this embodiment can be realized by merely modifying the masks for the formation of active region 53 and gate 56.

Variation

Figure 41A:
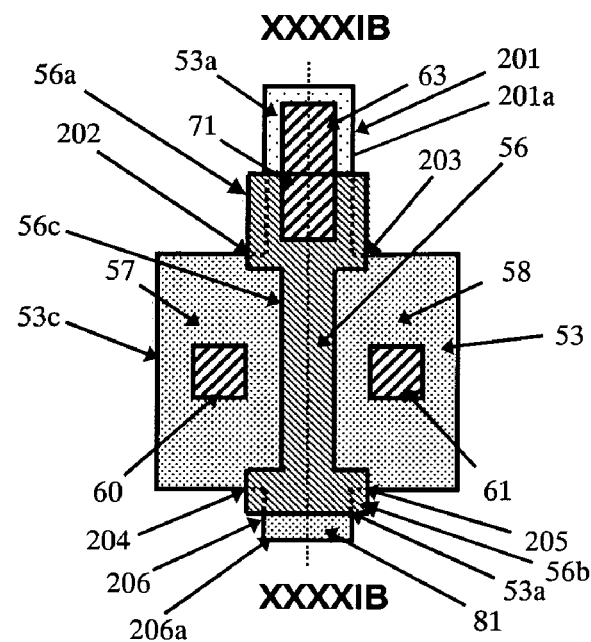
FIGS. 41A, 41B are illustrations showing the construction of a strained Si-DTMISFET according to a variation of embodiment 7 of the present invention; specifically.
Figure 41B:
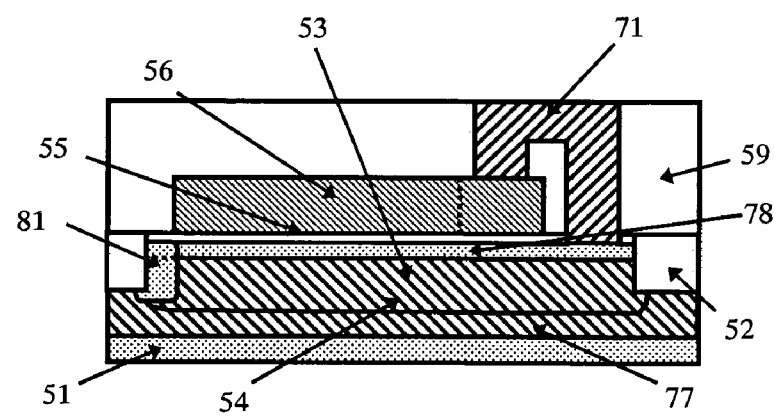

FIGS. 41A, 41B are illustrations showing the construction of a strained Si-DTMISFET according to a variation of the subject embodiment; specifically, FIG. 41A is a plan view of the strained Si-DTMISFET and FIG. 41B is a sectional view taken on line XXXXIB—XXXXIB of FIG. 41A.

As shown in FIGS. 41A and 41B, the strained Si-DTMISFET according to this variation is of the same construction as the strained Si-MISFET of the subject embodiment except that the gate contact and the well contact are formed integral with each other as gate-and-well contact 71. Therefore, like the strained Si-MISFET of the subject embodiment, the strained Si-DTMISFET according to this variation can prevent the occurrence of leakage current essential to the peripheral portion of active region 53. Further, the strained Si-DTMISFET according to this embodiment can be realized by merely modifying the masks for the formation of active region 53 and gate 56.

Embodiment 8

Figure 42A:
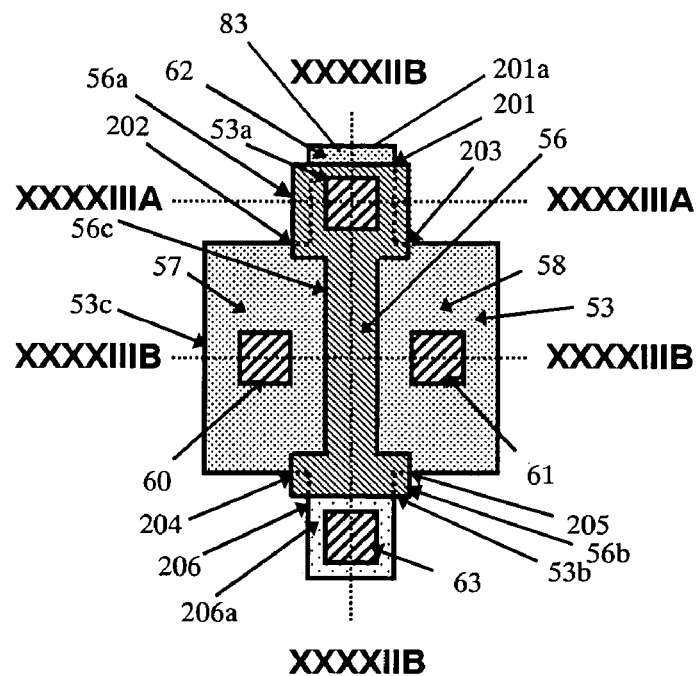
FIGS. 42A, 42B are illustrations showing the construction of a Si-MISFET according to embodiment 8 of the present invention; specifically.
Figure 42B:
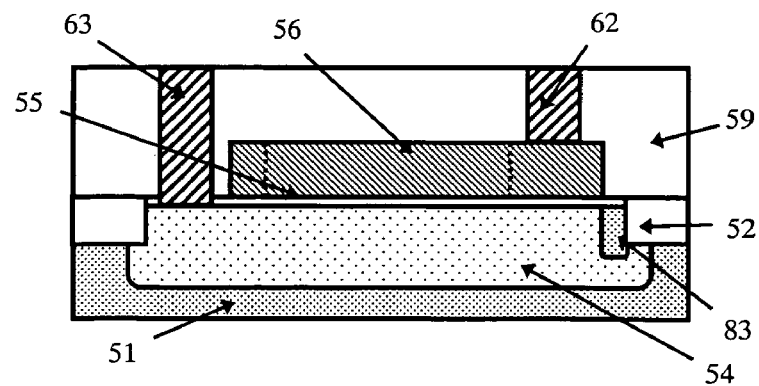
Figure 43A:
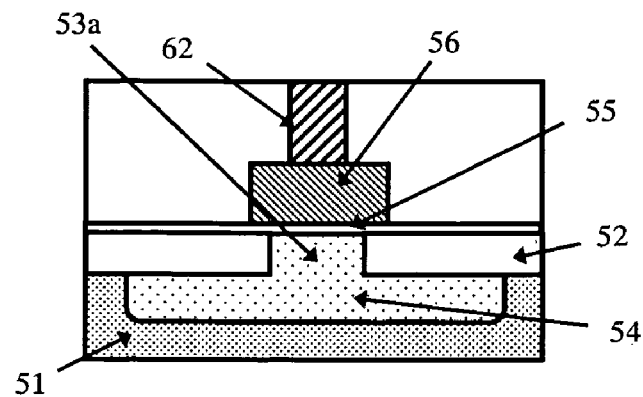
FIGS. 43A, 43B are illustrations showing the construction of the Si-MISFET according to embodiment 8 of the present invention; specifically.
Figure 43B:
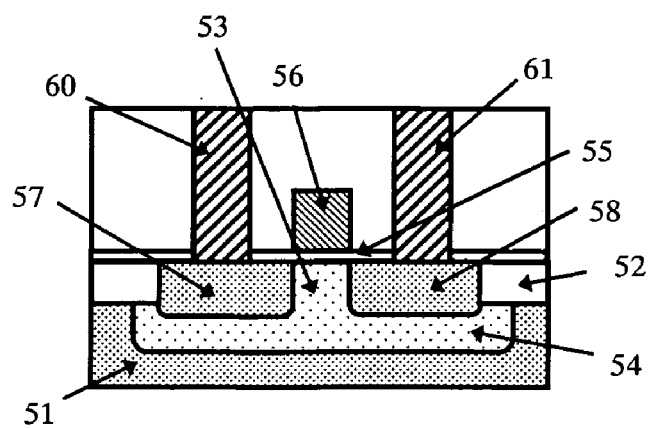

FIGS. 42A, 42B are illustrations showing the construction of a Si-MISFET according to embodiment 8 of the present invention; specifically, FIG. 42A is a plan view of the Si-MISFET and FIG. 42B is a sectional view taken on line XXXXIIB—XXXXIIB of FIG. 42A. FIGS. 43A, 43B are illustrations showing the construction of the Si-MISFET according to embodiment 8 of the present invention; specifically, FIG. 43A is a sectional view taken on line XXXXIIIA—XXXXIIIA of FIG. 42A and FIG. 43B is a sectional view taken on line XXXXIIIB—XXXXIIIB of FIG. 42A. In FIGS. 42 and 43, parts identical with or equivalent to corresponding parts shown in FIGS. 33 and 34 are designated by like reference characters for the purpose of omitting the description thereof.

As shown in FIGS. 42A, 42B, 43A and 43B, the Si-MISFET according to this embodiment has a well contact 63 formed to be connected to the tip portion of second projecting portion 53b of active region 53 and an n-type region 83 formed in the tip portion of first projecting portion 53a of active region 53 in the construction of the Si-MISFET of embodiment 5.

In such a construction, well contact 63 is located apart from gate contact 62, which allows the degree of freedom of wiring to be improved.

Variation

Figure 44A:
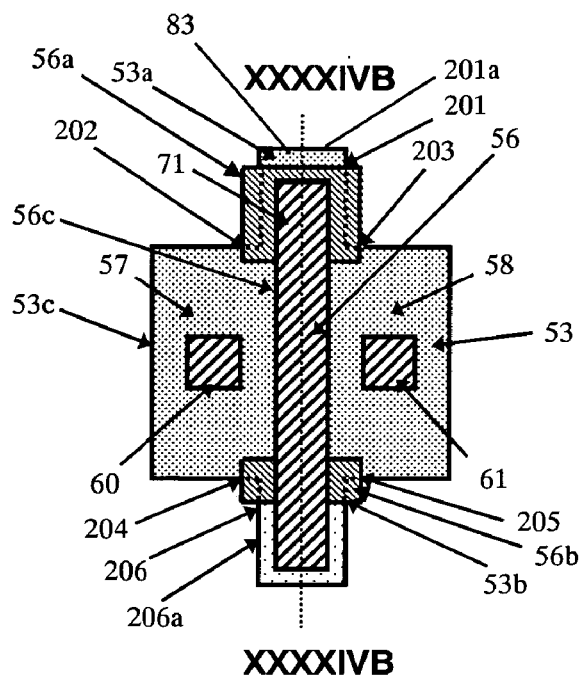
FIGS. 44A, 44B are illustrations showing the construction of a Si-DTMISFET according to a variation of embodiment 8 of the present invention; specifically.
Figure 44B:
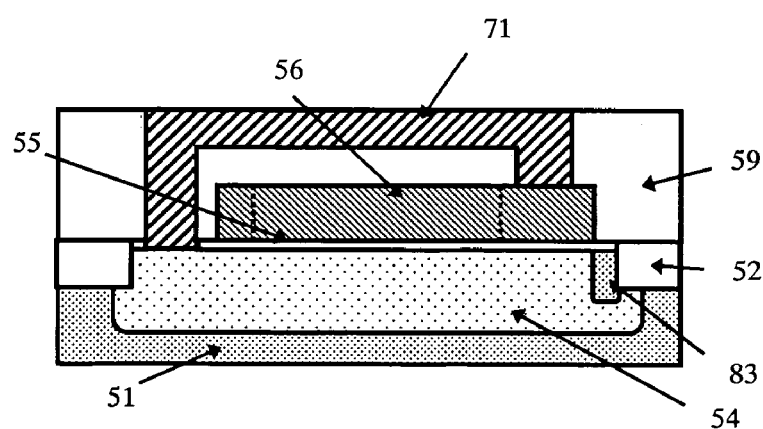

FIGS. 44A, 44B are illustrations showing the construction of a Si-DTMISFET according to a variation of the subject embodiment; specifically, FIG. 44A is a plan view of the Si-DTMISFET and FIG. 44B is a sectional view taken on line XXXXIVB—XXXXIVB of FIG. 44A.

As shown in FIGS. 44A and 44B, the Si-DTMISFET according to this variation is of the same construction as the Si-MISFET of the subject embodiment except that the gate contact and the well contact are formed integral with each other as gate-and-well contact 71. Like the Si-MISFET of the subject embodiment, the Si-DTMISFET according to this variation has well contact 63 located apart from gate contact 62, which allows the degree of freedom of wiring to be improved.

Embodiment 9

Figure 45A:
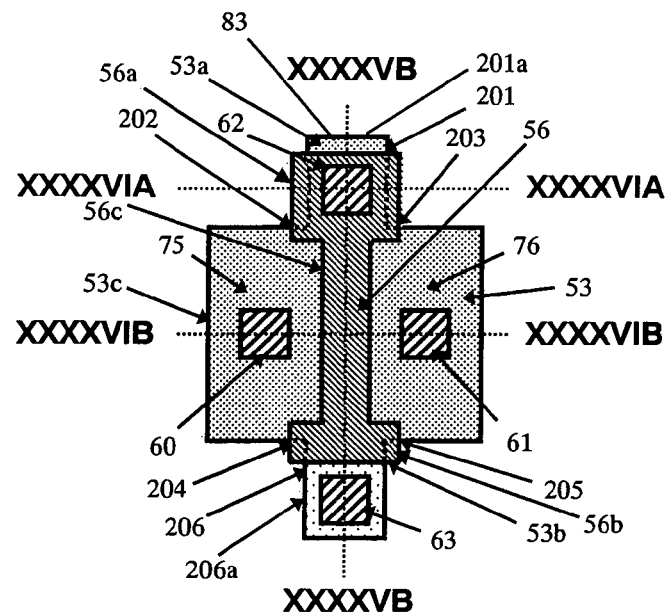
FIGS. 45A, 45B are illustrations showing the construction of a SiGe-HMISFET according to embodiment 9 of the present invention; specifically.
Figure 45B:
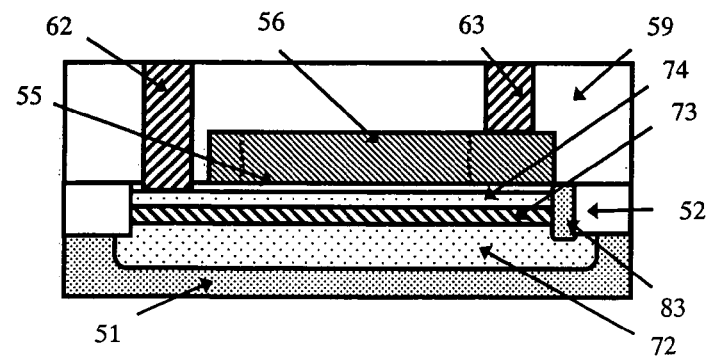
Figure 46A:
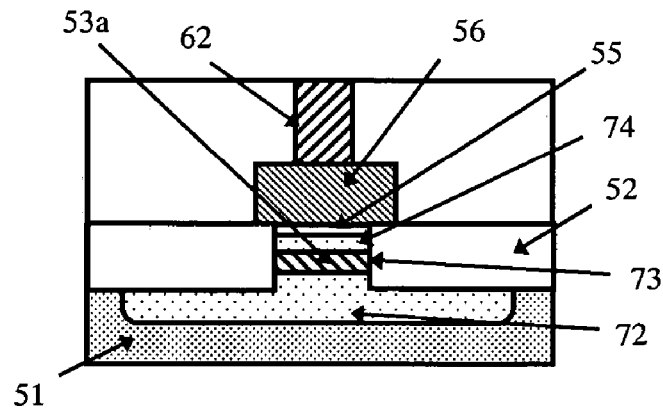
FIGS. 46A, 46B are illustrations showing the construction of the SiGe-HMISFET according to embodiment 9 of the present invention; specifically.
Figure 46B:
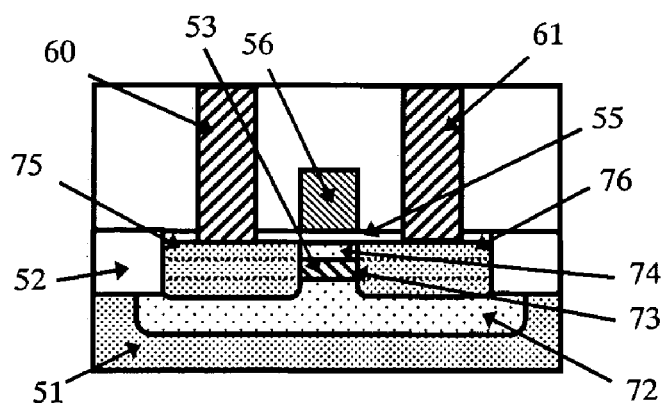

FIGS. 45A, 45b are illustrations showing the construction of a SiGe-HMISFET according to embodiment 9 of the present invention; specifically, FIG. 45A is a plan view of the SiGe-HMISFET and FIG. 45B is a sectional view taken on line XXXXVB—XXXXVB of FIG. 45A. FIGS. 46A, 46b are illustrations showing the construction of the SiGe-HMISFET according to embodiment 9 of the present invention; specifically, FIG. 46A is a sectional view taken on line XXXXVIA—XXXXVIA of FIG. 45A and FIG. 46B is a sectional view taken on line XXXXVIB—XXXXVIB of FIG. 45A. In FIGS. 45 and 46, parts identical with or equivalent to corresponding parts shown in FIGS. 36 and 37 are designated by like reference characters for the purpose of omitting the description thereof.

As shown in FIGS. 45A, 45B, 46A and 46B, the SiGe-HMISFET according to this embodiment has a well contact 63 formed to be connected to the tip portion of second projecting portion 53b of active region 53 and an n-type region 83 formed in the tip portion of first projecting portion 53a of active region 53 in the construction of the SiGe-HMISFET of embodiment 6.

In such a construction, well contact 63 is located apart from gate contact 62, which allows the degree of freedom of wiring to be improved.

Variation

Figure 47A:
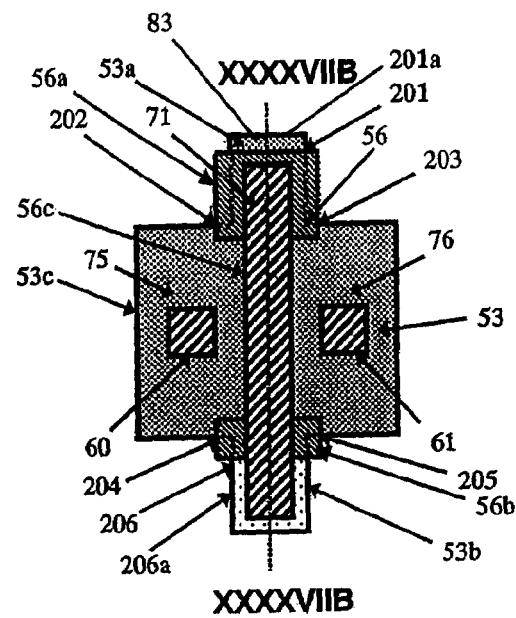
FIGS. 47A, 47B are illustrations showing the construction of a SiGe-HDTMISFET according to a variation of embodiment 9 of the present invention; specifically.
Figure 47B:
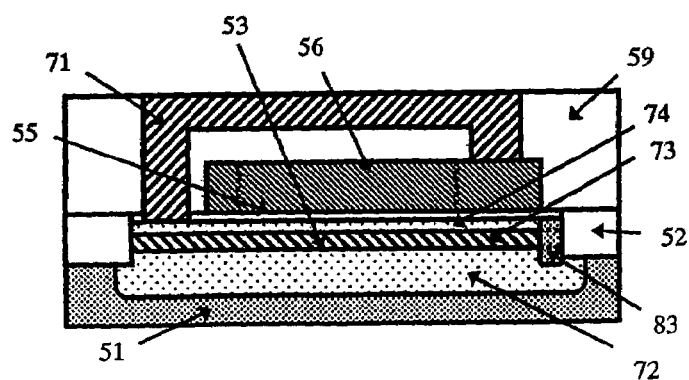

FIGS. 47A, 47B are illustrations showing the construction of a SiGe-HDTMISFET according to a variation of the subject embodiment; specifically, FIG. 47A is a plan view of the SiGe-HDTMISFET and FIG. 47B is a sectional view taken on line XXXXVIIB—XXXXVIIB of FIG. 47A.

As shown in FIGS. 47A and 47B, the SiGe-HDTMISFET according to this variation is of the same construction as the SiGe-HMISFET of the subject embodiment except that the gate contact and the well contact are formed integral with each other as gate-and-well contact 71. Like the SiGe-HMISFET of the subject embodiment, the SiGe-HDTMISFET according to this variation has well contact 63 located apart from gate contact 62, which allows the degree of freedom of wiring to be improved.

Embodiment 10

Figure 48A:
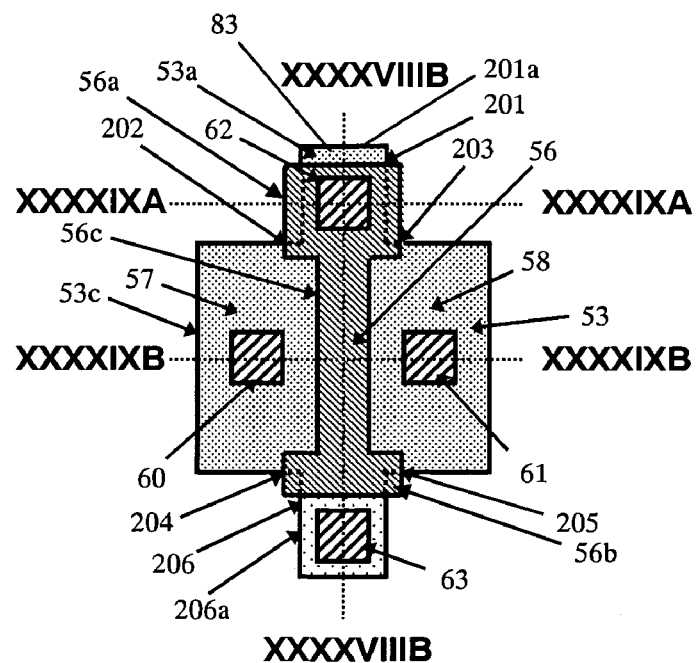
FIGS. 48A, 48B are illustrations showing the construction of a strained Si-MISFET according to embodiment 10 of the present invention; specifically.
Figure 48B:
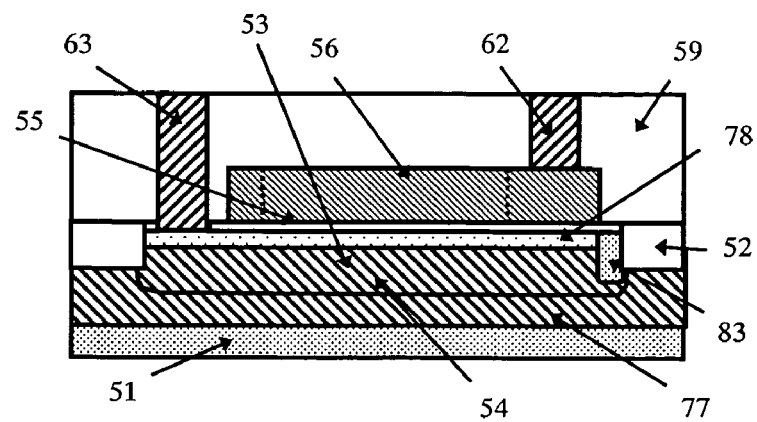
Figure 49A:
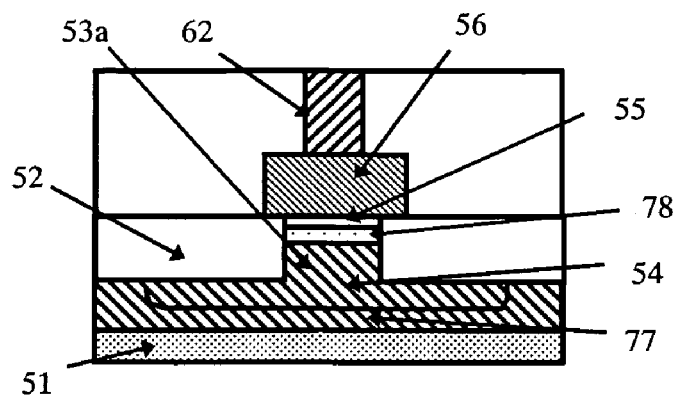
FIGS. 49A, 49B are illustrations showing the construction of the strained Si-MISFET according to embodiment 10 of the present invention; specifically.
Figure 49B:
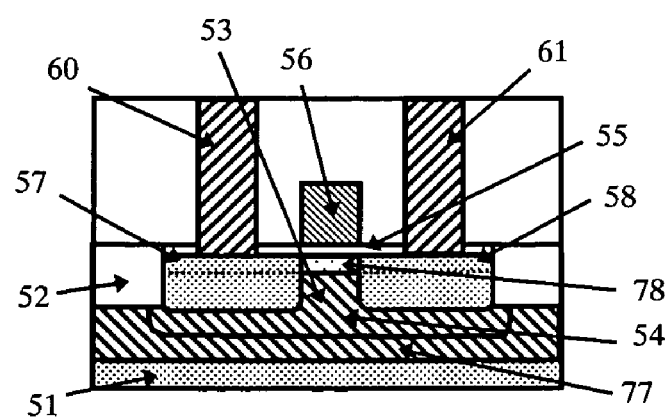

FIGS. 48A, 48B are illustrations showing the construction of a strained Si-MISFET according to embodiment 10 of the present invention; specifically, FIG. 48A is a plan view of the strained Si-MISFET and FIG. 48B is a sectional view taken on line XXXXVIIIB—XXXXVIIIB of FIG. 48A. FIGS. 49A, 49B are illustrations showing the construction of the strained Si-MISFET according to embodiment 10 of the present invention; specifically, FIG. 49A is a sectional view taken on line XXXXIXA—XXXXIXA of FIG. 48A and FIG. 49B is a sectional view taken on line XXXXIXB—XXXXIXB of FIG. 48A. In FIGS. 48 and 49, parts identical with or equivalent to corresponding parts shown in FIGS. 39 and 40 are designated by like reference characters for the purpose of omitting the description thereof.

As shown in FIGS. 48A, 48B, 49A and 49B, the strained Si-MISFET according to this embodiment has a well contact 63 formed to be connected to the tip portion of second projecting portion 53b of active region 53 and an n-type region 83 formed in the tip portion of first projecting portion 53a of active region 53 in the construction of the strained Si-MISFET of embodiment 7.

In such a construction, well contact 63 is located apart from gate contact 62, which allows the degree of freedom of wiring to be improved.

Variation

Figure 50A:
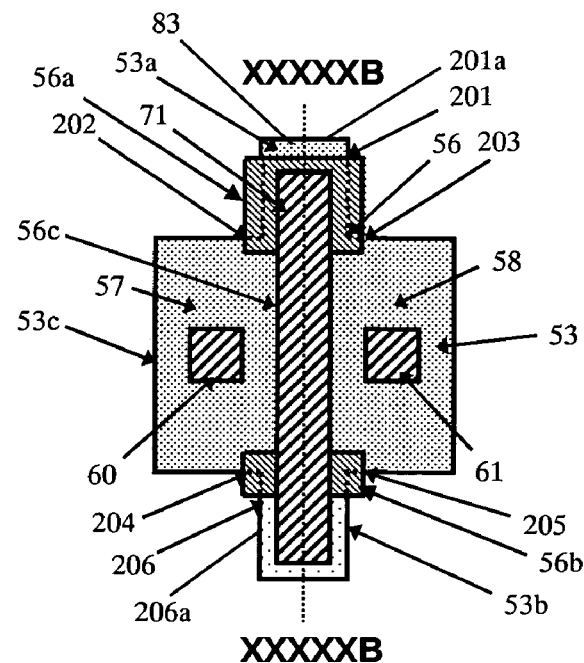
FIGS. 50A, 50B are illustrations showing the construction of a strained Si-DTMISFET according to a variation of embodiment 10 of the present invention; specifically.
Figure 50B:
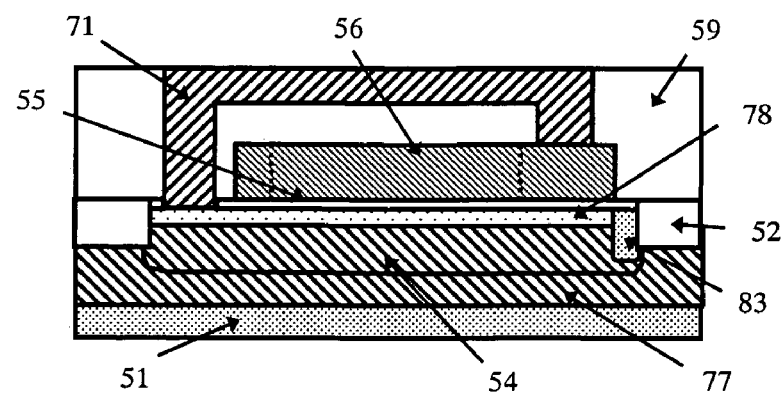

FIGS. 50A, 50B are illustrations showing the construction of a strained Si-DTMISFET according to a variation of the subject embodiment; specifically, FIG. 50A is a plan view of the strained Si-DTMISFET and FIG. 50B is a sectional view taken on line XXXXXB—XXXXXB of FIG. 50A.

As shown in FIGS. 50A and 50B, the strained Si-DTMISFET according to this variation is of the same construction as the strained Si-MISFET of the subject embodiment except that the gate contact and the well contact are formed integral with each other as gate-and-well contact 71. Like the strained Si-MISFET of the subject embodiment, the strained Si-DTMISFET according to this variation has well contact 63 located apart from gate contact 62, which allows the degree of freedom of wiring to be improved.

Embodiment 11

Figure 51A:
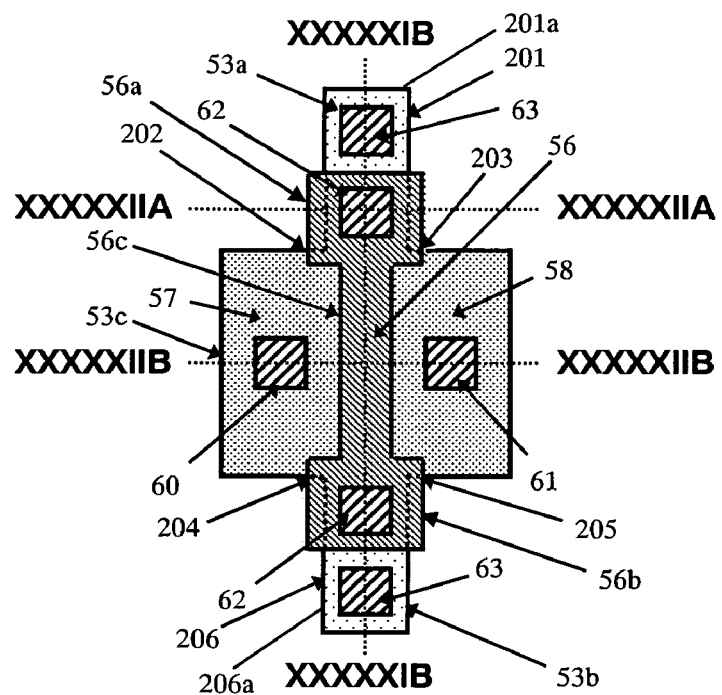
FIGS. 51A, 51B are illustrations showing the construction of a Si-MISFET according to embodiment 11 of the present invention; specifically.
Figure 51B:
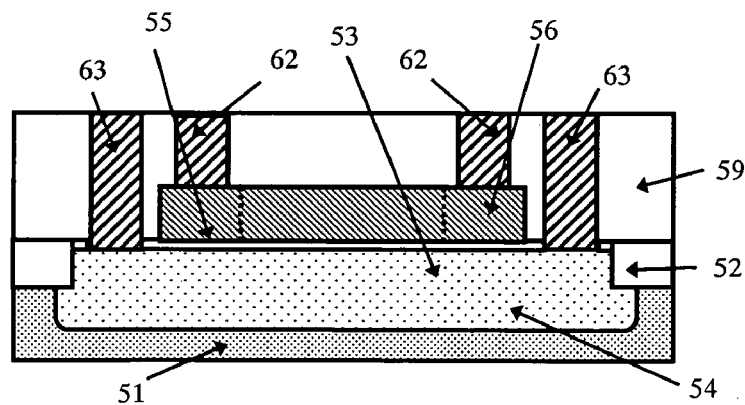
Figure 52A:
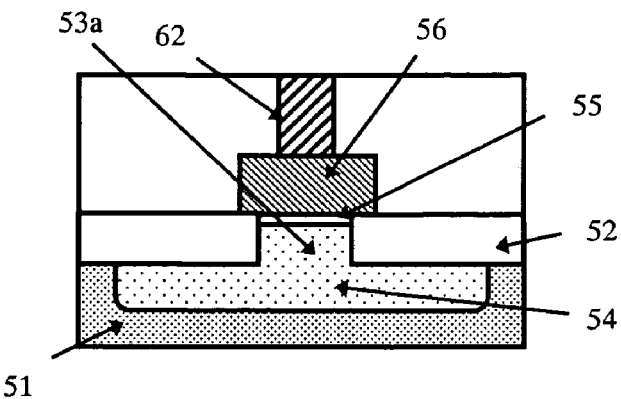
FIGS. 52A, 52B are illustration showing the construction of the Si-MISFET according to embodiment 11 of the present invention; specifically.
Figure 52B:
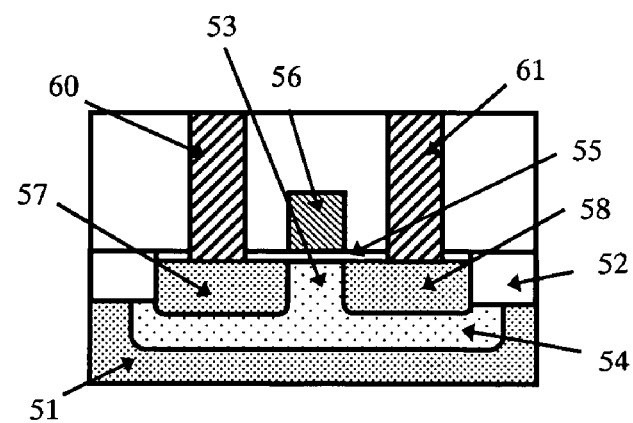

FIGS. 51A, 51b are illustrations showing the construction of a Si-MISFET according to embodiment 11 of the present invention; specifically, FIG. 51A is a plan view of the Si-MISFET and FIG. 51B is a sectional view taken on line XXXXXIB—XXXXXIB of FIG. 51A. FIGS. 52A, 52B are illustrations showing the construction of the Si-MISFET according to embodiment 11 of the present invention; specifically, FIG. 52A is a sectional view taken on line XXXXXIIA—XXXXXIIA of FIG. 51A and FIG. 52B is a sectional view taken on line XXXXXIIB—XXXXXIIB of FIG. 51A. In FIGS. 51 and 52, parts identical with or equivalent to corresponding parts shown in FIGS. 33 and 34 are designated by like reference characters for the purpose of omitting the description thereof.

As shown in FIGS. 51A, 51B, 52A and 52B, the Si-MISFET according to this embodiment has another well contact 63 which is formed at the tip portion of second projecting portion 53b of active region 53 in the construction of the Si-MISFET of embodiment 5.

In such a construction, well contacts 63 are located on opposite sides of active region 53, which allows the substrate potential controllability to be improved. For this reason, it is possible to suppress the occurrence of the problem of substrate resistance (body resistance), which is particularly problematic with DTMOSs.

Variation

Figure 53A:
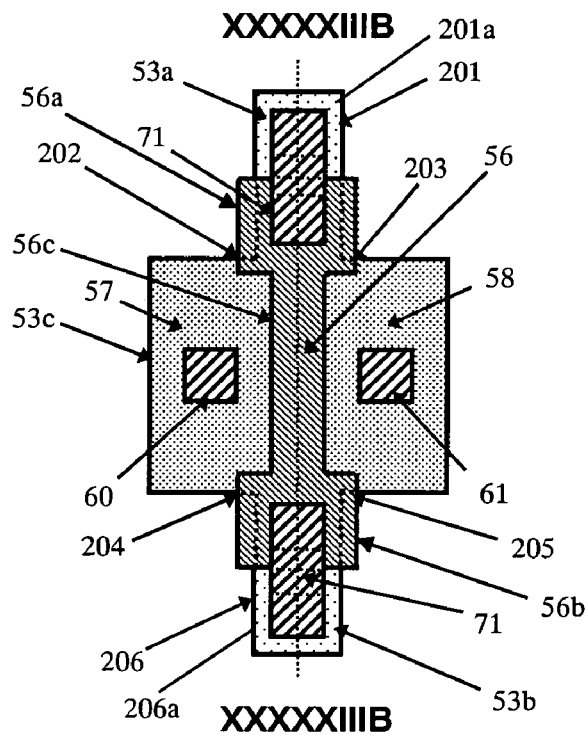
FIGS. 53A, 53B are illustrations showing the construction of a Si-DTMISFET according to a variation of embodiment 11 of the present invention; specifically.
Figure 53B:
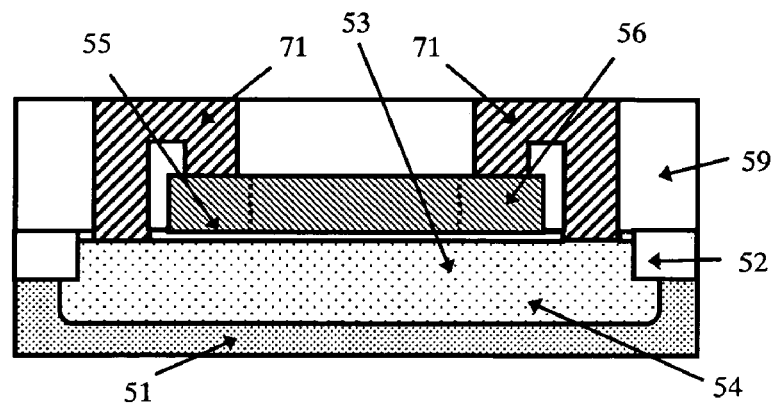

FIGS. 53A, 53B are illustrations showing the construction of a Si-DTMISFET according to a variation of the subject embodiment; specifically, FIG. 53A is a plan view of the Si-DTMISFET and FIG. 53B is a sectional view taken on line XXXXIIIB—XXXIIIB of FIG. 53A.

As shown in FIGS. 53A and 53B, the Si-DTMISFET according to this variation is of the same construction as the Si-MISFET of the subject embodiment except that gate contact and well contact are formed integral with each other as gate-and-well contact 71. Like the Si-MISFET of the subject embodiment, the Si-DTMISFET according to this variation has well contacts 63 located on opposite sides of active region 53, which allows the substrate potential controllability to be improved. For this reason, it is possible to suppress the occurrence of the problem of substrate resistance (body resistance), which is particularly problematic with DTMOSs.

Embodiment 12

Figure 54A:
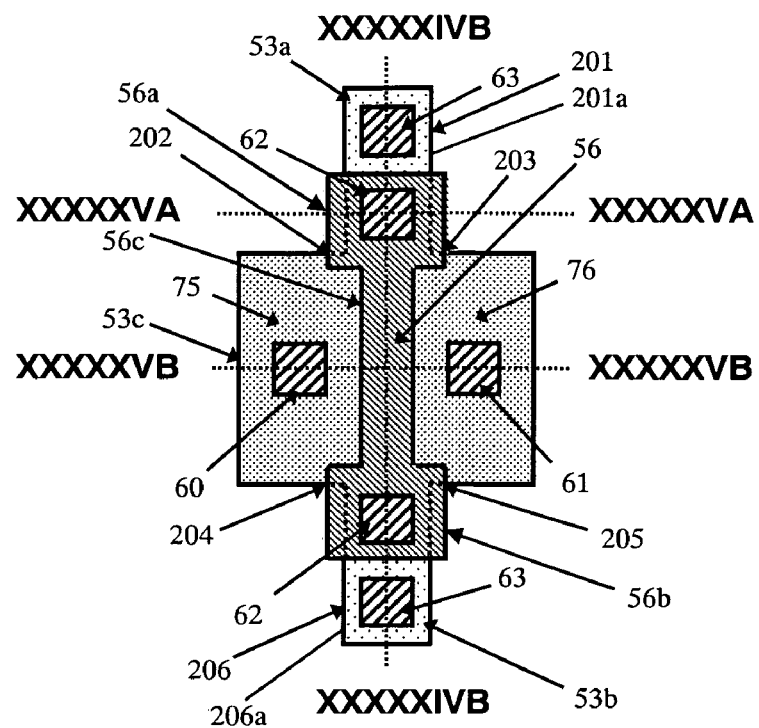
FIGS. 54A, 54B are illustrations showing the construction of a SiGe-HMISFET according to embodiment 12 of the present invention; specifically.
Figure 54B:
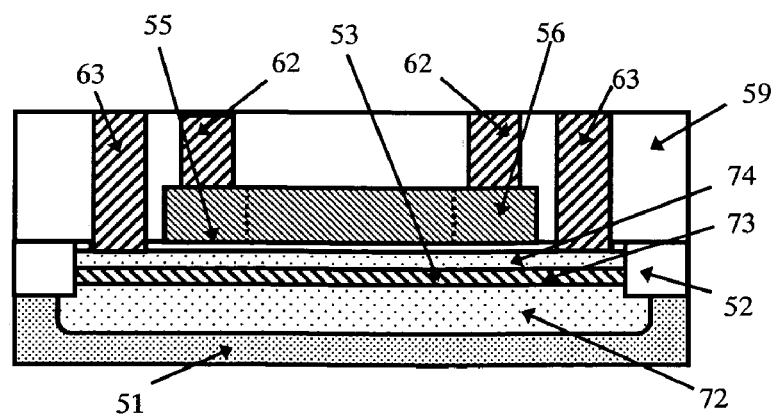
Figure 55A:
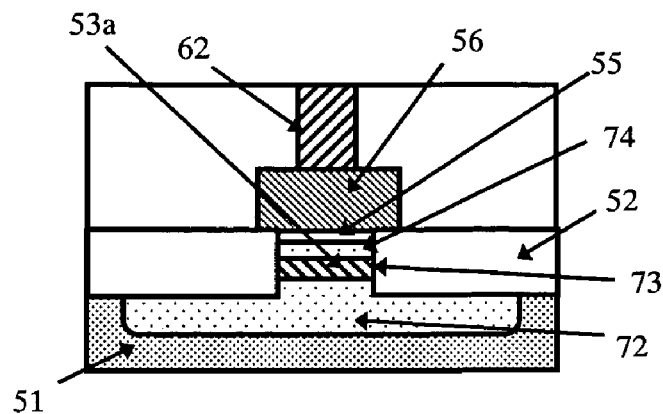
FIGS. 55A, 55B are illustrations showing the construction of the SiGe-HMISFET according to embodiment 12 of the present invention; specifically.
Figure 55B:
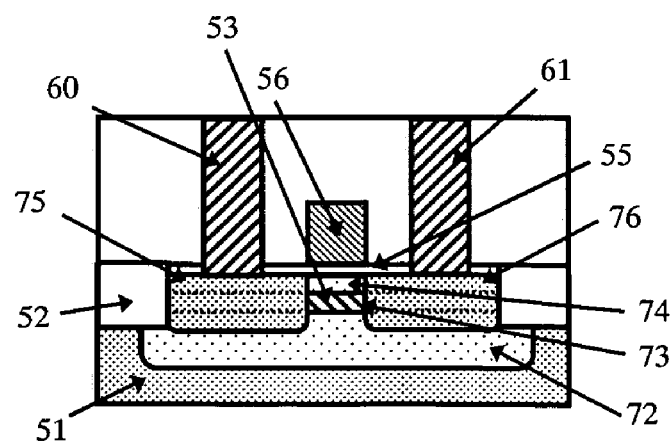

FIGS. 54A, 54B are illustrations showing the construction of a SiGe-HMISFET according to embodiment 12 of the present invention; specifically, FIG. 54A is a plan view of the SiGe-HMISFET and FIG. 54B is a sectional view taken on line XXXXXIVB—XXXXXIVB of FIG. 54A. FIGS. 55A, 55B are illustrations showing the construction of the SiGe-HMISFET according to embodiment 12 of the present invention; specifically, FIG. 55A is a sectional view taken on line XXXXXVA—XXXXXVA of FIG. 54A and FIG. 55B is a sectional view taken on line XXXXXVB—XXXXXVB of FIG. 54A. In FIGS. 54 and 55, parts identical with or equivalent to corresponding parts shown in FIGS. 36 and 37 are designated by like reference characters for the purpose of omitting the description thereof.

As shown in FIGS. 54A, 54B, 55A and 55B, the SiGe-HMISFET according to this embodiment has another well contact 63 which is formed at the tip portion of second projecting portion 53b of active region 53 in the construction of the SiGe-HMISFET of embodiment 6.

In such a construction, well contacts 63 are located on opposite sides of active region 53, which allows the substrate potential controllability to be improved. For this reason, it is possible to suppress the occurrence of the problem of substrate resistance (body resistance), which is particularly problematic with DTMOSs.

Variation

Figure 56A:
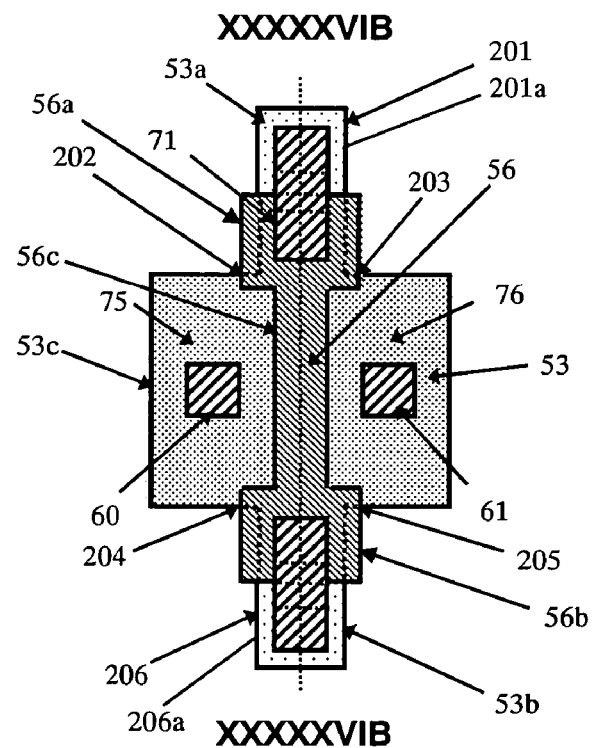
FIGS. 56A, 56B are illustrations showing the construction of a SiGe-HDTMISFET according to a variation of embodiment 12 of the present invention; specifically.
Figure 56B:
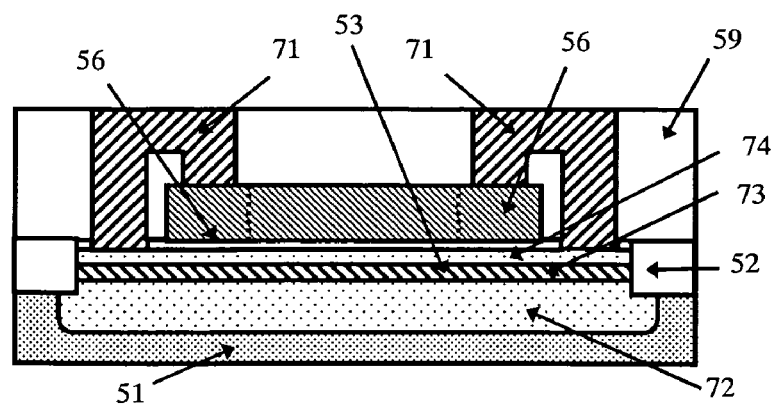

FIGS. 56A, 56b are illustrations showing the construction of a SiGe-HDTMISFET according to a variation of the subject embodiment; specifically, FIG. 56A is a plan view of the SiGe-HDTMISFET and FIG. 56B is a sectional view taken on line XXXXXVIB—XXXXXVIB of FIG. 56A.

As shown in FIGS. 56A and 56B, the SiGe-HDTMISFET according to this variation is of the same construction as the SiGe-HMISFET of the subject embodiment except that gate contact and well contact are formed integral with each other as gate-and-well contact 71. Like the SiGe-HMISFET of the subject embodiment, the SiGe-HDTMISFET according to this variation has well contacts 63 located on opposite sides of active region 53, which allows the substrate potential controllability to be improved. For this reason, it is possible to suppress the occurrence of the problem of substrate resistance (body resistance), which is particularly problematic with DTMOSs.

Embodiment 13

Figures 57A, 57B:
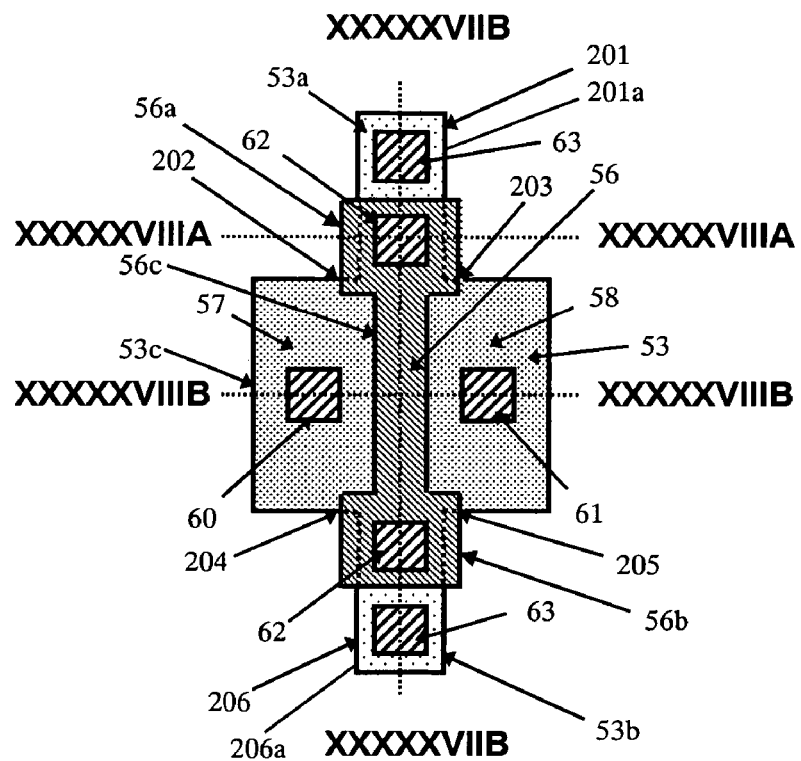
FIGS. 57A, 57B are illustrations showing the construction of a strained Si-MISFET according to embodiment 13 of the present invention; specifically.
Figure 58A:
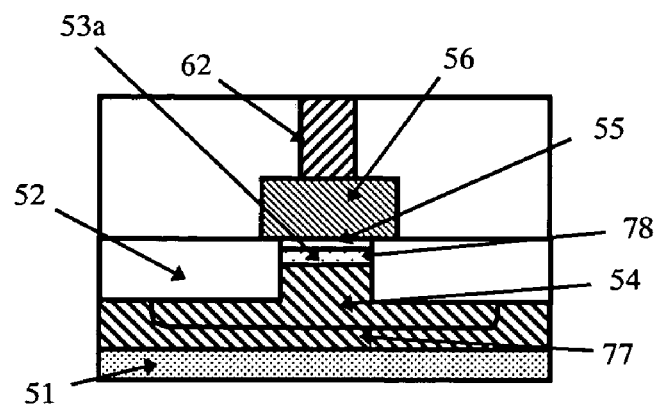
FIGS. 58A, 58B are illustrations showing the construction of the strained Si-MISFET according to embodiment 13 of the present invention; specifically.
Figure 58B:
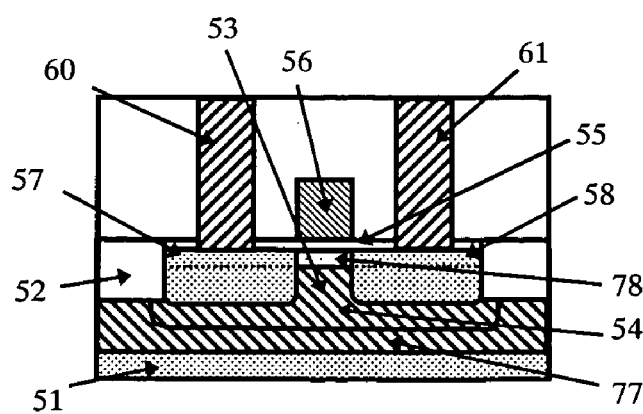

FIGS. 57A, 57B are illustrations showing the construction of a strained Si-MISFET according to embodiment 13 of the present invention; specifically, FIG. 57A is a plan view of the strained Si-MISFET and FIG. 57B is a sectional view taken on line XXXXXVIIB—XXXXXVIIB of FIG. 57A. FIGS. 58A, 58B are illustrations showing the construction of the strained Si-MISFET according to embodiment 13 of the present invention; specifically, FIG. 58A is a sectional view taken on line XXXXXVIIIA—XXXXXVIIIA of FIG. 57A and FIG. 58B is a sectional view taken on line XXXXXIIIB—XXXXVIIIB of FIG. 57A. In FIGS. 57 and 58, parts identical with or equivalent to corresponding parts shown in FIGS. 39 and 40 are designated by like reference characters for the purpose of omitting the description thereof.

As shown in FIGS. 57A, 57B, 58A and 58B, the strained Si-MISFET according to this embodiment has another well contact 63 which is formed at the tip portion of second projecting portion 53b of active region 53 in the construction of the strained Si-MISFET of embodiment 7.

In such a construction, well contacts 63 are located on opposite sides of active region 53, which allows the substrate potential controllability to be improved. For this reason, it is possible to suppress the occurrence of the problem of substrate resistance (body resistance), which is particularly problematic with DTMOSs.

Variation

Figure 59A:
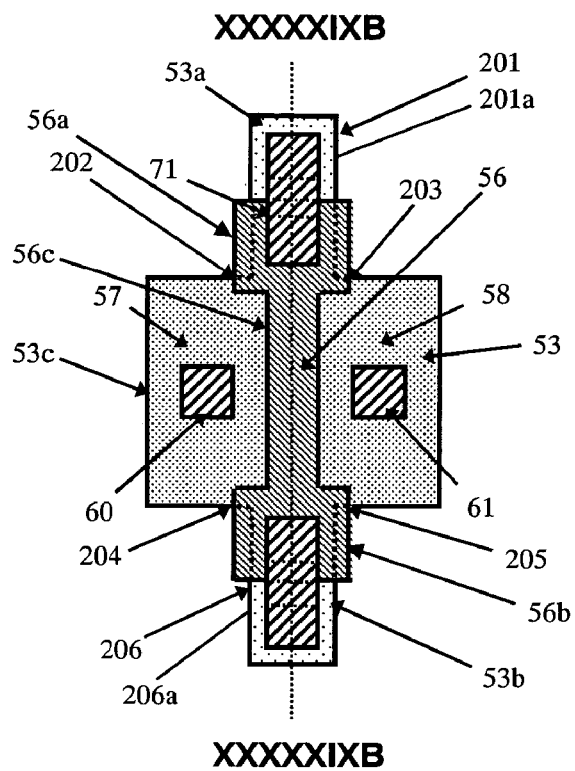
FIGS. 59A, 59B are illustrations showing the construction of a strained Si-DTMISFET according to a variation of embodiment 13 of the present invention; specifically.
Figure 59B:
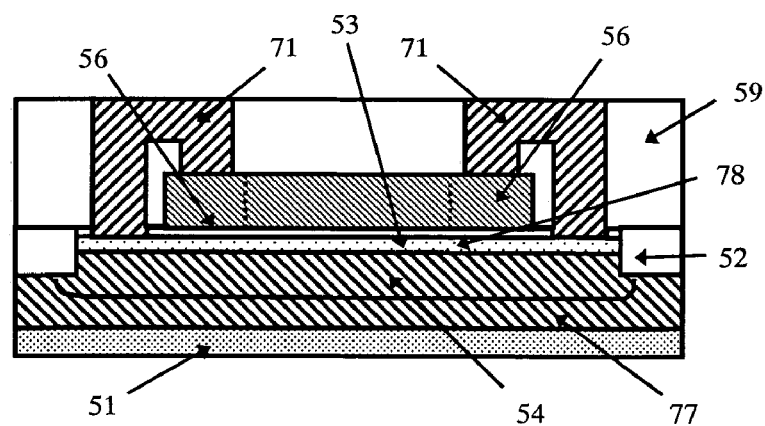

FIGS. 59A, 59B are illustrations showing the construction of a strained Si-DTMISFET according to a variation of the subject embodiment; specifically, FIG. 59A is a plan view of the strained Si-DTMISFET and FIG. 59B is a sectional view taken on line XXXXXIXB—XXXXXIXB of FIG. 59A.

As shown in FIGS. 59A and 59B, the strained Si-DTMISFET according to this variation is of the same construction as the strained Si-MISFET of the subject embodiment except that gate contact and well contact are formed integral with each other as gate-and-well contact 71. Like the strained Si-MISFET of the subject embodiment, the strained Si-DTMISFET according to this variation has well contacts 63 located on opposite sides of active region 53, which allows the substrate potential controllability to be improved. For this reason, it is possible to suppress the occurrence of the problem of substrate resistance (body resistance), which is particularly problematic with DTMOSs.

Embodiment 14

Figures 60A, 60B:
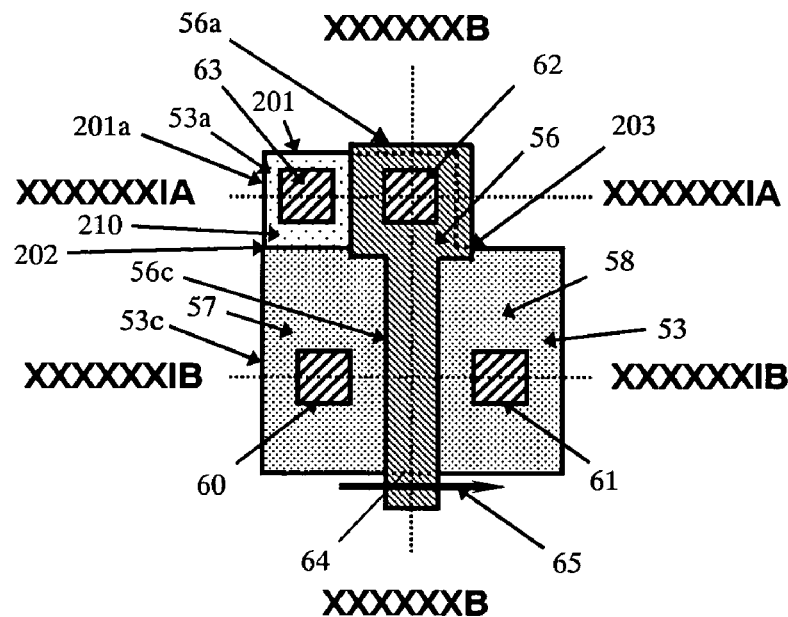
FIGS. 60A, 60B are illustrations showing the construction of a Si-MISFET according to embodiment 14 of the present invention; specifically.
Figure 61A:
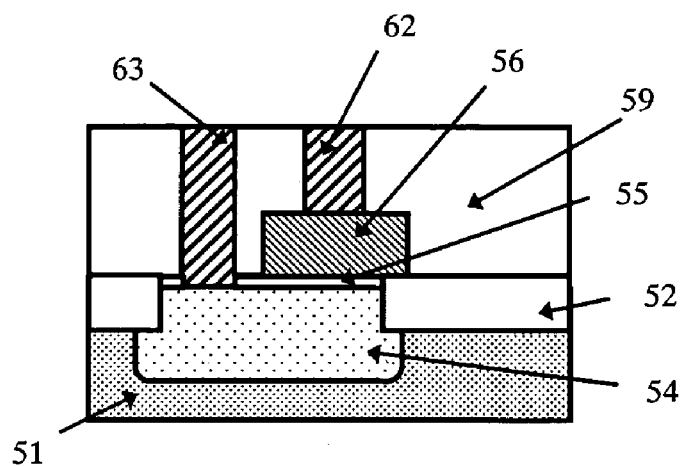
FIGS. 61A, 61B are illustrations showing the construction of the Si-MISFET according to embodiment 14 of the present invention; specifically.
Figure 61B:
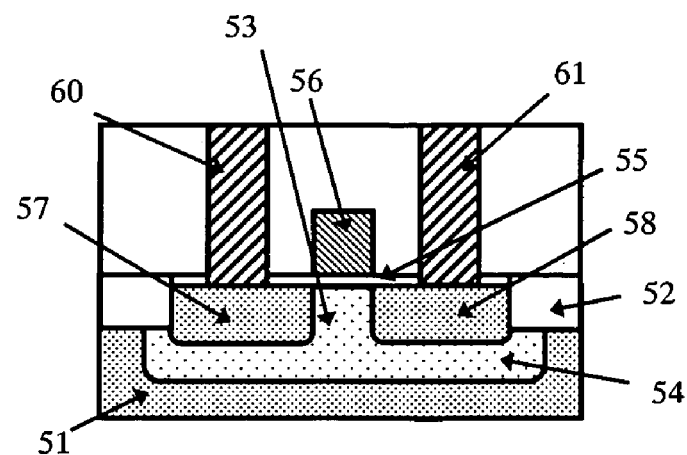

FIGS. 60A, 60B are illustrations showing the construction of a Si-MISFET according to embodiment 14 of the present invention; specifically, FIG. 60A is a plan view of the Si-MISFET and FIG. 60B is a sectional view taken on line XXXXXXB—XXXXXXB of FIG. 60A. FIGS. 61A, 61B are illustrations showing the construction of the Si-MISFET according to embodiment 14 of the present invention; specifically, FIG. 61A is a sectional view taken on line XXXXXXIA—XXXXXXIA of FIG. 60A and FIG. 61B is a sectional view taken on line XXXXXXIB—XXXXXXIB of FIG. 60A. In FIGS. 60 and 61, parts identical with or equivalent to corresponding parts shown in FIGS. 33 and 34 are designated by like reference characters for the purpose of omitting the description thereof.

As shown in FIGS. 60A, 60B, 61A and 61B, the Si-MISFET according to this embodiment has a gate 56 having first end portion 56a covering one side portion of first projecting portion 53a (widthwise end portion: about a half in FIG. 60) of active region 53 and a well contact 63 formed in the rest of first projecting portion 53a (hereinafter will be referred to as "well contact region 210") in the construction of the Si-MISFET of embodiment 5. This well contact region 210 forms part of p-well 54 and hence is electrically insulated from n-source region 57 by pn junction.

In such a construction, gate-uncovered portion 201a exists on first active region periphery 201 between source-drain, as in the Si-MISFET according to embodiment 2.

Therefore, it is possible to prevent the occurrence of leakage current flowing from first active region peripheral end 202 of source region to first active region peripheral end 203 of drain region along first active region periphery 201 between source-drain. It should be noted that since a portion of the periphery of active region 53 situated opposite to first projecting portion 53a is covered with gate 56, this portion allows leakage current 65 to flow therethrough. Further, since well contact 63 and gate contact 62 are juxtaposed widthwise of first projecting portion 53a of active region 53, the cell size can be reduced.

Variation

Figure 62A:
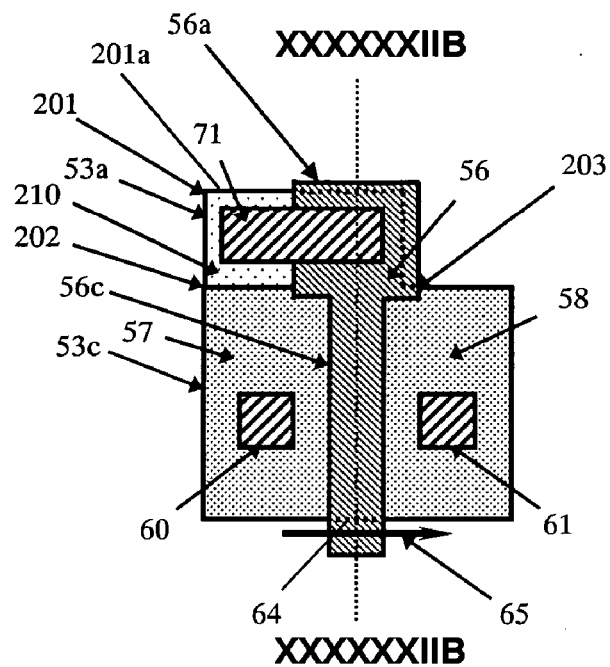
FIGS. 62A, 62B are illustrations showing the construction of a Si-DTMISFET according to a variation of embodiment 14 of the present invention; specifically.
Figure 62B:
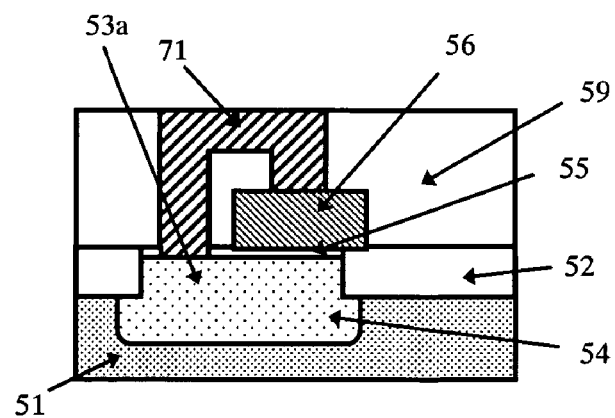

FIGS. 62A, 62B are illustrations showing the construction of a Si-DTMISFET according to a variation of the subject embodiment; specifically, FIG. 62A is a plan view of the Si-DTMISFET and FIG. 62B is a sectional view taken on line XXXXXXIIB—XXXXXXIIB of FIG. 62A.

As shown in FIGS. 62A and 62B, the Si-DTMISFET according to this variation is of the same construction as the Si-MISFET of the subject embodiment except that the gate contact and the well contact are formed integral with each other as gate-and-well contact 71. In such a construction, gate-uncovered portion 201a exists on first active region periphery 201 between source-drain, as in the Si-MISFET of the subject embodiment. Therefore, it is possible to prevent the occurrence of leakage current flowing from first active region peripheral end 202 of source region to first active region peripheral end 203 of drain region along first active region periphery 201 between source-drain. It should be noted that since a portion of the periphery of active region 53 situated opposite to first projecting portion 53a is covered with gate 56, this portion allows leakage current 65 to flow therethrough. Further, since well contact 63 and gate contact 62 are juxtaposed widthwise of first projecting portion 53a of active region 53, the cell size can be reduced.

Embodiment 15

Figure 63A:
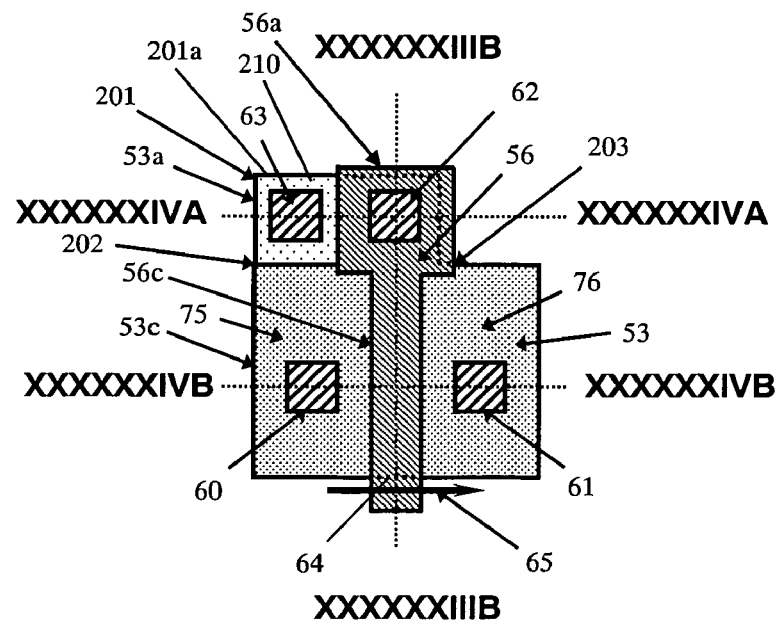
FIGS. 63A, 63B are illustrations showing the construction of a SiGe-HMISFET according to embodiment 15 of the present invention; specifically.
Figure 63B:
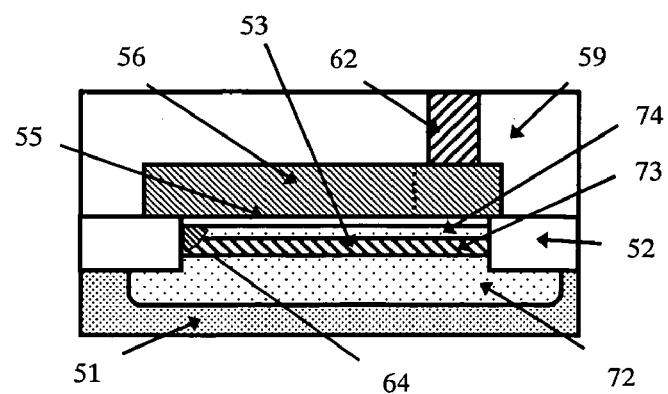
Figure 64A:
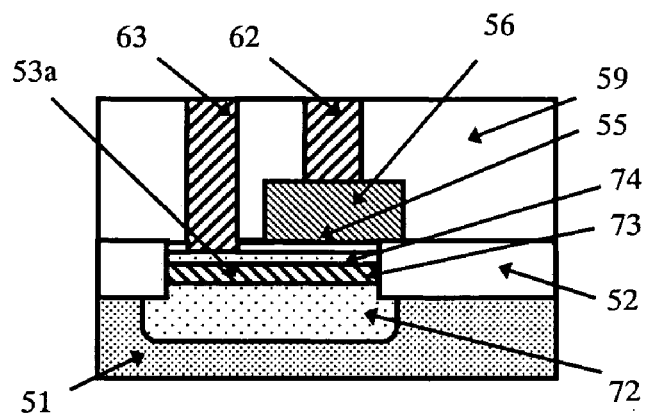
FIGS. 64A, 64B are illustrations showing the construction of the SiGe-MISFET according to embodiment 15 of the present invention; specifically.
Figure 64B:
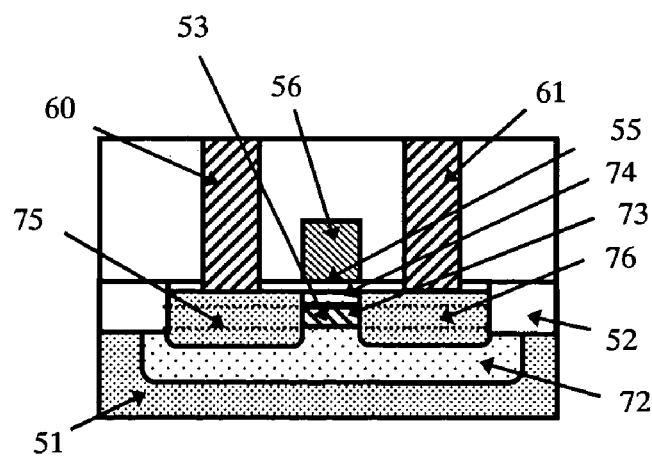

FIGS. 63A, 63B are illustrations showing the construction of a SiGe-HMISFET according to embodiment 15 of the present invention; specifically, FIG. 63A is a plan view of the SiGe-HMISFET and FIG. 63B is a sectional view taken on line XXXXXXIIIB—XXXXXXIIIB of FIG. 63A. FIGS. 64A, 64B are illustrations showing the construction of the SiGe-HMISFET according to embodiment 15 of the present invention; specifically, FIG. 64A is a sectional view taken on line XXXXXXIVA—XXXXXXIVA of FIG. 63A and FIG. 64B is a sectional view taken on line XXXXXXIVB—XXXXXXIVB of FIG. 63A. In FIGS. 63 and 64, parts identical with or equivalent to corresponding parts shown in FIGS. 36 and 37 are designated by like reference characters for the purpose of omitting the description thereof.

As shown in FIGS. 63A, 63B, 64A and 64B, like the Si-MISFET according to embodiment 14, the SiGe-HMISFET according to this embodiment has a gate 56 having first end portion 56a covering a side portion of first projecting portion 53a of active region 53 and a well contact 63 formed in well contact region 210 which constitutes the rest of first projecting portion 53a in the construction of the Si-MISFET of embodiment 6.

In such a construction, gate-uncovered portion 201a exists on first active region periphery 201 between source-drain, as in the Si-MISFET according to embodiment 14. Therefore, it is possible to prevent the occurrence of leakage current flowing from first active region peripheral end 202 of source region to first active region peripheral end 203 of drain region along first active region periphery 201 between source-drain. It should be noted that since a portion of the periphery of active region 53 situated opposite to first projecting portion 53a is covered with gate 56, this portion allows leakage current 65 to flow therethrough. Further, since well contact 63 and gate contact 62 are juxtaposed widthwise of first projecting portion 53a of active region 53, the cell size can be reduced.

Variation

Figure 65A:
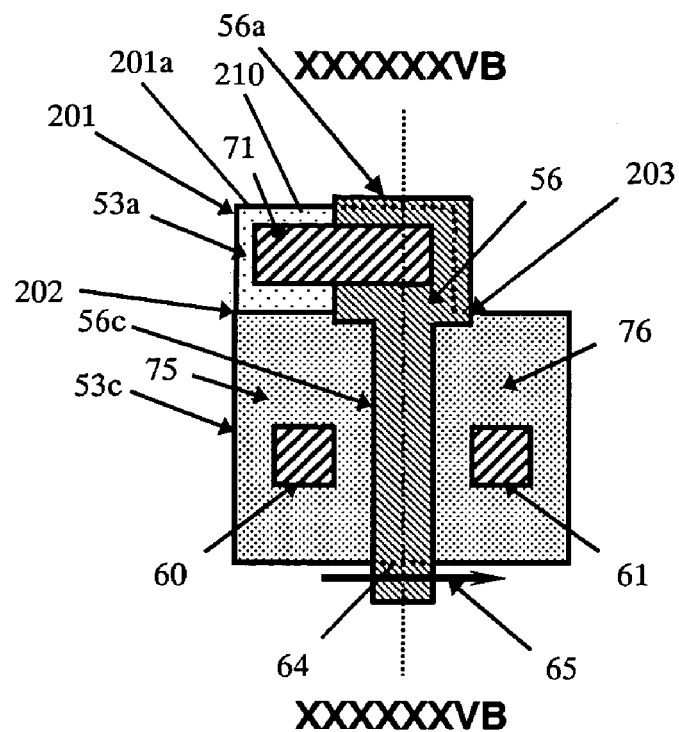
FIGS. 65A, 65B are illustrations showing the construction of a SiGe-HDTMISFET according to a variation of embodiment 15 of the present invention; specifically.
Figure 65B:
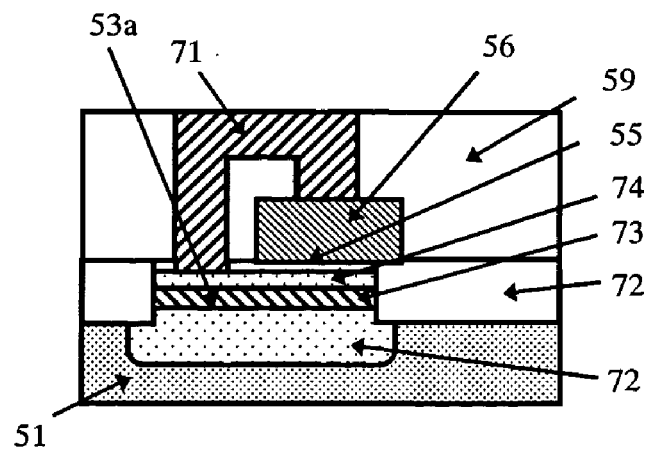

FIGS. 65A, 65B are illustrations showing the construction of a SiGe-HDTMISFET according to a variation of the subject embodiment; specifically, FIG. 65A is a plan view of the SiGe-HDTMISFET and FIG. 65B is a sectional view taken on line XXXXXXVB—XXXXXXVB of FIG. 65A.

As shown in FIGS. 65A and 65B, the SiGe-HDTMISFET according to this variation is of the same construction as the SiGe-HMISFET of the subject embodiment except that the gate contact and the well contact are formed integral with each other as gate-and-well contact 71. In such a construction, gate-uncovered portion 201a exists on first active region periphery 201 between source-drain, as in the SiGe-HMISFET of the subject embodiment. Therefore, it is possible to prevent the occurrence of leakage current flowing from first active region peripheral end 202 of source region to first active region peripheral end 203 of drain region along first active region periphery 201 between source-drain. It should be noted that since a portion of the periphery of active region 53 situated opposite to first projecting portion 53a is covered with gate 56, this portion allows leakage current 65 to flow therethrough. Further, since well contact 63 and gate contact 62 are juxtaposed widthwise of first projecting portion 53a of active region 53, the cell size can be reduced.

Embodiment 16

Figure 66A:
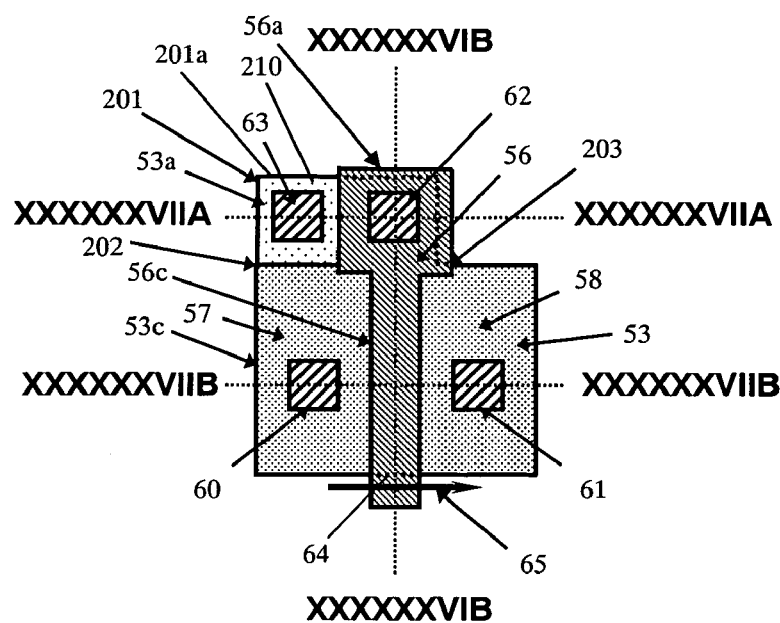
FIGS. 66A, 66B are illustrations showing the construction of a strained Si-MISFET according to embodiment 16 of the present invention; specifically.
Figure 66B:
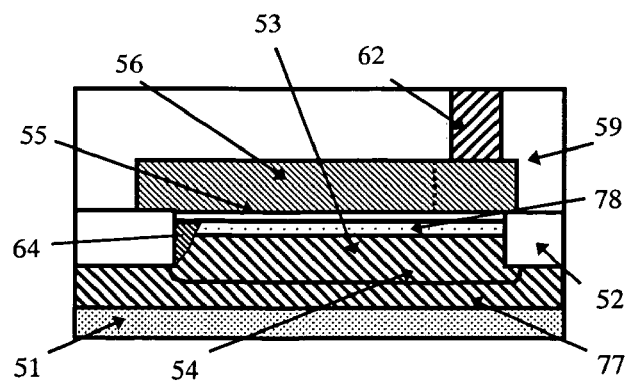
Figure 67A:
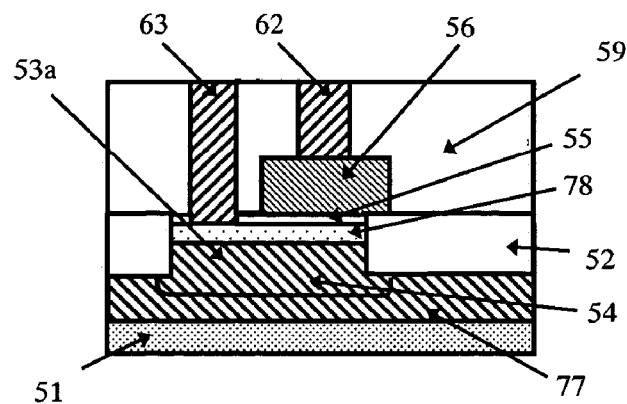
FIGS. 67A, 67B are illustrations showing the construction of the strained Si-MISFET according to embodiment 16 of the present invention; specifically.
Figure 67B:
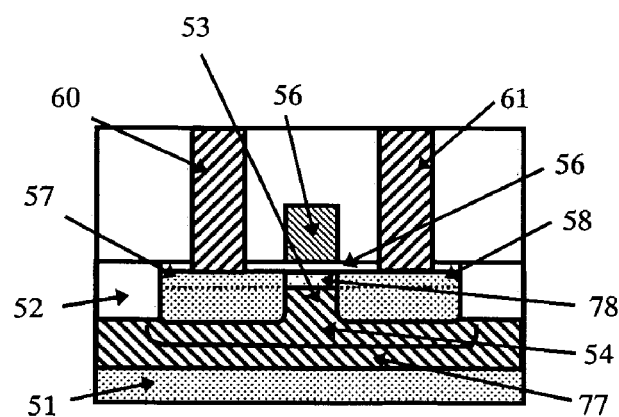

FIGS. 66A, 66B are illustrations showing the construction of a strained Si-MISFET according to embodiment 16 of the present invention; specifically, FIG. 66A is a plan view of the strained Si-MISFET and FIG. 66B is a sectional view taken on line XXXXXXVIB—XXXXXXVIB of FIG. 66A. FIGS. 67A, 67B are illustrations showing the construction of the strained Si-MISFET according to embodiment 16 of the present invention; specifically, FIG. 67A is a sectional view taken on line XXXXXXVIIA—XXXXXXVIIA of FIG. 66A and FIG. 67B is a sectional view taken on line XXXXXXVIIB—XXXXXXVIIB of FIG. 66A. In FIGS. 66 and 67, parts identical with or equivalent to corresponding parts shown in FIGS. 39 and 40 are designated by like reference characters for the purpose of omitting the description thereof As shown in FIGS. 66A, 66B, 67A and 67B, like the Si-MISFET according to embodiment 14, the strained Si-MISFET according to this embodiment has a gate 56 having first end portion 56a covering a side portion of first projecting portion 53a of active region 53 and a well contact 63 formed in well contact region 210 which consists the rest of first projecting portion 53a in the construction of the strained Si-MISFET of embodiment 7.

In such a construction, gate-uncovered portion 201a exists on first active region periphery 201 between source-drain, as in the Si-MISFET according to embodiment 14. Therefore, it is possible to prevent the occurrence of leakage current flowing from first active region peripheral end 202 of source region to first active region peripheral end 203 of drain region along first active region periphery 201 between source-drain. It should be noted that since a portion of the periphery of active region 53 situated opposite to first projecting portion 53a is covered with gate 56, this portion allows leakage current 65 to flow therethrough. Further, since well contact 63 and gate contact 62 are juxtaposed widthwise of first projecting portion 53a of active region 53, the cell size can be reduced.

Variation

Figure 68A:
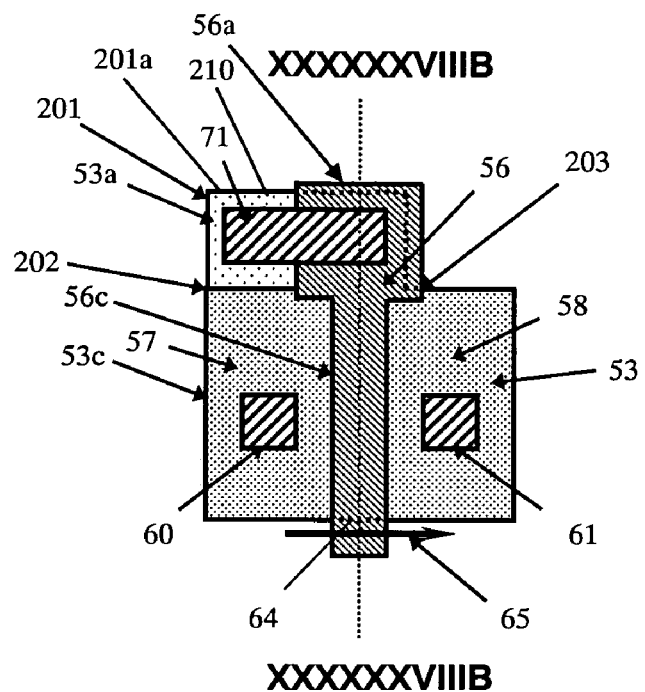
FIGS. 68A, 68B are illustrations showing the construction of a strained Si-DTMISFET according to a variation of embodiment 16 of the present invention; specifically.
Figure 68B:
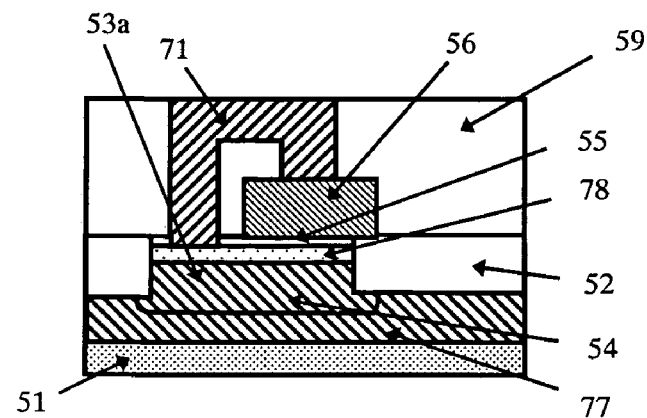

FIGS. 68A, 68B are illustrations showing the construction of a strained Si-DTMISFET according to a variation of the subject embodiment; specifically, FIG. 68A is a plan view of the strained Si-DTMISFET and FIG. 68B is a sectional view taken on line XXXXXXVIIIB—XXXXXXVIIIB of FIG. 68A.

As shown in FIGS. 68A and 68B, the strained Si-DTMISFET according to this variation is of the same construction as the strained Si-MISFET of the subject embodiment except that the gate contact and the well contact are formed integral with each other as gate-and-well contact 71. In such a construction, gate-uncovered portion 201a exists on first active region periphery 201 between source-drain, as in the strained Si-MISFET of the subject embodiment. Therefore, it is possible to prevent the occurrence of leakage current flowing from first active region peripheral end 202 of source region to first active region peripheral end 203 of drain region along first active region periphery 201 between source-drain. It should be noted that since a portion of the periphery of active region 53 situated opposite to first projecting portion 53a is covered with gate 56, this portion allows leakage current 65 to flow therethrough. Further, since well contact 63 and gate contact 62 are juxtaposed widthwise of first projecting portion 53a of active region 53, the cell size can be reduced.

In each of the foregoing embodiments 2 to 13, a well contact region may be provided in a side portion of first projecting portion 53a and/or a side portion of second projecting portion 53b.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

What is claimed is:

1. A MISFET comprising:
    a substrate having a semiconductor layer;
    an active region formed in the semiconductor layer;
    a gate insulator formed on the active region;
    a gate formed on the gate insulator; and
    a source region and a drain region, wherein:
    the active region is formed, in plan view, to have a body portion and a first projecting portion and a second projecting portion projecting from a periphery of the body portion;
    the gate is formed, in plan view, to intersect the body portion of the active region,
    the source region and the drain region are formed in regions of the body portion of the active region which are situated on opposite sides of the gate in plan view, respectively,
    the gate is formed, in plan view, such that one of end portions of a pair of end portions in a direction in which a pair of crossing portions of the gate with respect to the body portion of the active region covers a pair of connecting portions connecting a periphery of the first projecting portion to the periphery of the body portion, a part of the first projecting portion projects from a periphery of the one end portion, the other end portion of the pair of end portions covers a pair of connecting portions connecting a periphery of the second projecting portion to the periphery of the body portion, and a part of the second projecting portion projects from a periphery of the other end portion;
    the first and second projecting portions project from opposite regions of the periphery of the body portion at right angles from the projection directions of the source and drain regions;
    a gate contact is formed to be connected to at least the one end portion and the other end portion of the gate, and a well contact is formed to be connected to one of said part of the first projecting portion and said part of the second projecting portion of the active region; and
    one of said part of the first projecting portion and said part of the second projecting portion to which the well contact is not connected has a conductivity type that is identical to a conductivity type of the source region and the drain region.

2. The MISFET according to claim 1, wherein the gate contact is formed to be connected to said one end portion of the gate while the well contact formed to be connected to said part of the first projecting portion of the active region.

3. The MISFET according to claim 1, wherein the gate contact is formed to be connected to said one end portion of the gate while the well contact formed to be connected to said part of the second projecting portion of the active region.

4. The MISFET according to claim 1, wherein the gate contact and the well contact are connected to each other.

5. The MISFET according to claim 1, wherein the active region is formed to be surrounded by LOCOS.

6. The MISFET according to claim 1, wherein the active region is formed to be surrounded by STI.

7. The MISFET according to claim 1, wherein the active region is formed by a Si layer.

8. The MISFET according to claim 1, wherein the active region has a SiGe layer and a Si layer joined to the SiGe layer by heterojunction.

9. The MISFET according to claim 1, wherein the active region has a strained Si layer.

* * * * *